US012405227B2

(12) United States Patent
Kochersperger et al.

(10) Patent No.: US 12,405,227 B2
(45) Date of Patent: Sep. 2, 2025

(54) METHOD FOR REGION OF INTEREST PROCESSING FOR RETICLE PARTICLE DETECTION

(71) Applicant: ASML Holding N.V., Veldhoven (NL)

(72) Inventors: Peter Conrad Kochersperger, Easton, CT (US); Christopher Michael Dohan, Redding, CT (US); Justin Lloyd Kreuzer, Trumbull, CT (US); Michal Emanuel Pawlowski, Norwalk, CT (US); Aage Bendiksen, Fairfield, CT (US); Kirill Urievich Sobolev, Brookfield, CT (US); James Hamilton Walsh, Newtown, CT (US); Roberto B. Wiener, Ridgefield, CT (US); Arun Mahadevan Venkataraman, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 544 days.

(21) Appl. No.: 17/794,905

(22) PCT Filed: Jan. 21, 2021

(86) PCT No.: PCT/EP2021/051365
§ 371 (c)(1),
(2) Date: Jul. 22, 2022

(87) PCT Pub. No.: WO2021/148550
PCT Pub. Date: Jul. 29, 2021

(65) Prior Publication Data
US 2023/0055116 A1    Feb. 23, 2023

Related U.S. Application Data

(60) Provisional application No. 63/036,744, filed on Jun. 9, 2020, provisional application No. 62/964,924, filed on Jan. 23, 2020.

(51) Int. Cl.
*G01N 21/956* (2006.01)
*G01N 21/88* (2006.01)
(Continued)

(52) U.S. Cl.
CPC ....... *G01N 21/956* (2013.01); *G01N 21/8806* (2013.01); *G01N 21/9501* (2013.01); *G03F 7/7065* (2013.01); *G01N 2021/95676* (2013.01)

(58) Field of Classification Search
CPC .......... G01N 21/8806; G01N 21/9501; G01N 21/956; G01N 2021/95676;
(Continued)

(56) References Cited

U.S. PATENT DOCUMENTS

2006/0072108 A1    4/2006   Onvlee et al.
2008/0186476 A1    8/2008   Kusunose
(Continued)

FOREIGN PATENT DOCUMENTS

JP        H10-90192 A       4/1998
WO    WO 2018/122028 A1    7/2018

OTHER PUBLICATIONS

International Search Report and Written Opinion of the International Searching Authority directed to related International Patent Application No. PCT/EP2021/051365, mailed May 11, 2021; 12 pages.
(Continued)

*Primary Examiner* — Stewart A Fraser
(74) *Attorney, Agent, or Firm* — Sterne, Kessler, Goldstein &Fox P.L.L.C.

(57) ABSTRACT

An inspection system includes a radiation source that generates a beam of radiation and irradiates a first surface of an object, defining a region of the first surface of the object. The radiation source also irradiates a second surface of the
(Continued)

object, defining a region of the second surface, wherein the second surface is at a different depth level within the object than the first surface. The inspection system may also include a detector that defines a field of view (FOV) of the first surface including the region of the first surface, and receives radiation scattered from the region of the first surface and the region of the second surface. The inspection system may also include a processor that discards image data not received from the region of the first surface, and constructs a composite image comprising the image data from across the region of the first surface.

20 Claims, 38 Drawing Sheets

(51) Int. Cl.
*G01N 21/95* (2006.01)
*G03F 7/00* (2006.01)

(58) Field of Classification Search
CPC ....... G01N 2021/8887; G01N 21/8851; G01N 21/94; G06T 2207/30148; G03F 1/84; G03F 7/70616; G03F 7/7085; G03F 7/7065

See application file for complete search history.

(56) References Cited

U.S. PATENT DOCUMENTS

| | | | |
|---|---|---|---|
| 2010/0273115 | A1 | 10/2010 | Kawahara |
| 2012/0086800 | A1 | 4/2012 | Vladimirsky et al. |
| 2014/0146297 | A1 | 5/2014 | Vainer et al. |
| 2017/0212057 | A1* | 7/2017 | Janik .................. G03F 7/70591 |
| 2019/0102875 | A1 | 4/2019 | Chen et al. |
| 2021/0116368 | A1* | 4/2021 | Shoham ............. G01N 21/8806 |
| 2021/0270727 | A1* | 9/2021 | Van Der Zwan .. G01N 21/8806 |

OTHER PUBLICATIONS

International Preliminary Report on Patentability directed to related International Patent Application No. PCT/EP2021/051365, issued Jul. 26, 2022; 9 pages.

Chinese Office Action directed to Chinese Patent Application No. 202180010634.3, mailed May 26, 2025; 14 pages.

* cited by examiner

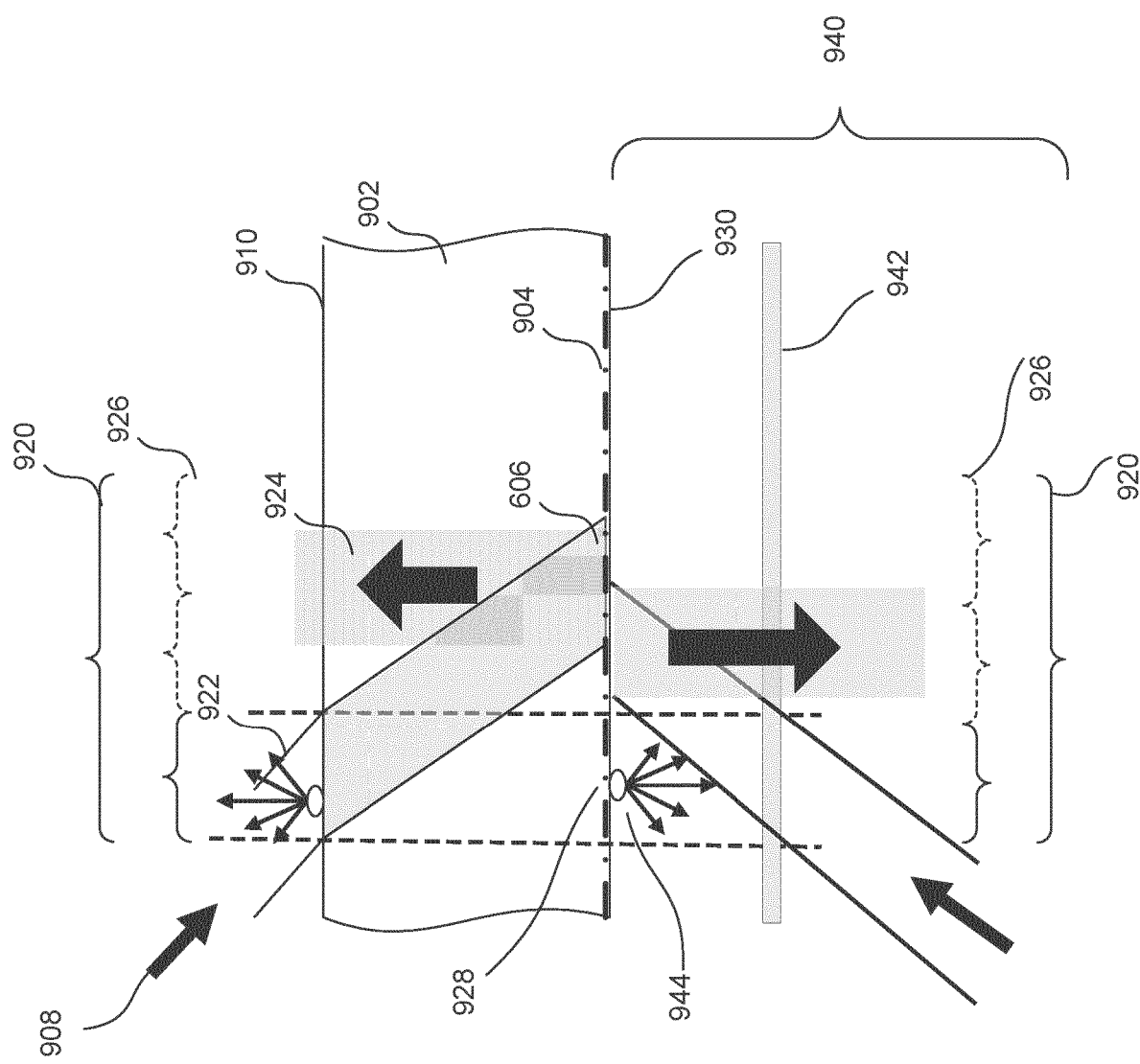

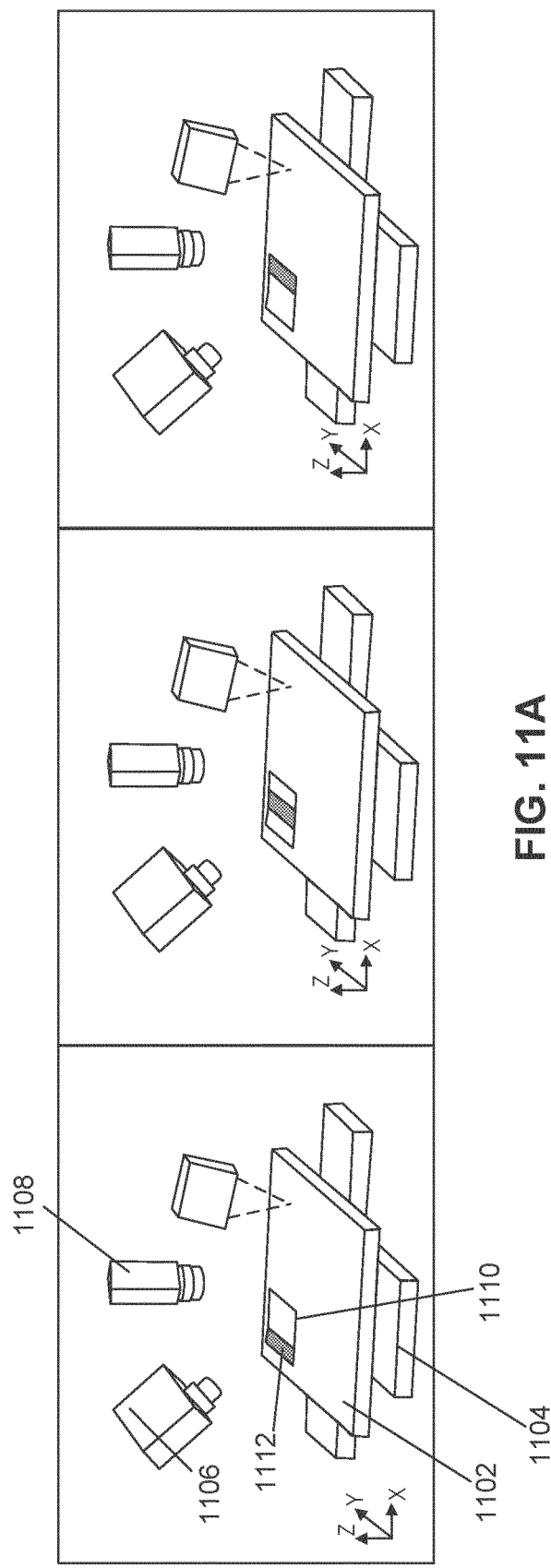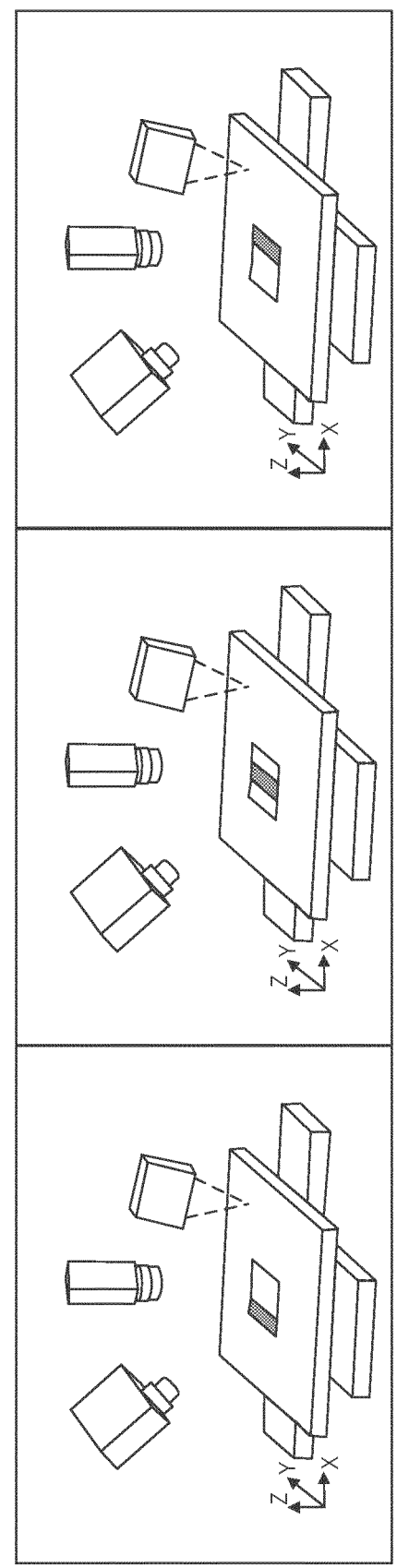
FIG. 11A

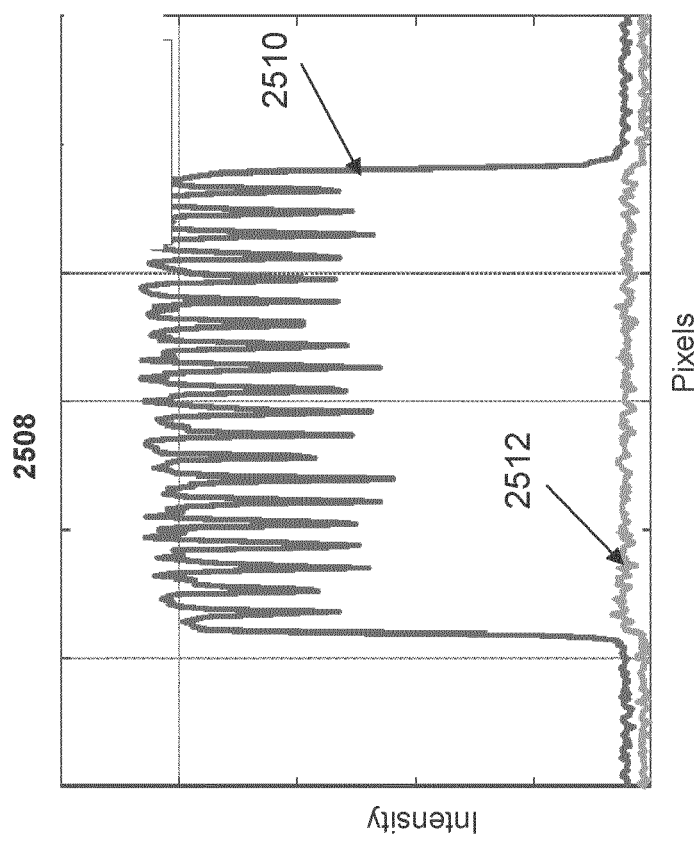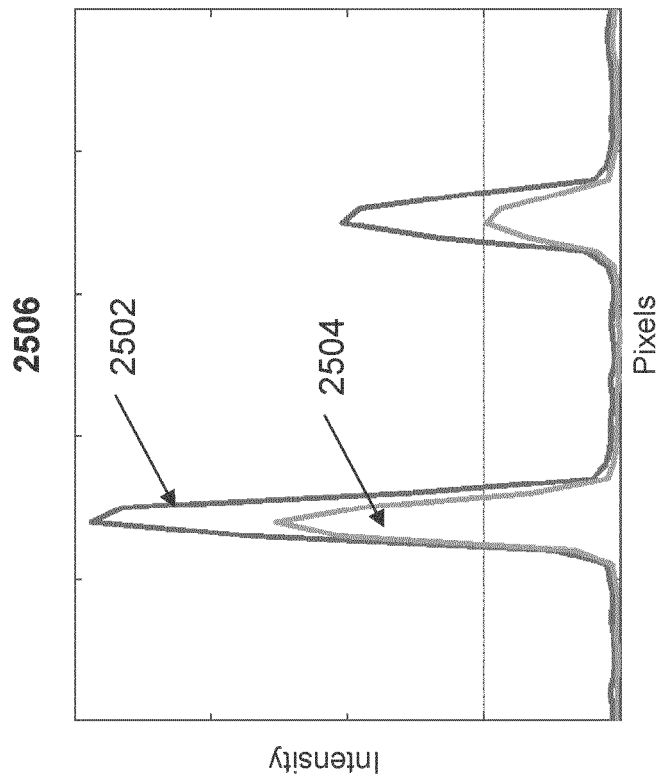
FIG. 25

METHOD FOR REGION OF INTEREST PROCESSING FOR RETICLE PARTICLE DETECTION

CROSS-REFERENCE TO RELATED APPLICATIONS

This application claims priority of U.S. application 62/964,924 which was filed on 23 Jan. 2020, and U.S. application 63/036,744 which was filed on 9 Jun. 2020, which are incorporated herein in their entirety by reference.

FIELD

The present disclosure relates to detection of contamination on lithographic patterning devices in lithographic apparatuses and systems.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are involved in the patterning process.

Metrology processes are used at various steps during a patterning process to monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be designed or altered, e.g., based on the measurements of the one or more characteristics, such that substrates manufactured by the patterning process have an acceptable characteristic(s).

With the advancement of lithography and other patterning process technologies, the dimensions of functional elements have continually been reduced, while the amount of the functional elements, such as transistors, per device has been steadily increased over decades. In the meanwhile, the requirement of accuracy in terms of overlay, critical dimension (CD), etc. has become more and more stringent. Error, such as error in overlay, error in CD, etc., will inevitably be produced in the patterning process. For example, imaging error may be produced from optical aberration, patterning device heating, patterning device error, and/or substrate heating and can be characterized in terms of, e.g., overlay, CD, etc. Additionally or alternatively, error may be introduced in other parts of the patterning process, such as in etch, development, bake, etc. and similarly can be characterized in terms of, e.g., overlay, CD, etc. The error may cause a problem in terms of the functioning of the device, including failure of the device to function, contamination, or one or more electrical problems of the functioning device. As such, these errors can also contribute to added costs due to inefficient processing, waste, and processing delays.

One such error that may be produced is contamination on a surface of the lithographic patterning device. Such contamination may include the presence of particles on the surface of the lithographic patterning device which may affect the etching of the pattern itself and/or subsequent inaccuracies in the patterning process, which may result in damaged and/or non-performing circuits.

Another error may be attributed to false positive detection of particles. During an inspection operation, a detector may receive light reflected off a pattern. This reflection produces a false positive detection indicating to the detector that a particle may be present. Moreover, such signals may also interfere with other light signals received from the particle at a back side of the lithographic patterning device. Accordingly, such interference can result in a false positive detection where the system may determine that a particle is present in a place where it does not.

SUMMARY

Accordingly, it is desirable to be able to characterize one or more these errors and take steps to design, modify, control, etc. a patterning process to reduce or minimize one or more of these errors. And, there is a need to determine a level of contamination of a patterning device, including size and location of contaminants, and determining whether to accept the device as within a predefined tolerance, or to reject the device as being contaminated beyond the predefined tolerance.

In some embodiments, inspections systems and methods are described that minimize false positive detection in lithographic inspection systems. According to some embodiments, an inspection system is disclosed including a radiation source that generates a beam of radiation. In some aspects, the radiation source irradiates a first surface of an object, a first parameter of the beam defining a region of the first surface of the object. Additionally, the radiation source also irradiate a second surface of the object, a second parameter of the beam defining a region of the second surface, wherein the second surface is at a different depth level within the object than the first surface. The inspection system also includes a detector that defines a field of view (FOV) of the first surface including the region of the first surface, and receives radiation scattered from the region of the first surface and the region of the second surface. According to some aspects, the inspection system may also include processing circuitry that discards image data not received from the region of the first surface, and construct a composite image comprising the image data from across the region of the first surface.

In some embodiments, a system includes an illumination system, an aperture stop, an optical system, and a detector. The illumination system is configured to transmit an illumination beam along an illumination path. The aperture stop is configured to select a portion of the illumination beam. The optical system is configured to transmit the selected portion of the illumination beam toward a reticle and transmit a signal beam scattered from the reticle. The detector is configured to detect the signal beam. The illumination system, the aperture stop, the optical system, and the detector are optically coaxial.

In some embodiments, the aperture stop includes an apodized aperture. In some embodiments, the apodized aperture includes a quarter disk aperture or a crescent aperture. In some embodiments, in a bright field mode, the aperture stop includes an apodized quarter disk aperture configured to transmit a central portion of the illumination beam and provide an angularly insensitive off-axis illumination beam toward the reticle. In some embodiments, in a dark field mode, the aperture stop includes an apodized crescent aperture configured to block a central portion of the illumination beam and provide an angularly sensitive off-axis illumination beam toward the reticle. In some embodiments, a numerical aperture of a focusing lens of the optical system is greater than a numerical aperture of a collecting lens of the optical system in order to increase an intensity of the signal beam.

In some embodiments, the aperture stop includes an electro-optical aperture module configured to control transmission of the illumination beam through the aperture stop. In some embodiments, the electro-optical aperture module controls transmission of the illumination beam in three degrees of freedom. In some embodiments, the three degrees of freedom include radial extent, angular extent, and intensity.

In some embodiments, the aperture stop includes an opto-mechanical aperture module configured to control transmission of the illumination beam through the aperture stop. In some embodiments, the opto-mechanical aperture module includes a plurality of aperture masks.

In some embodiments, the illumination system includes an electro-optical illumination module configured to electronically control the illumination beam. In some embodiments, the electro-optical illumination module includes a digital micromirror device (DMD), a liquid crystal modulator (LCM), a spatial light modulator (SLM), and/or some combination thereof. In some embodiments, the electro-optical illumination module controls a numerical aperture of the illumination beam.

In some embodiments, a first adjustment of a numerical aperture of the illumination beam and a second adjustment of the aperture stop provide multiple angles of illumination on the reticle. In some embodiments, the system further includes a controller coupled to the illumination system, the aperture stop, and/or the detector. In some embodiments, the controller is configured to provide real-time feedback for image acquisition of the signal beam.

In some embodiments, the optical system includes a linear polarizer, a polarizing beamsplitter, and a quarter-wave plate. In some embodiments, the optical system is configured to block stray radiation from the signal beam. In some embodiments, the optical system includes a focusing lens, a beamsplitter, and a collecting lens. In some embodiments, a numerical aperture of the focusing lens is greater than a numerical aperture of the collecting lens in order to increase an intensity of the signal beam.

In some embodiments, the illumination beam includes a structured light pattern. In some embodiments, the illumination beam includes a plurality of narrow spectral bands.

In some embodiments, the system includes an illumination system, an aperture stop, an optical system, and a detector. The illumination system is configured to transmit an illumination beam along an illumination path and the illumination beam includes a structured light pattern. The aperture stop is configured to select a portion of the illumination beam and the aperture stop includes an apodized aperture. The optical system is configured to transmit the selected portion of the illumination beam toward a target and transmit a signal beam scattered from the target. The detector is configured to detect the signal beam.

In some embodiments, the structured light pattern includes amplitude modulation (AM). In some embodiments, the AM includes a spatial frequency of less than 50 cycles/mm. In some embodiments, the AM includes three patterns configured to identify a particle signal, a particle depth, and/or a ghost light contribution of the target based on an image characteristic of each location of interest.

In some embodiments, the structured light pattern includes frequency modulation (FM). In some embodiments, the FM includes a spatial frequency of less than 50 cycles/mm. In some embodiments, the FM includes three patterns configured to identify a particle signal, a particle depth, and/or a ghost light contribution of the target based on a Fourier transform characteristic of each location of interest.

In some embodiments, the illumination system, the aperture stop, the optical system, and the detector are aligned along an optical axis.

In some embodiments, an apparatus includes an illumination system, a projection system, and an inspection system. The illumination system is configured to illuminate a patterning device. The projection system is configured to project an image of the patterning device onto a substrate. The inspection system is configured to detect particles on the patterning device. The inspection system includes a second illumination system, an aperture stop, an optical system, and a detector. The second illumination system is configured to transmit an illumination beam along an illumination path. The aperture stop is configured to select a portion of the illumination beam. The optical system is configured to transmit the selected portion of the illumination beam toward the patterning device and transmit a signal beam scattered from the patterning device. The detector is configured to detect the signal beam. The second illumination system, the aperture stop, the optical system, and the detector are aligned along an optical axis.

In some embodiments, in a bright field mode, the aperture stop includes an apodized quarter disk aperture configured to transmit a central portion of the illumination beam and provide an angularly insensitive off-axis illumination beam toward the patterning device. In some embodiments, in a dark field mode, the aperture stop includes an apodized crescent aperture configured to block a central portion of the illumination beam and provide an angularly sensitive off-axis illumination beam toward the patterning device. In some embodiments, the apparatus further includes a second inspection system arranged opposite the inspection system. In some embodiments, the apparatus further includes a second inspection system arranged adjacent to the inspection system.

Further features and advantages of the disclosure, as well as the structure and operation of various embodiments of the disclosure, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure.

Figure 6:
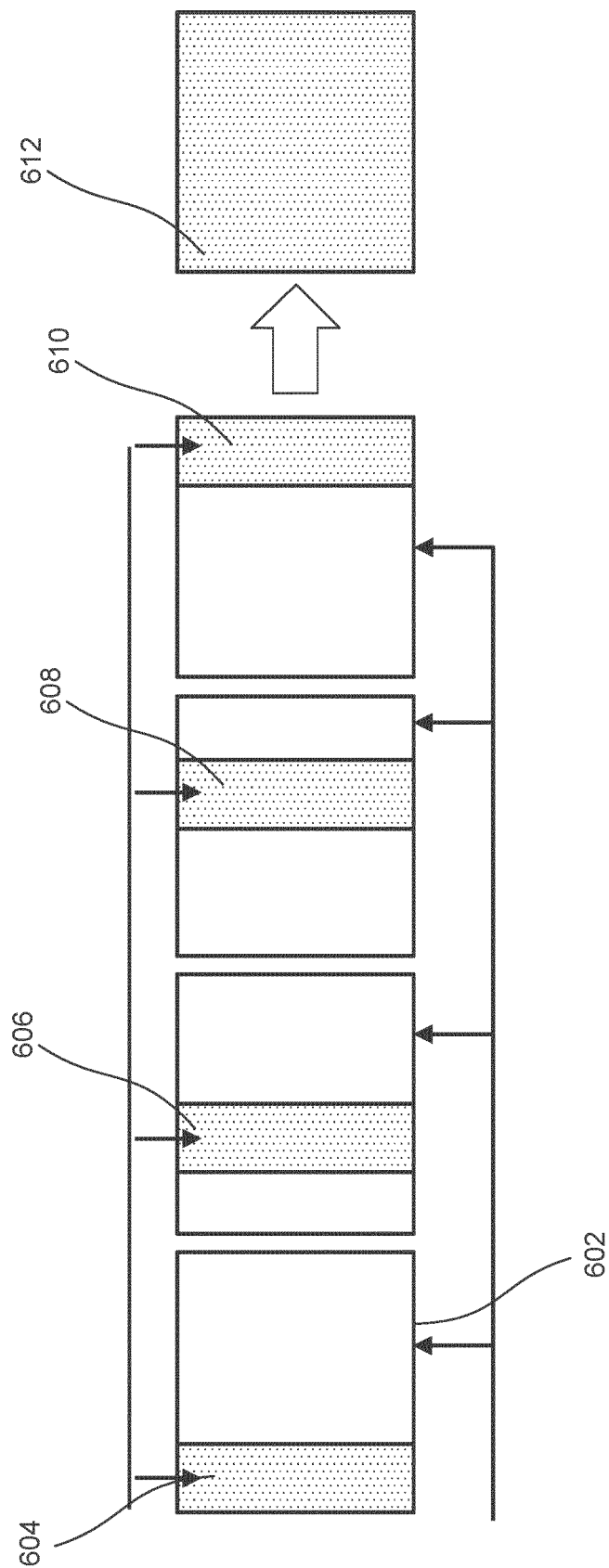

FIG. 6 illustration of an illumination methodology where a region of interest is irradiated at a time, according to an exemplary embodiment.

Figure 7:
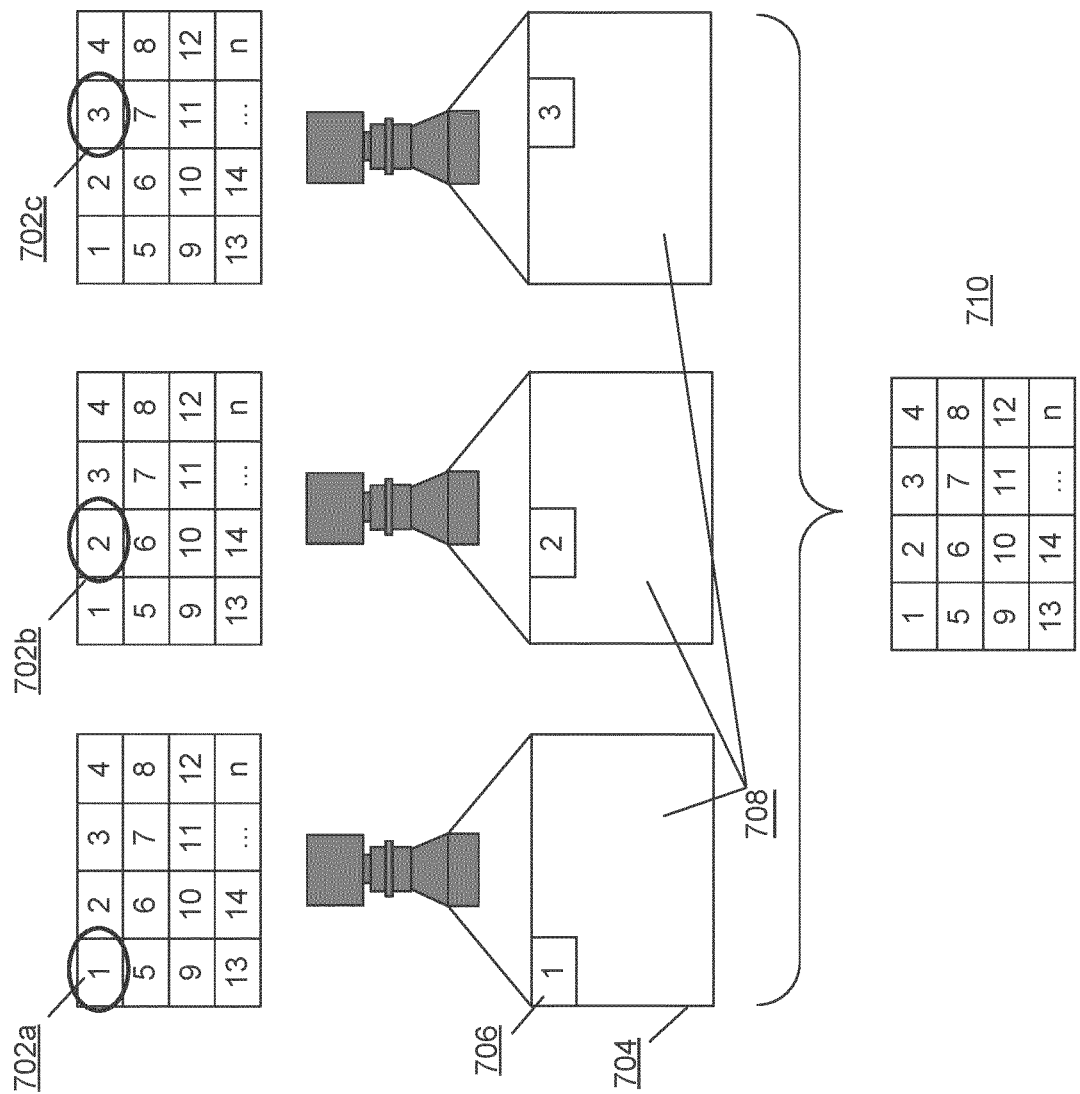

FIG. 7 illustrates an order of operations to reconstruct a composite image from subsequently acquired region of interest images, according to an exemplary embodiment.

Figure 8:
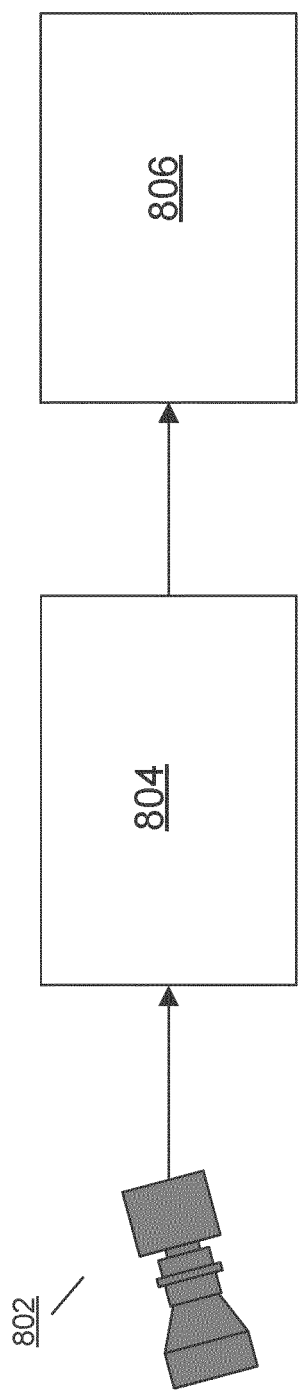

FIG. 8 illustrates a schematic of a data acquisition preprocessing pipeline, according to an exemplary embodiment.

Figure 9B:
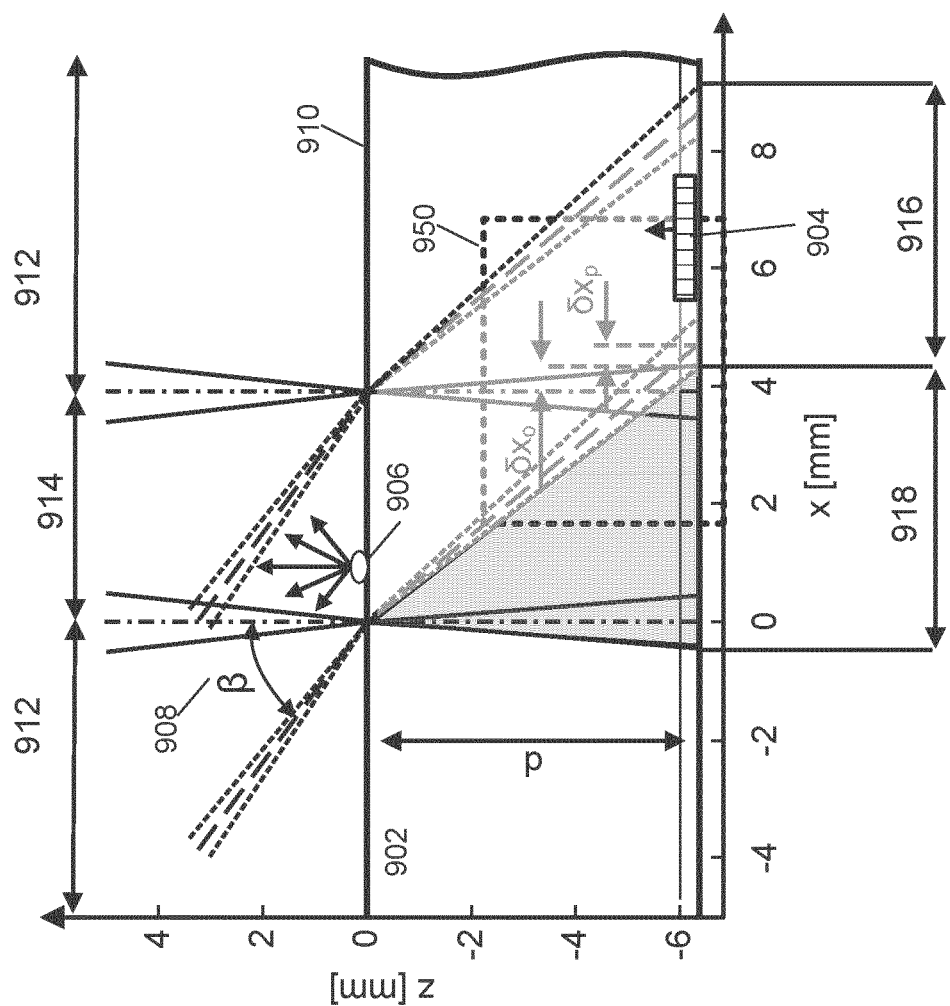
Figure 9C:
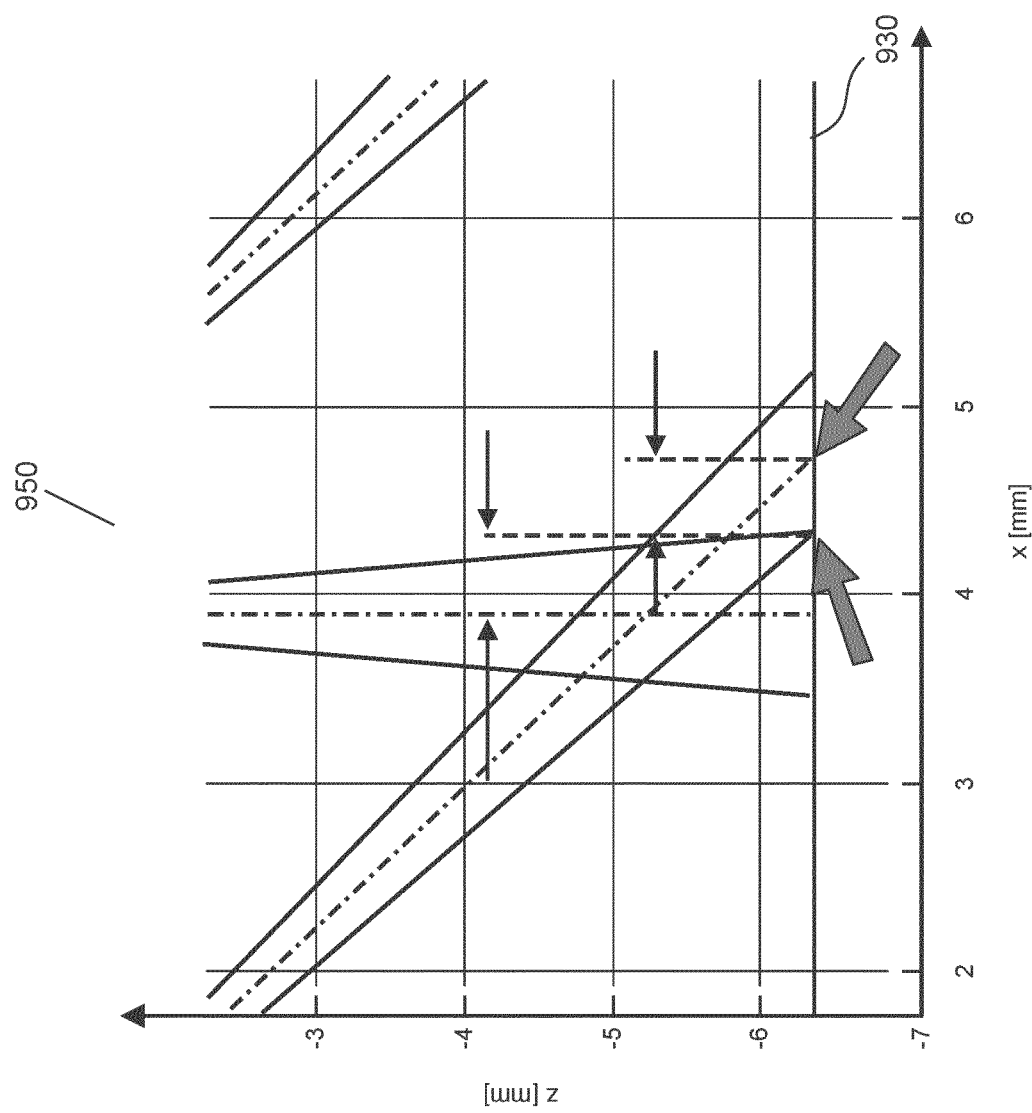

FIG. 9A-9C illustrate a schematic of an illumination and observation system in a cross-section of a region of interest illustration, according to an exemplary embodiment.

Figure 10:
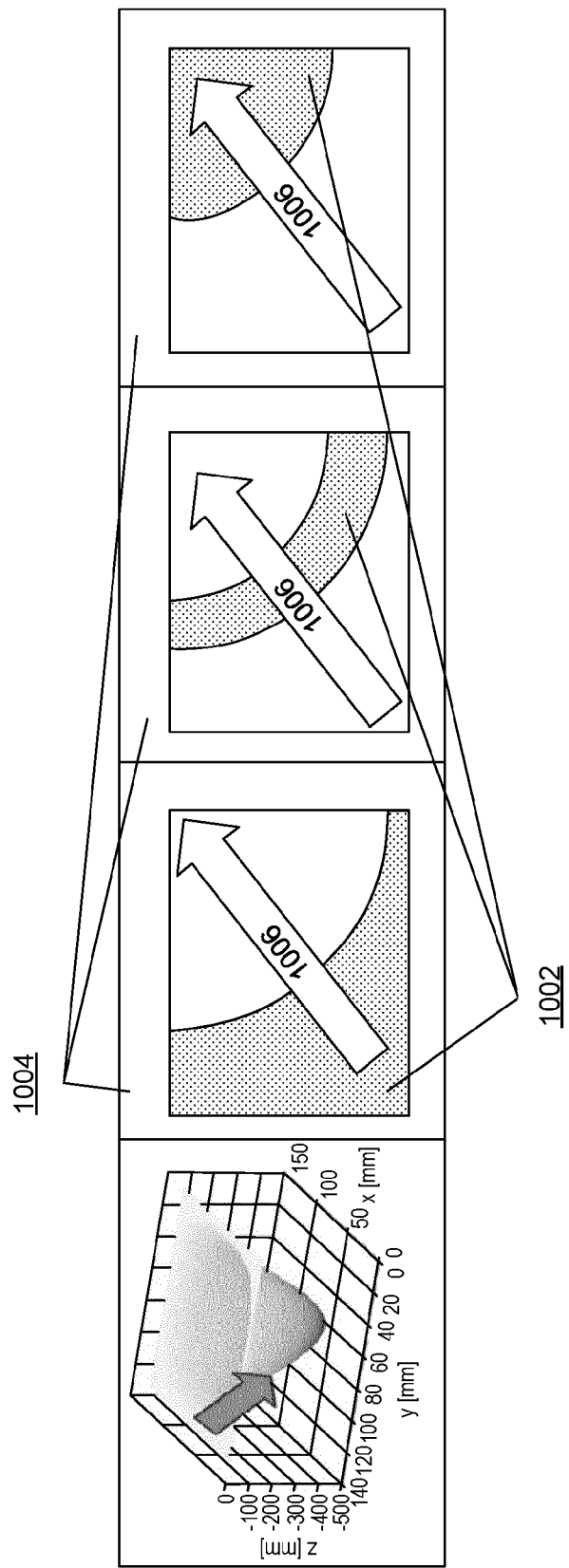

FIG. 10 illustrates example shapes of regions of interest used to illuminate non-flat surfaces of a pellicle, according to an exemplary embodiment.

FIG. 11A illustrates an opto-mechanical schematic of a system enabling high-resolution imaging of an entire lithographic patterning device using multiple regions of interest, according to an exemplary embodiment.

Figure 11B:
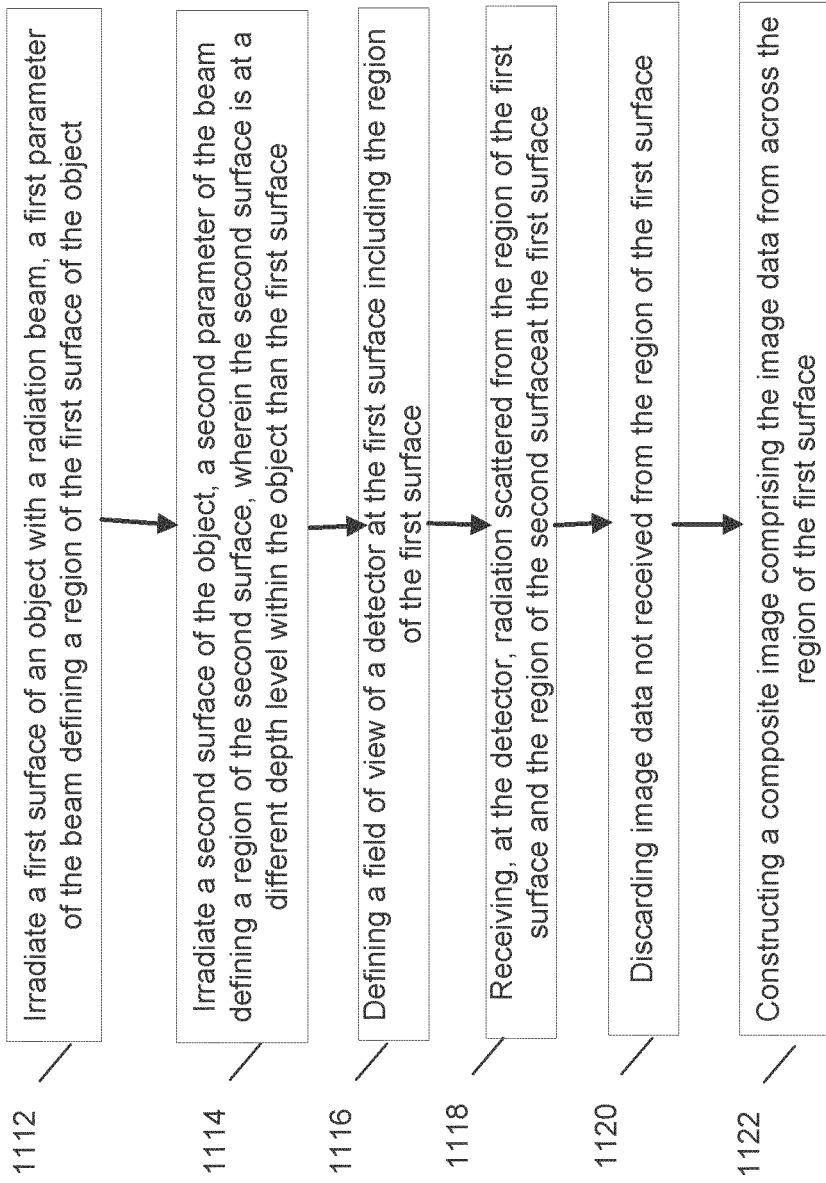

FIG. 11B illustrates a flow diagram of an inspection method, according to an exemplary embodiment.

Figure 12:
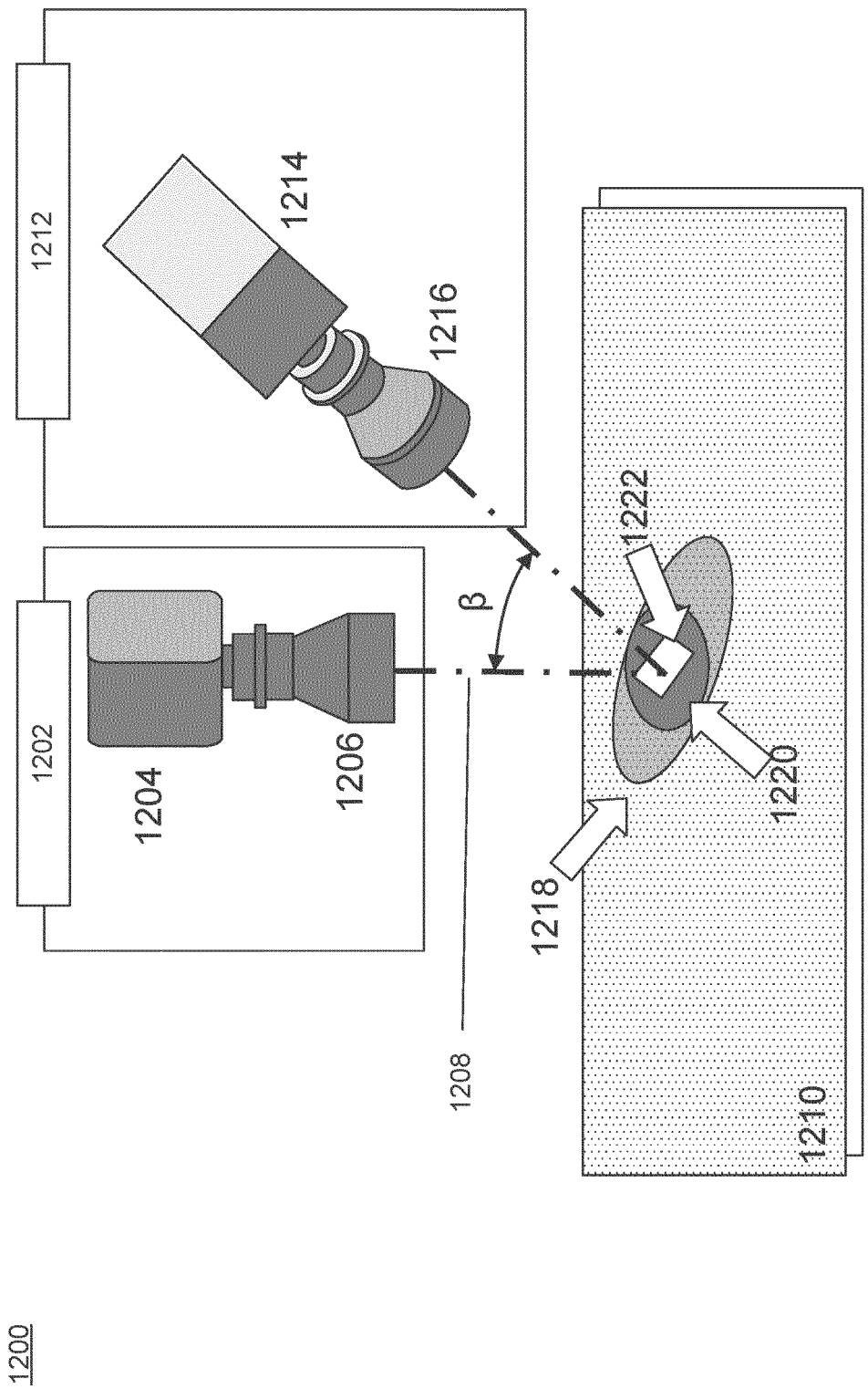

FIG. 12 illustrates an opto-mechanical schematic of particle detection system, according to an exemplary embodiment.

Figure 13:
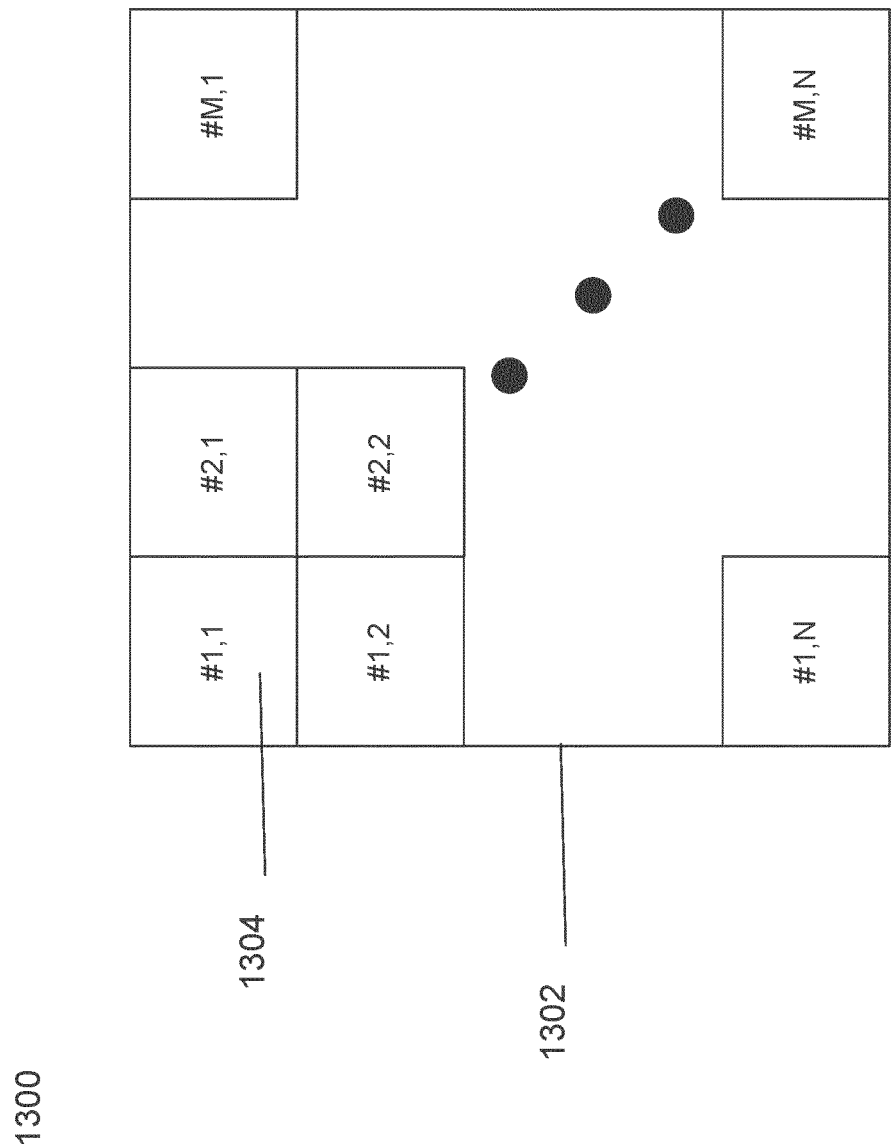

FIG. 13 illustrates a gird of rectangular fields of view covering an entire surface of a lithographic patterning device according to an exemplary embodiment.

Figure 14:
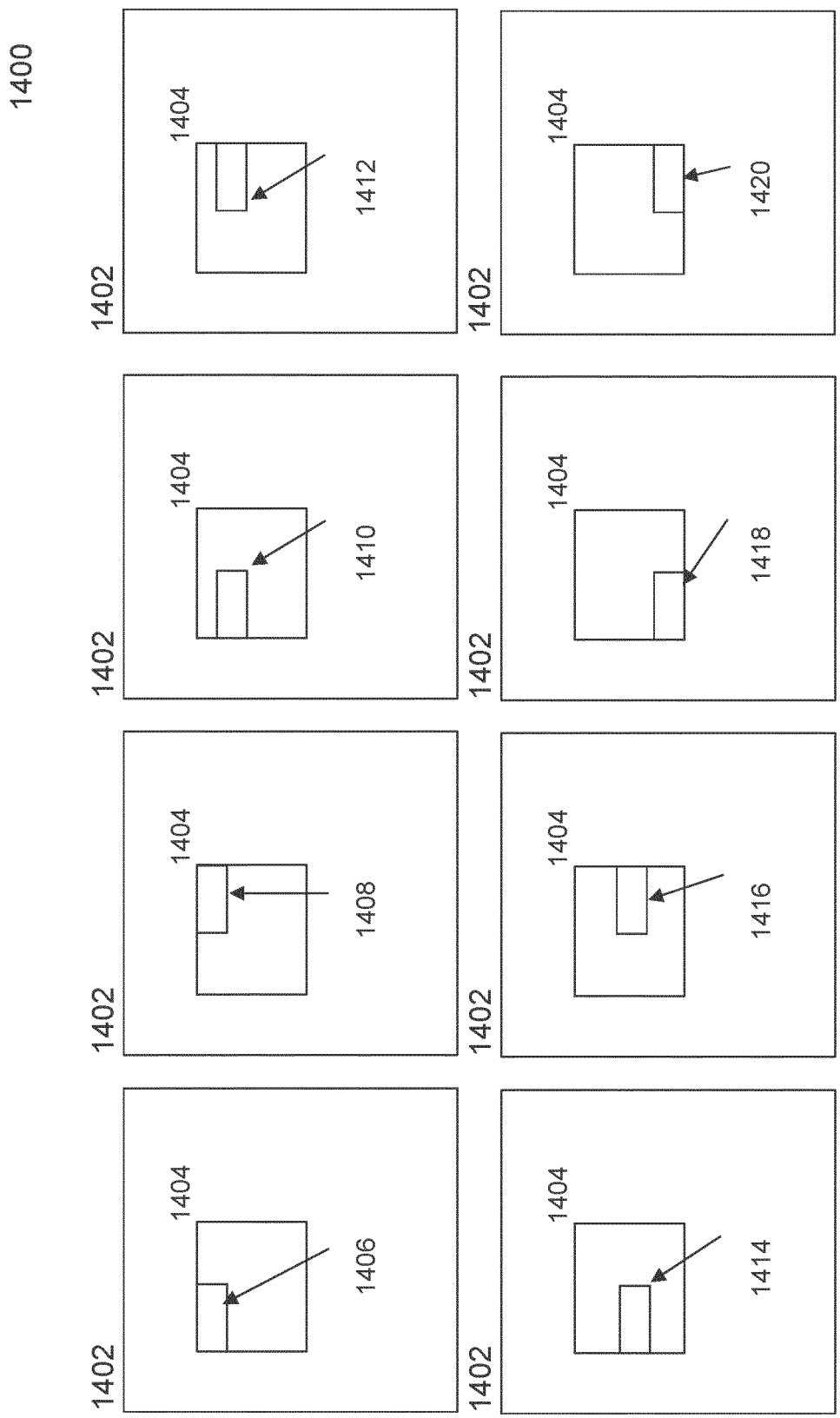

FIG. 14 illustrates a radiation operation of different areas within a camera field of view that are irradiated, according to an exemplary embodiment.

Figure 15:
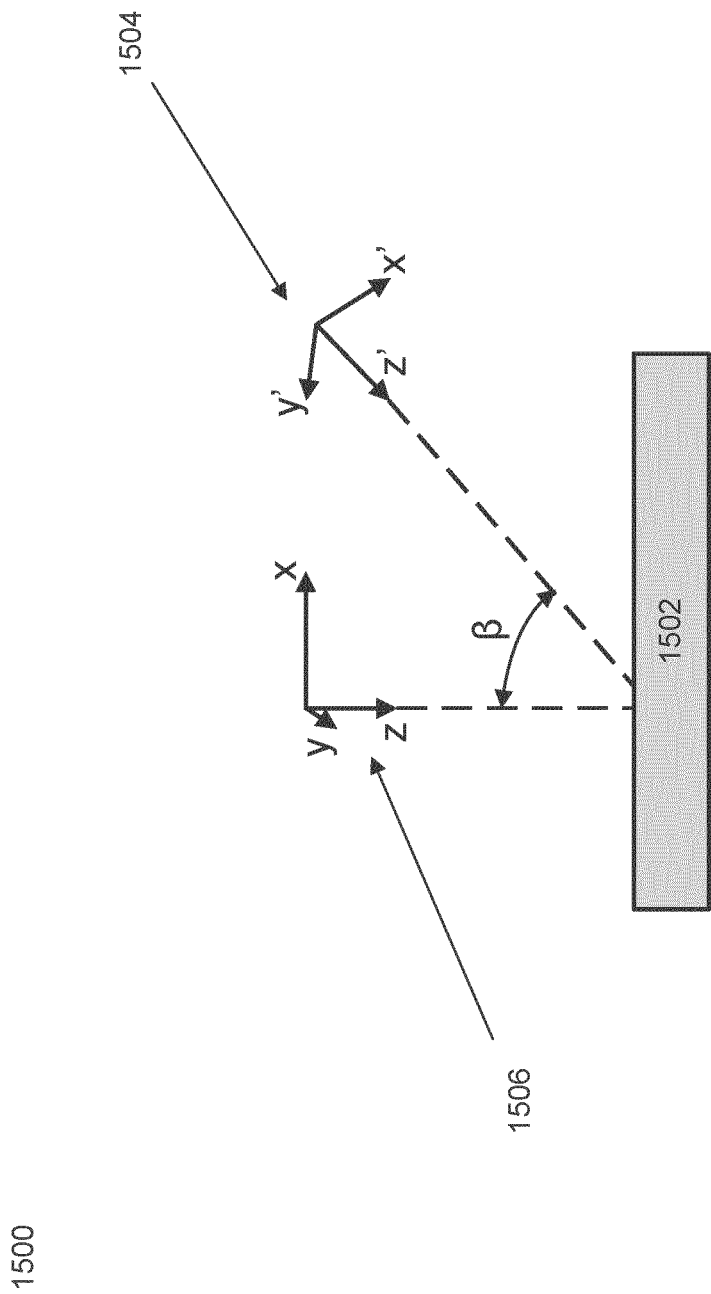

FIG. 15 illustrates a schematic of an opto-mechanical setup of measurement system, according to an exemplary embodiment.

Figure 16:
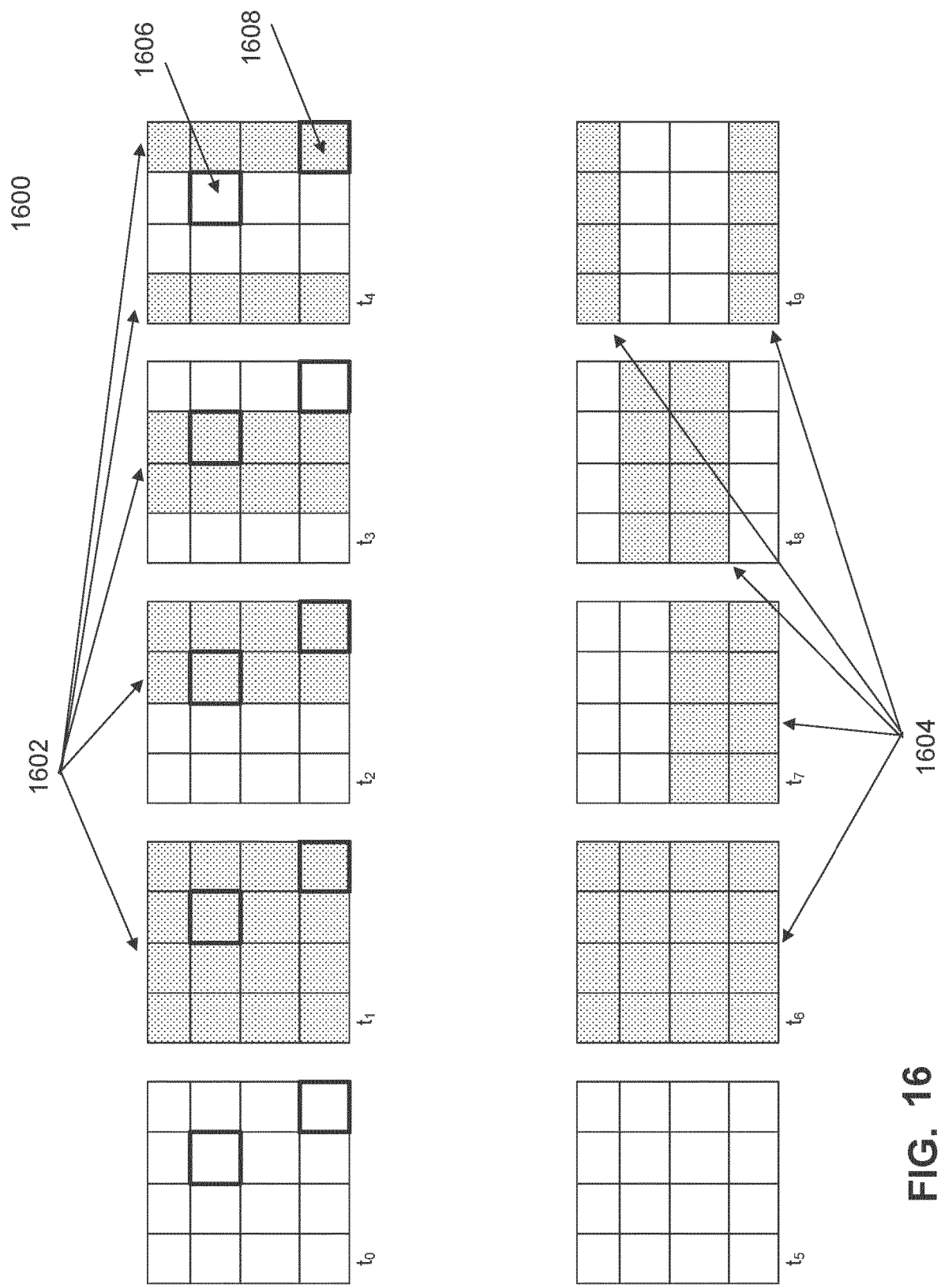

FIG. 16 illustrates an example sequence of gray code patterns projected to calibrate horizontal and vertical coordinates of an observation illumination system, according to an exemplary embodiment.

Figure 17:
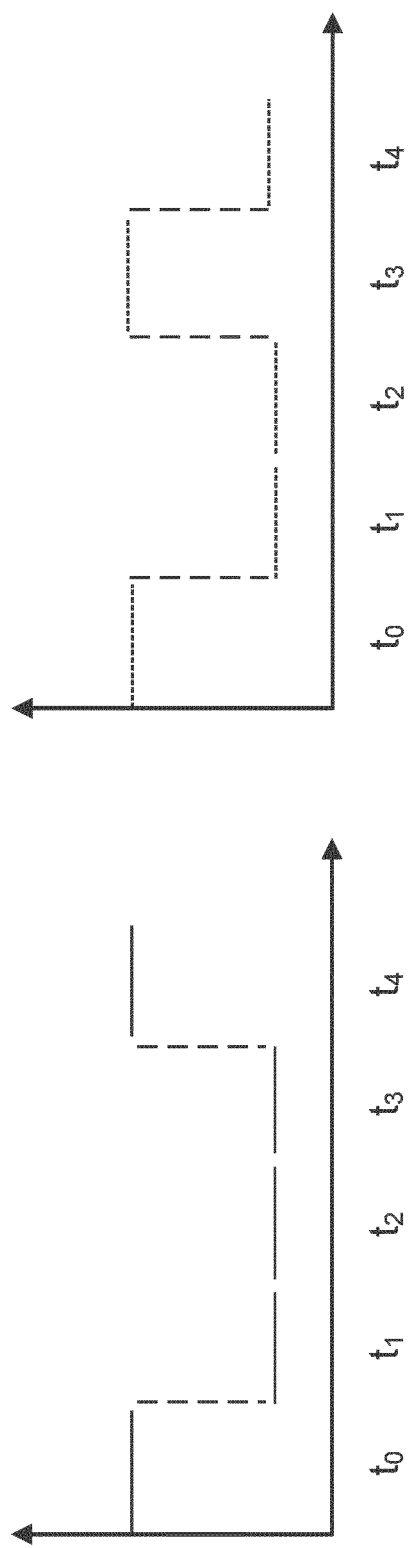

FIG. 17 illustrates temporal intensity profiles acquired in pixels, according to an exemplary embodiment.

Figure 18:
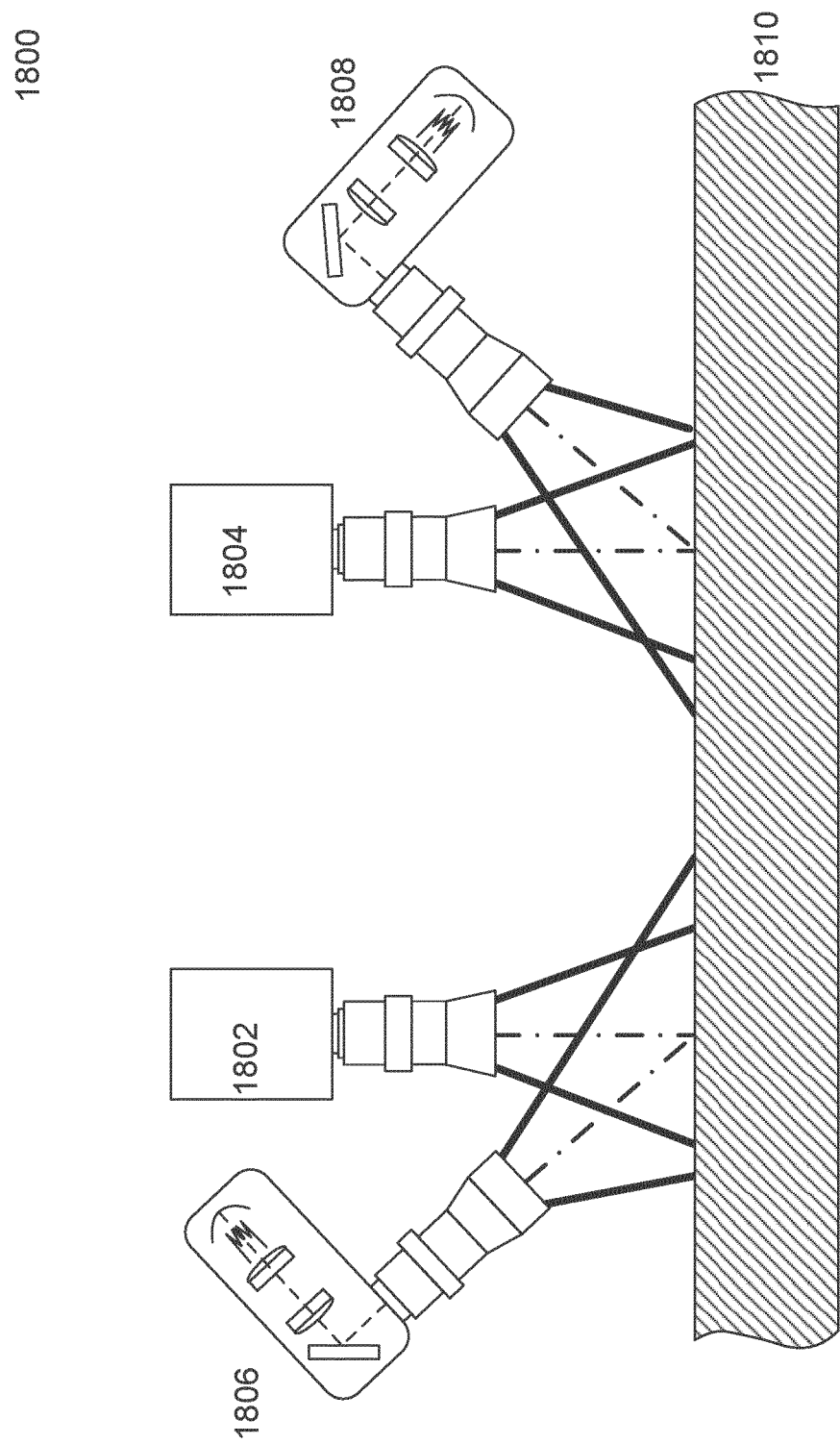

FIG. 18 illustrates a system configuration of an observation-illumination system, according to an exemplary embodiment.

Figure 19:
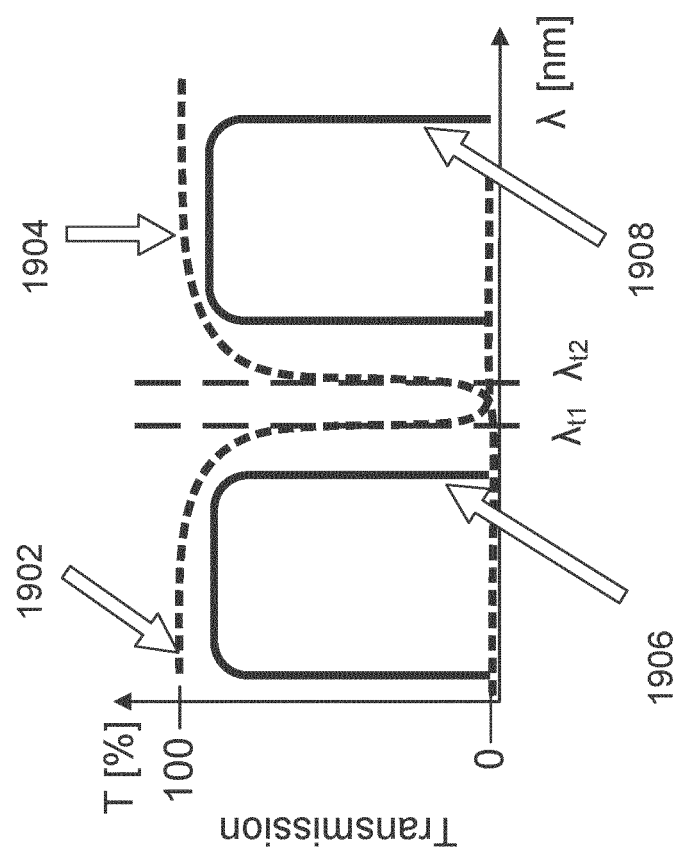

FIG. 19 illustrates spectral bands of observation and illumination systems of FIG. 18, according to an exemplary embodiment.

Figure 20:
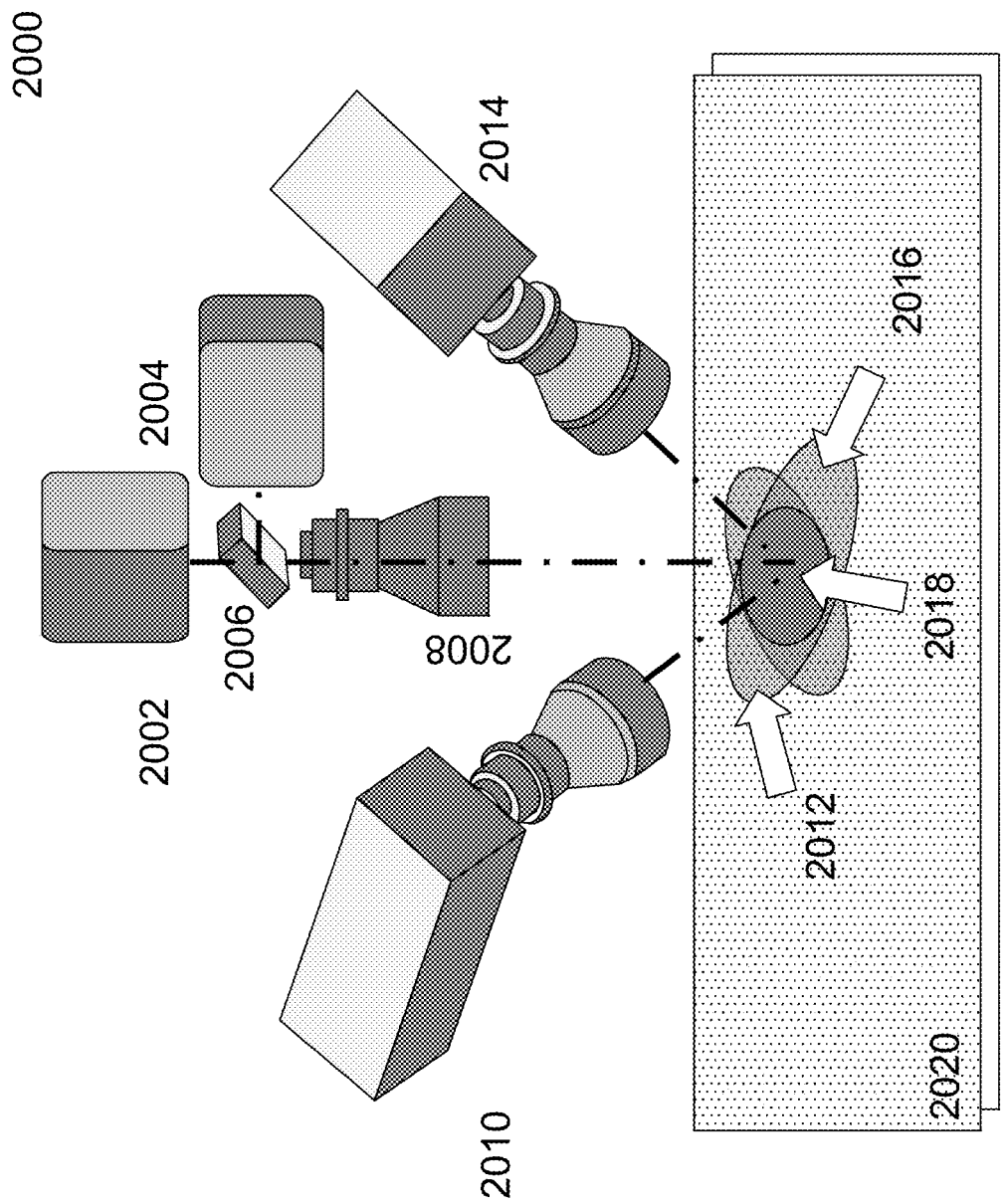

FIG. 20 illustrates a configuration of an illumination-detection system, according to an exemplary embodiment.

Figure 21:
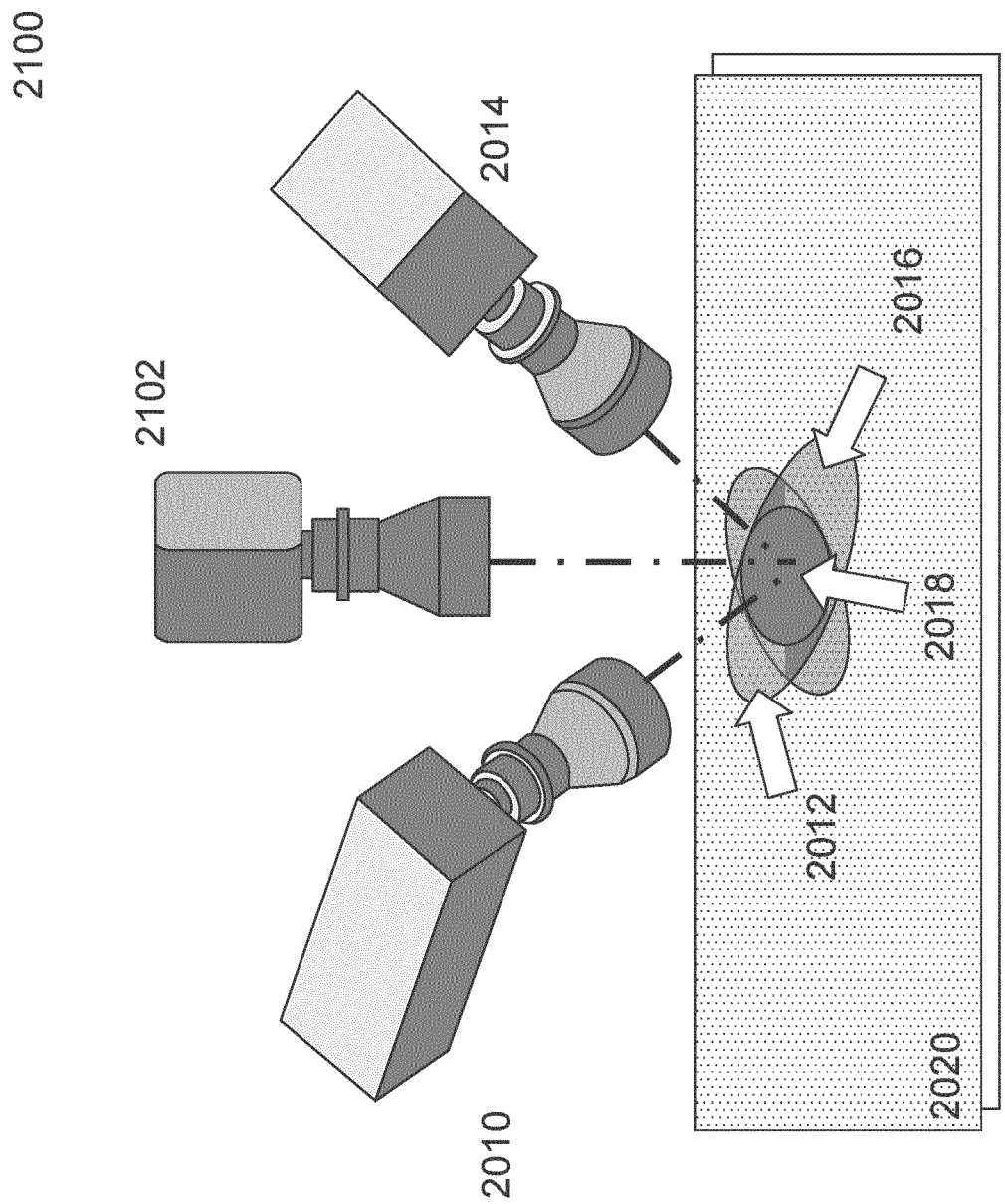

FIG. 21 illustrates a configuration of an illumination-detection system, according to an exemplary embodiment.

Figure 22:
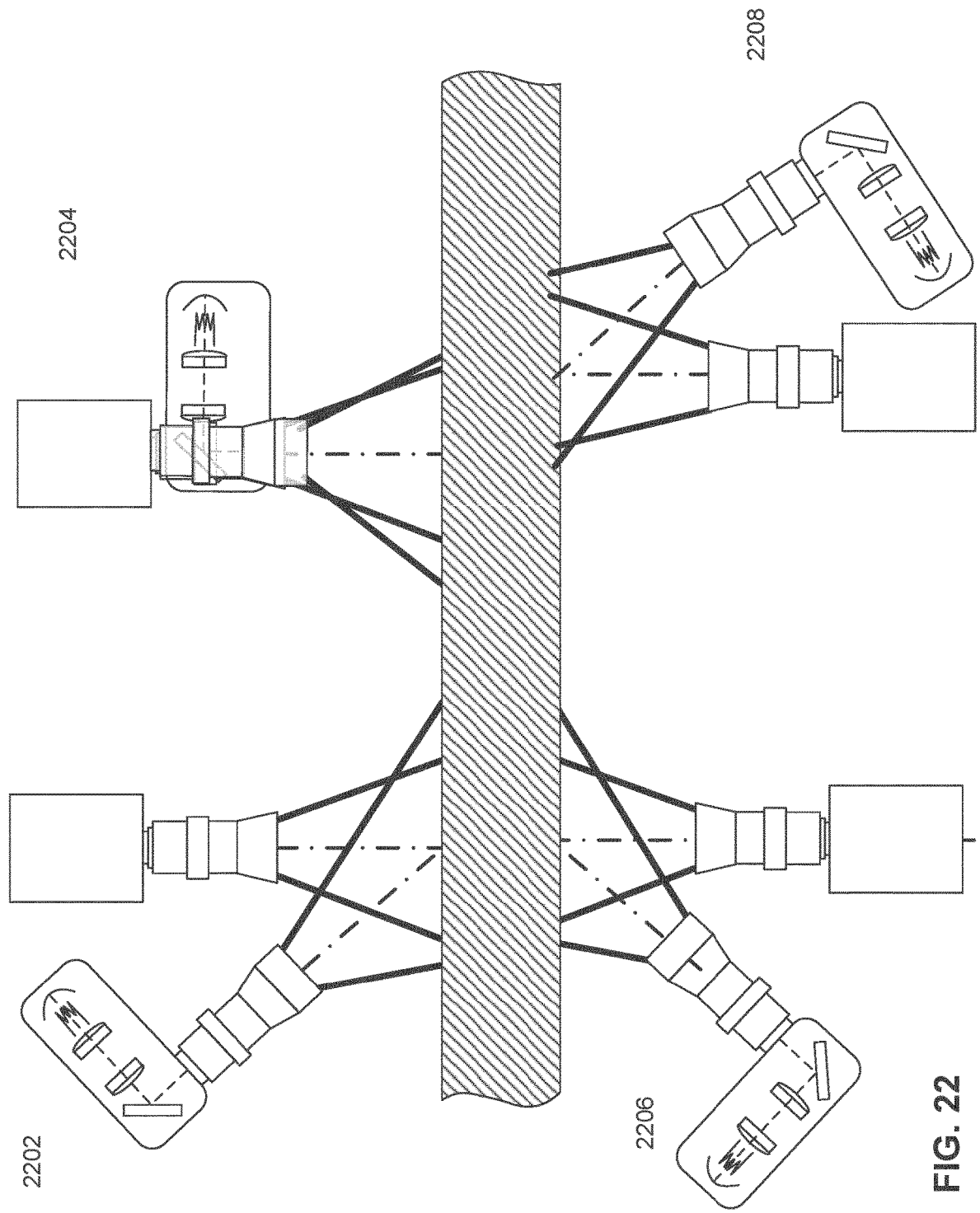

FIG. 22 illustrates a configuration of an illumination-detection system, according to an exemplary embodiment.

Figure 23:
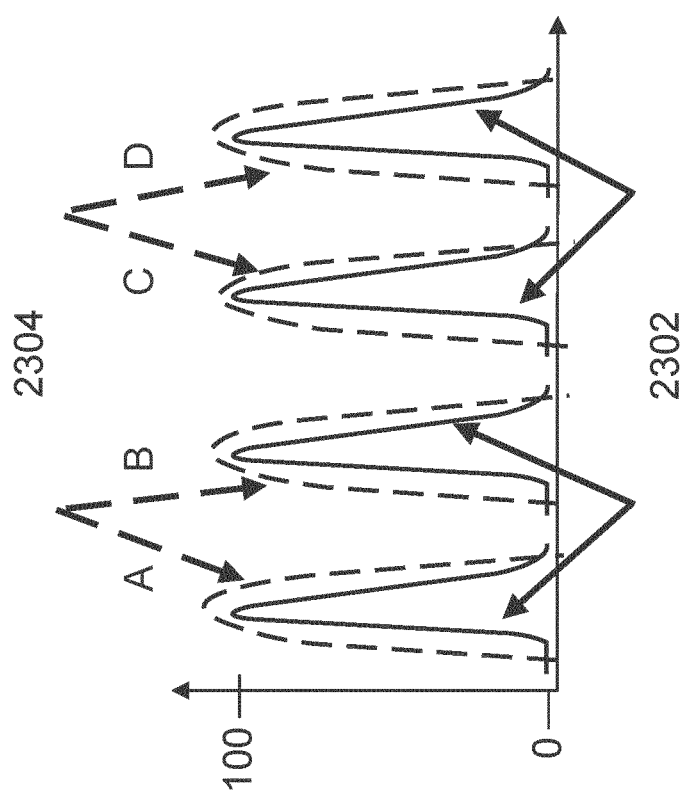

FIG. 23 illustrates example emission spectra of light sources incorporated into illumination system, according to an exemplary embodiment.

Figure 24:
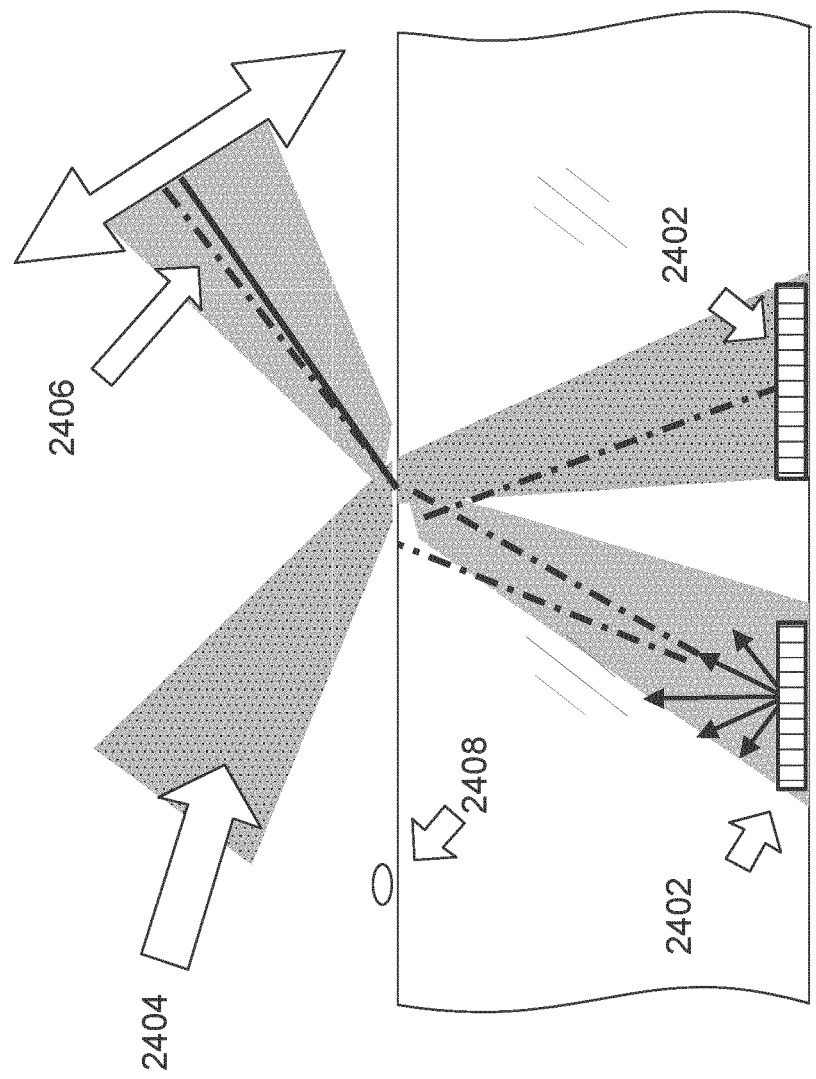

FIG. 24 illustrates diffractive properties of a pattern portion of a lithographic patterning device, where electromagnetic radiation impinging the lithographic patterning device can be redirected to detection system, according to an exemplary embodiment.

FIG. 25 illustrates intensity amplitude data between detected polarized reflections and unpolarized reflections, according to an exemplary embodiment.

Figure 26:
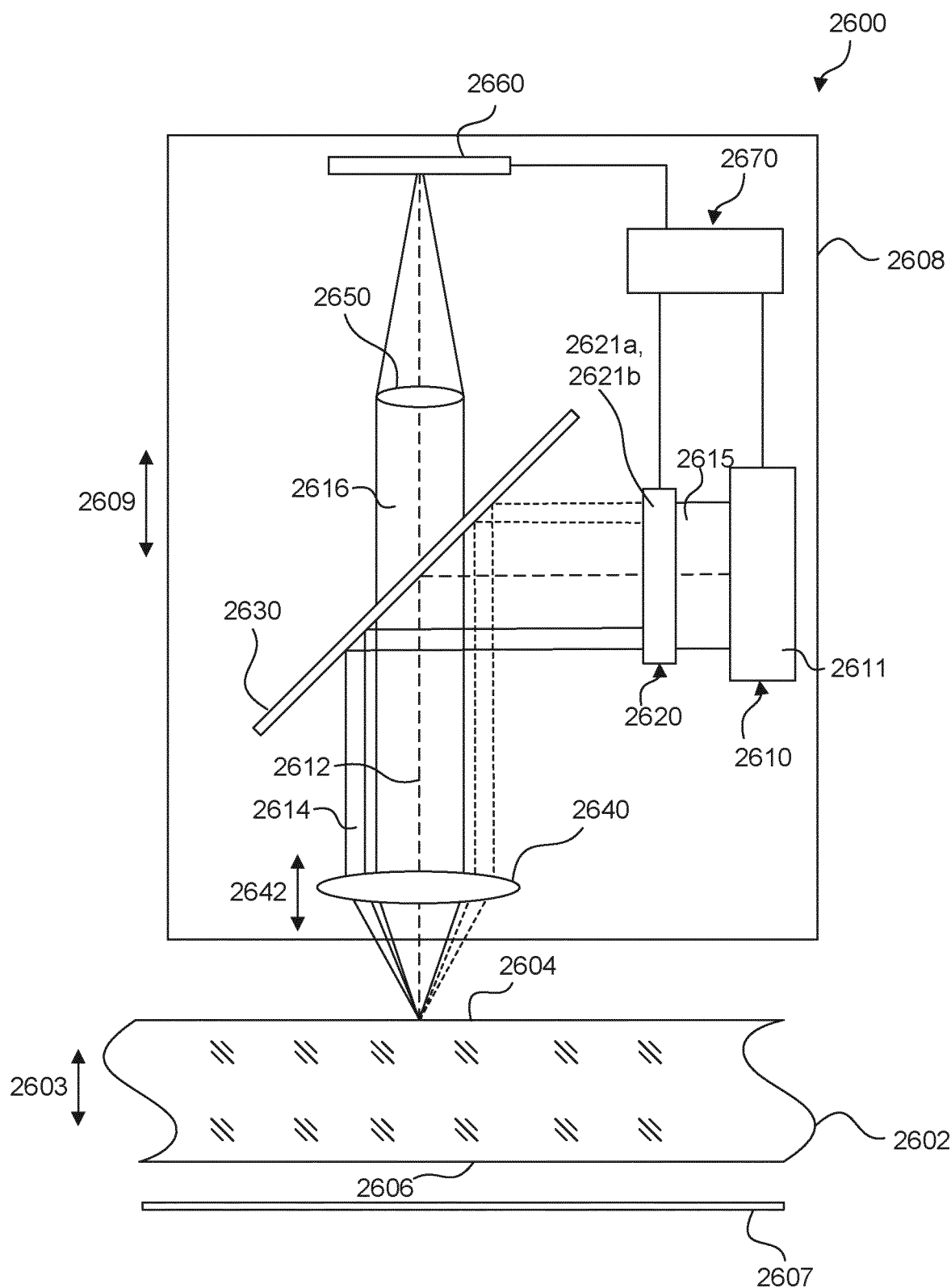

FIG. 26 is a schematic cross-sectional illustration of a coaxial inspection system, according to an exemplary embodiment.

Figure 27:
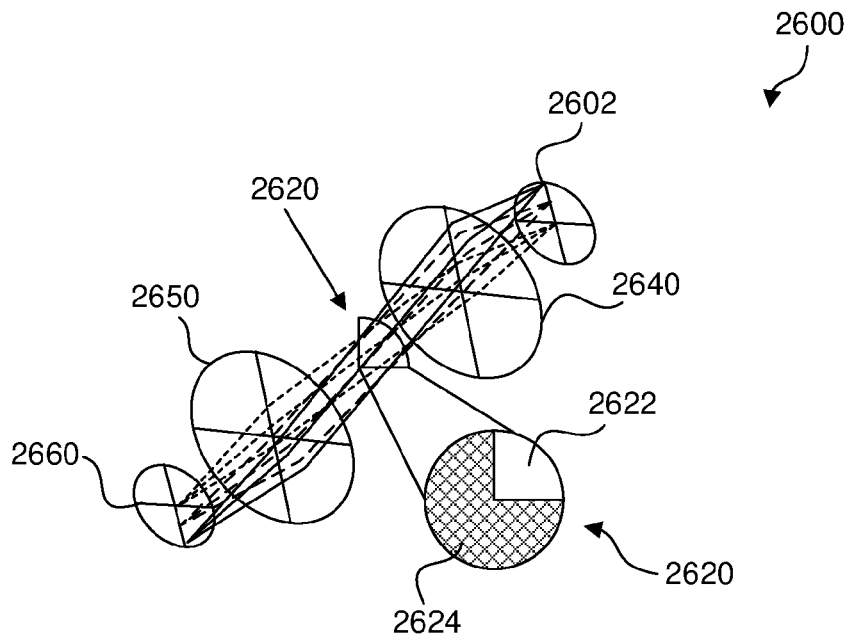

FIG. 27 is a schematic perspective illustration of the coaxial inspection system shown in FIG. 26, according to an exemplary embodiment.

Figure 28:
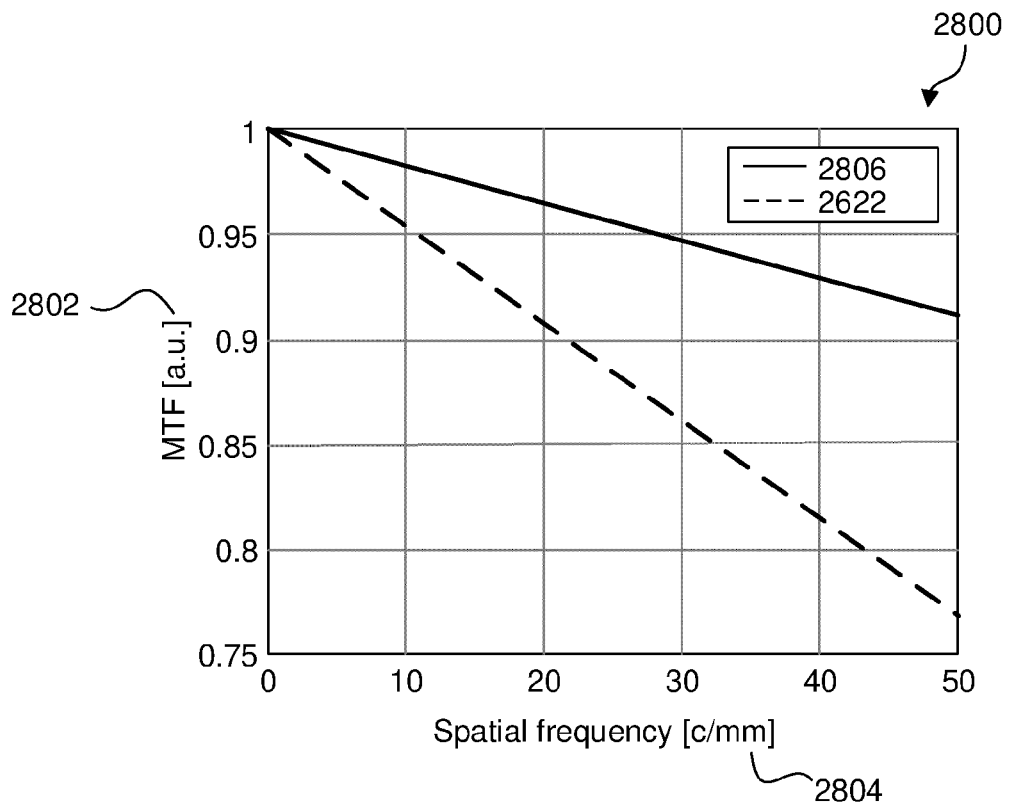

FIG. 28 is a plot of a modulation transfer function (MTF) distribution of the coaxial inspection system shown in FIG. 27, according to an exemplary embodiment.

Figure 29:
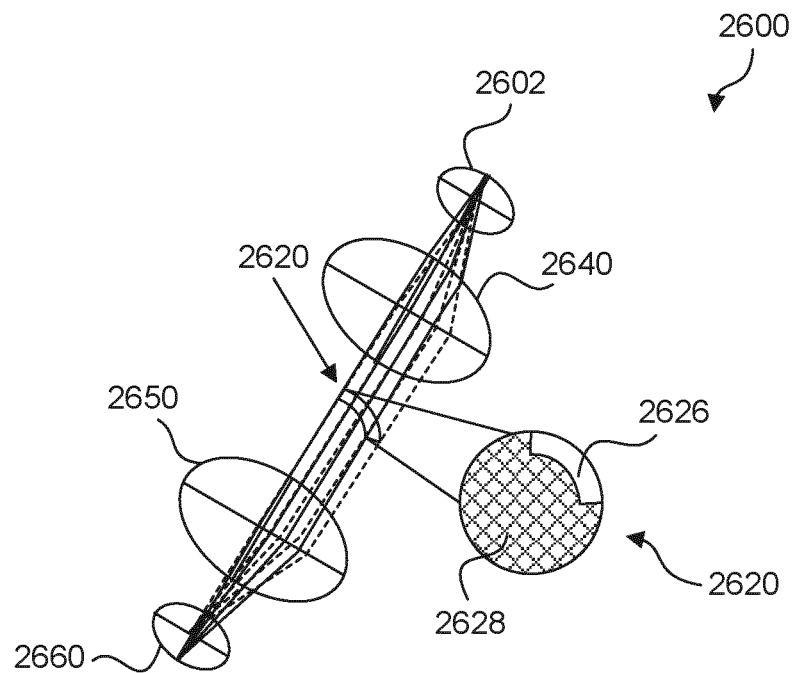

FIG. 29 is a schematic perspective illustration of the coaxial inspection system shown in FIG. 26, according to an exemplary embodiment.

Figure 30:
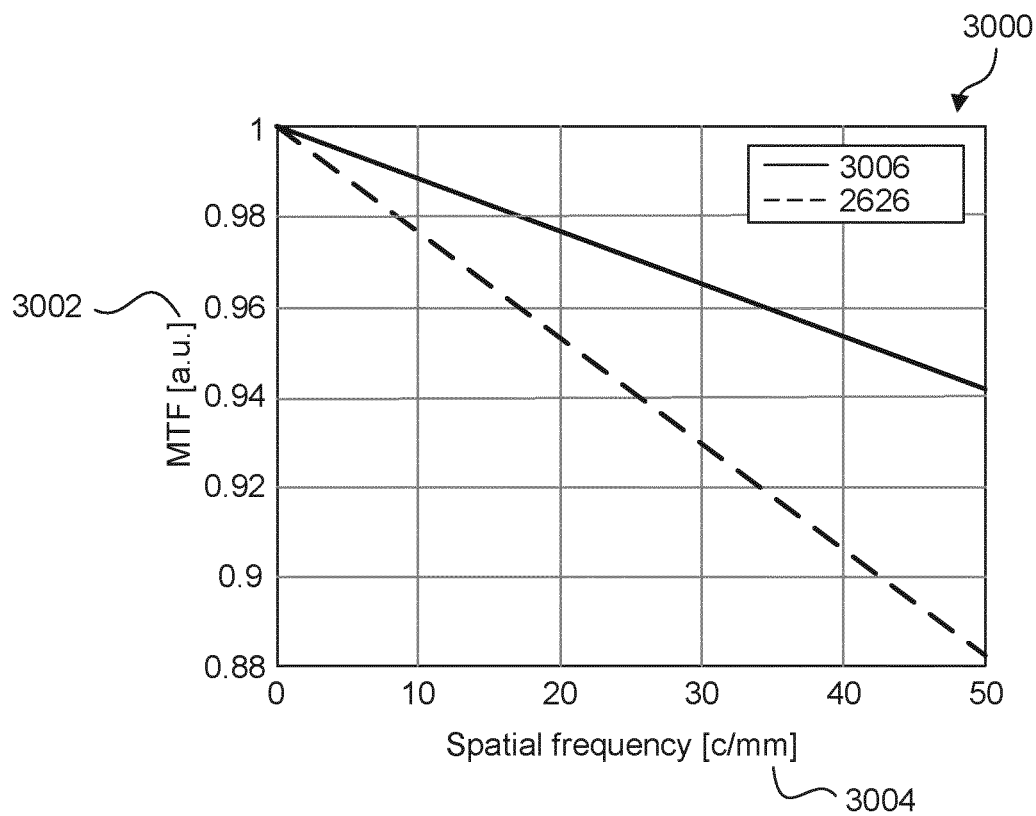

FIG. 30 is a plot of a MTF distribution of the coaxial inspection system shown in FIG. 29, according to an exemplary embodiment.

Figure 31:
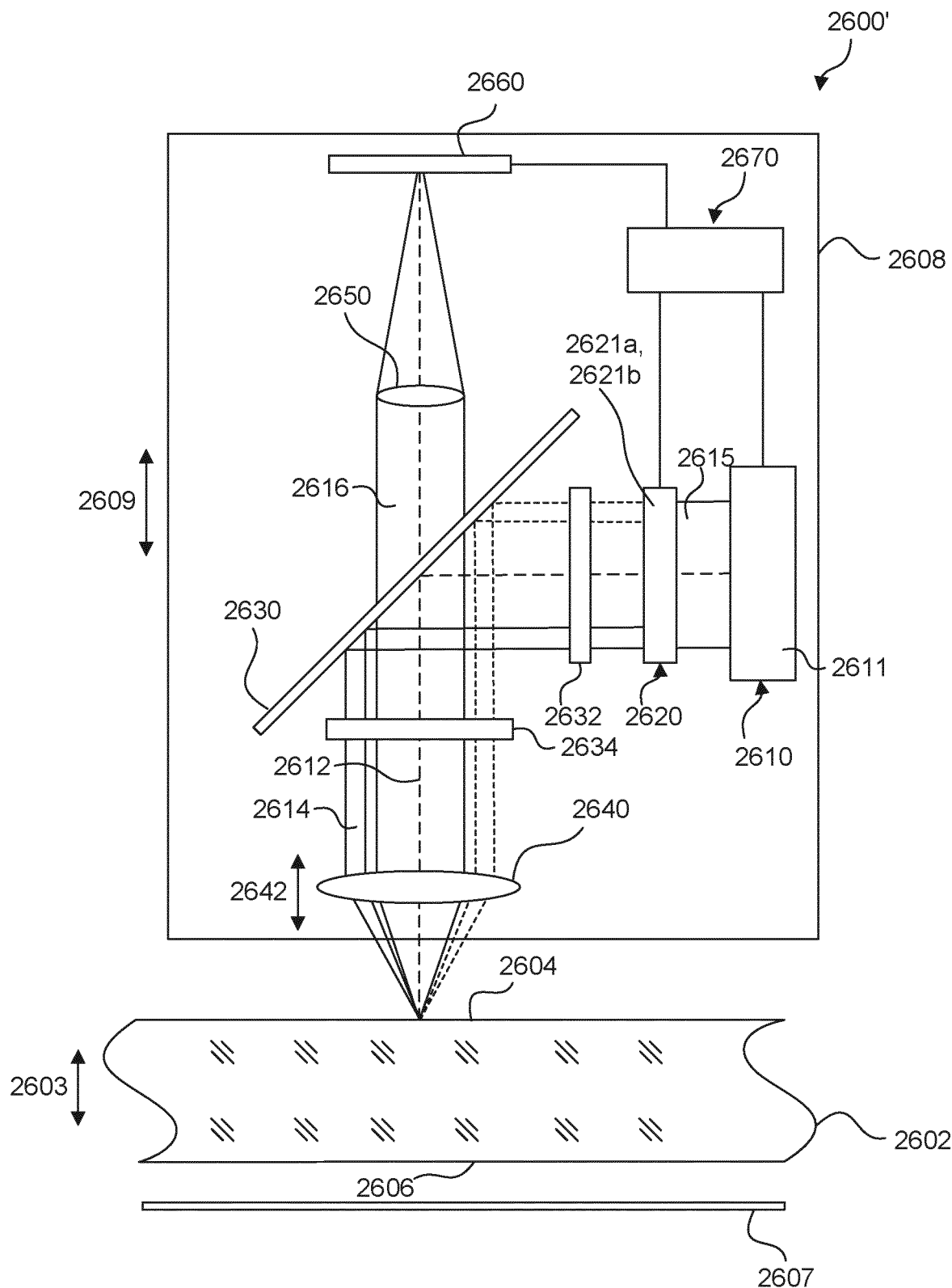

FIG. 31 is a schematic cross-sectional illustration of an alternative coaxial inspection system with a polarized optical system, according to an exemplary embodiment.

Figure 32:
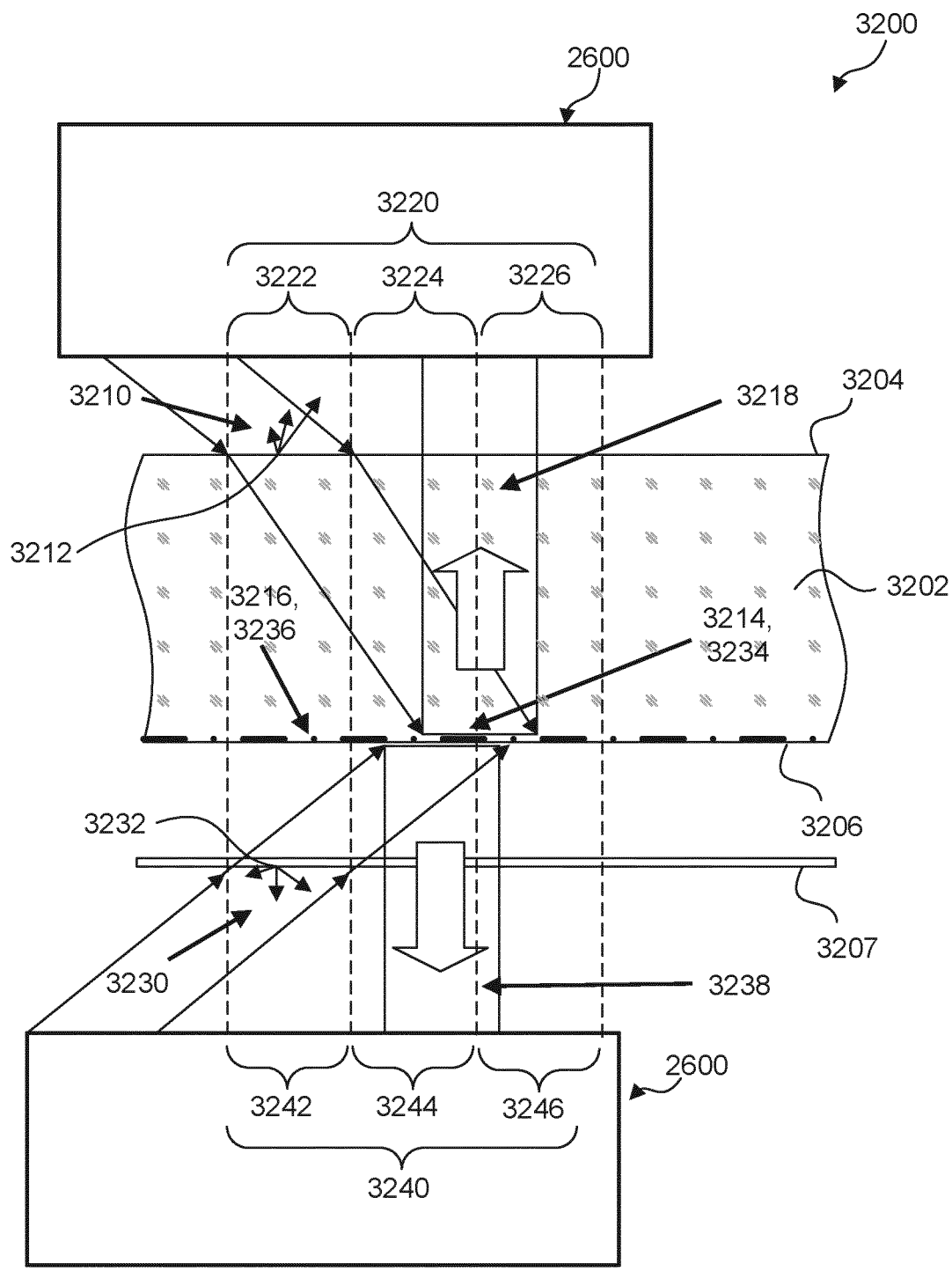

FIG. 32 is a schematic cross-sectional illustration of a region of interest (ROI) inspection system, according to an exemplary embodiment.

FIGS. 33A-33C are schematic perspective illustrations of the ROI inspection system shown in FIG. 32 and image acquisitions of various ROIs, according to exemplary embodiments.

Figure 34:
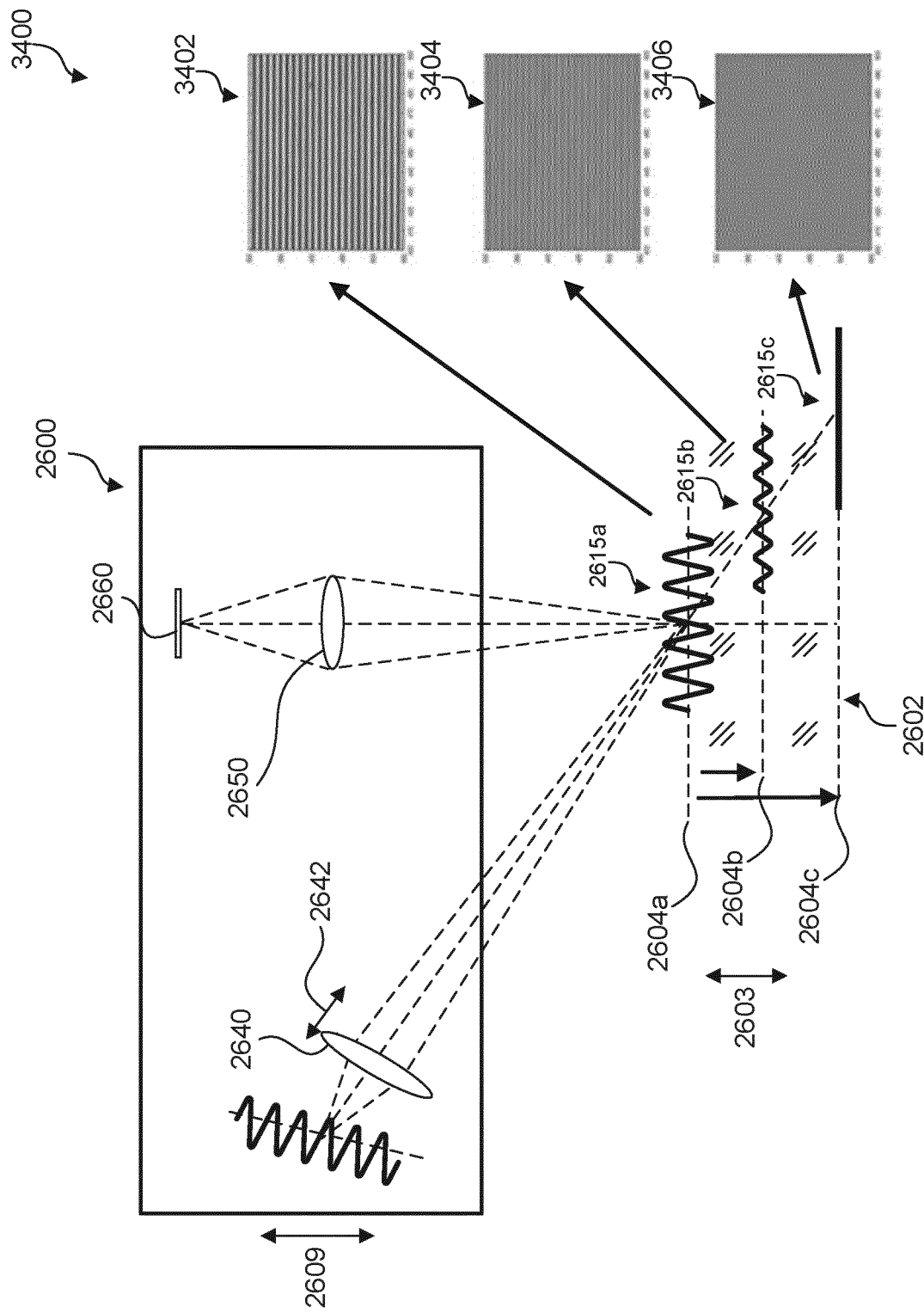

FIG. 34 is a schematic cross-sectional illustration of an AM inspection system, according to an exemplary embodiment.

Figure 35:
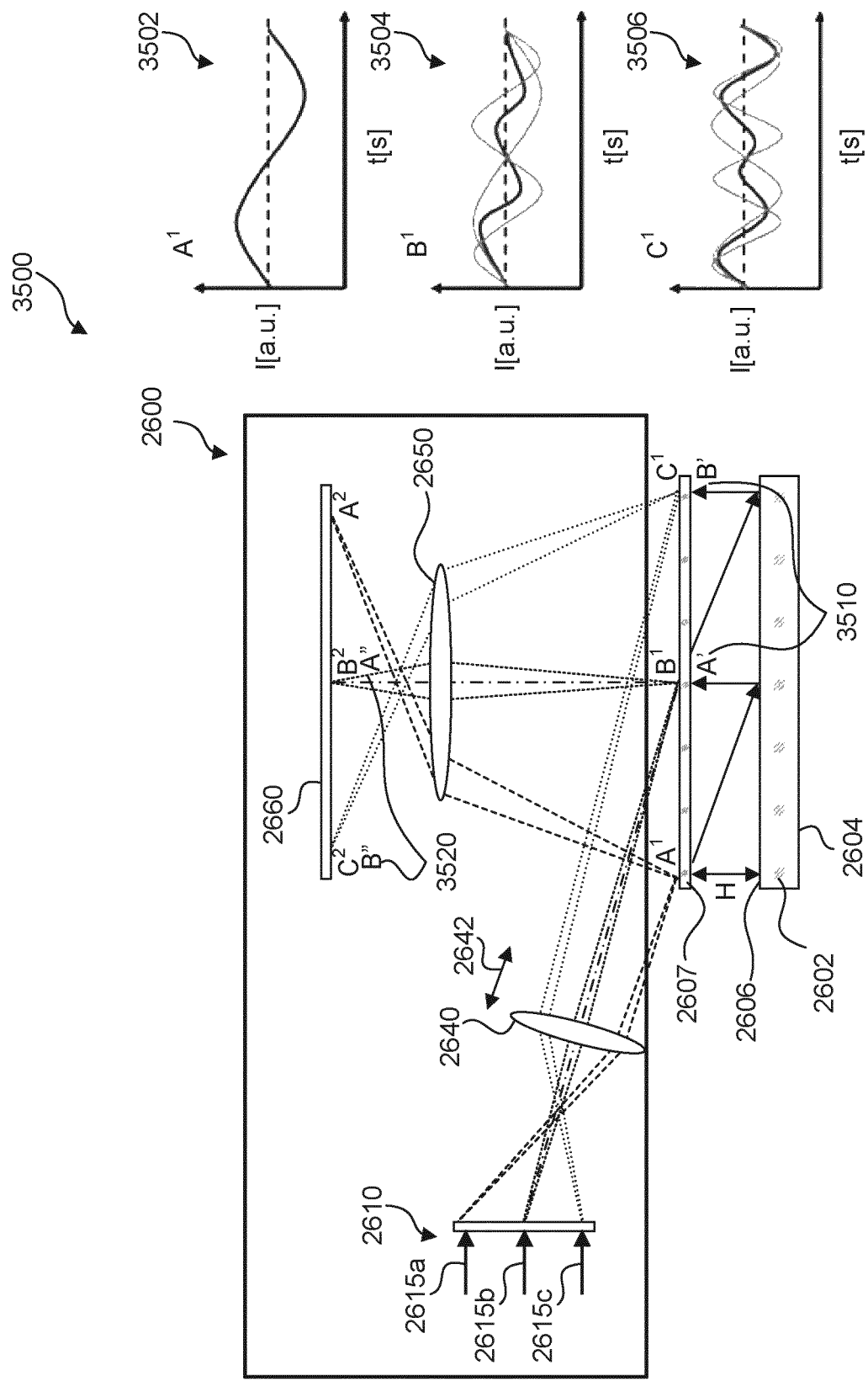

FIG. 35 is a schematic cross-sectional illustration of a FM inspection system, according to an exemplary embodiment.

Figure 36:
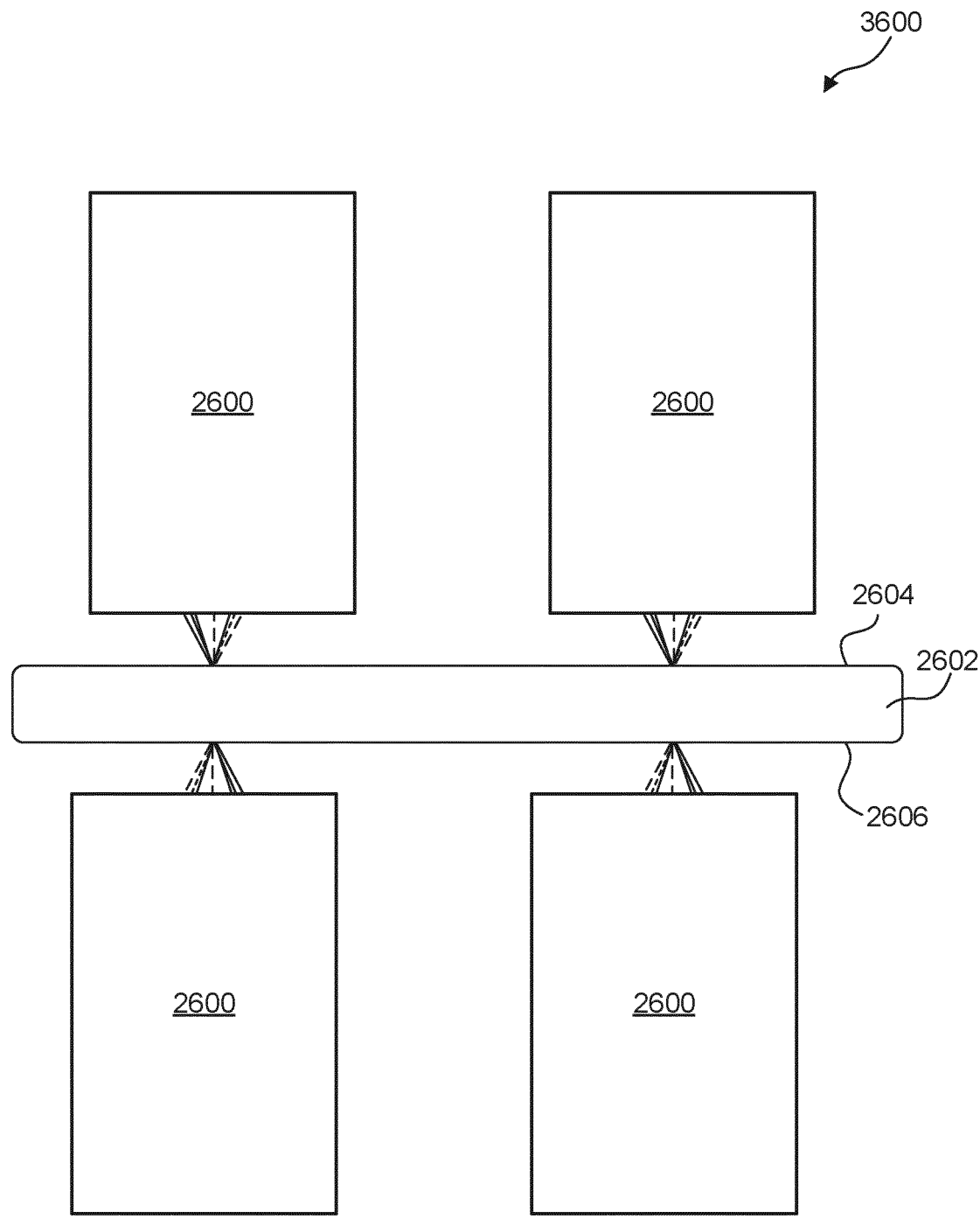

FIG. 36 is a schematic cross-sectional illustration of an inspection array system, according to an exemplary embodiment.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" can be used herein to indicate the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the present disclosure can be implemented in hardware, firmware, software, or any combination thereof. Embodiments of the present disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, non-transitory computer readable instructions, etc.

Before describing such embodiments in more detail, however, it is instructive to present an example environment in which embodiments of the present disclosure can be implemented.

Exemplary Lithographic Systems

Figure 1A:
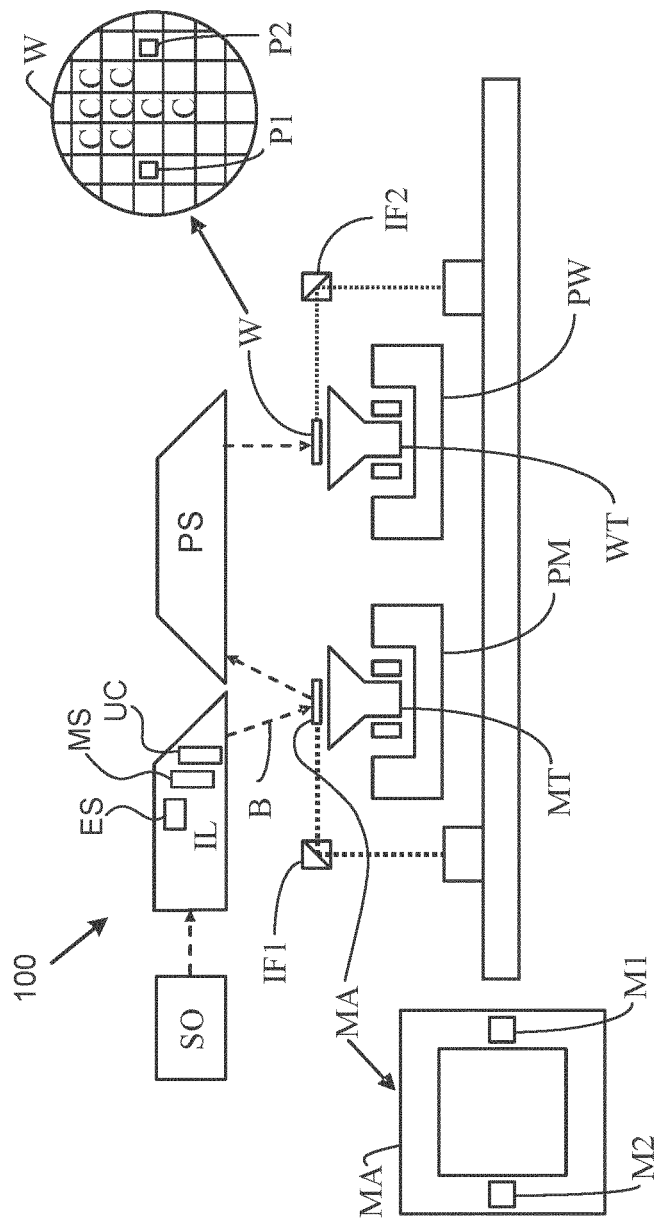
FIG. 1A shows a schematic of a reflective lithographic apparatus, according to an exemplary embodiment.
Figure 1B:
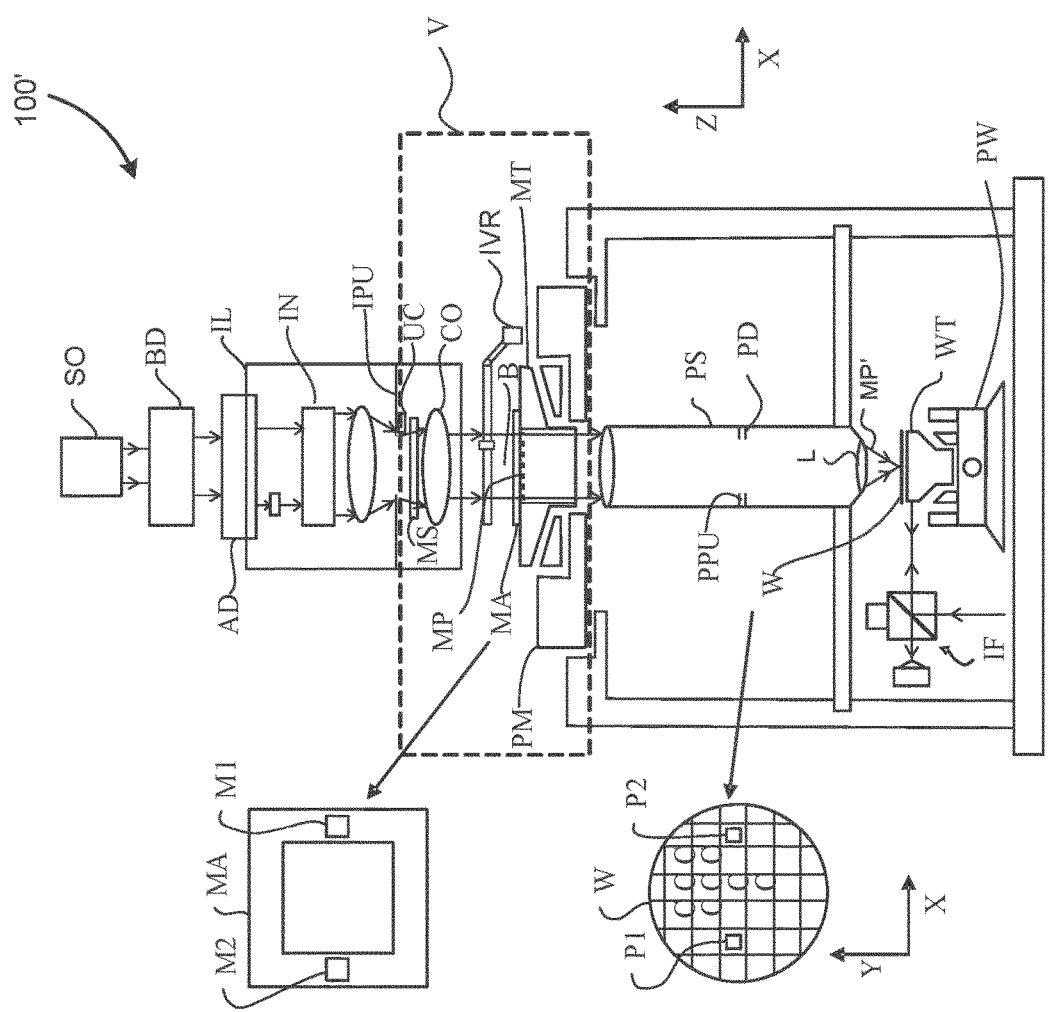
FIG. 1B shows a schematic of a transmissive lithographic apparatus, according to an exemplary embodiment.

FIGS. 1A and 1B show schematics of a lithographic apparatus 100 and lithographic apparatus 100', respectively, according to some embodiments. In some embodiments, lithographic apparatus 100 and lithographic apparatus 100' each include the following: an illumination system (illuminator) IL configured to condition a radiation beam B (for example, deep ultra violet or extreme ultra violet (EUV) radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. As will be further described herein, other configurations of the illuminator may be implemented to for improved illumination, and compactness of design.

Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In some embodiments, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

Lithographic apparatus 100' may include a patterning device transfer system. An example patterning device transfer system may be a patterning device exchange apparatus (V) including, for example, in-vacuum robot IVR, mask table MT, first positioner PM and other like components for transferring and positioning a patterning device. Patterning device exchange apparatus V may be configured to transfer patterning devices between a patterning device carrying container and a processing tool (e.g. lithographic apparatus 100').

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In some embodiments, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
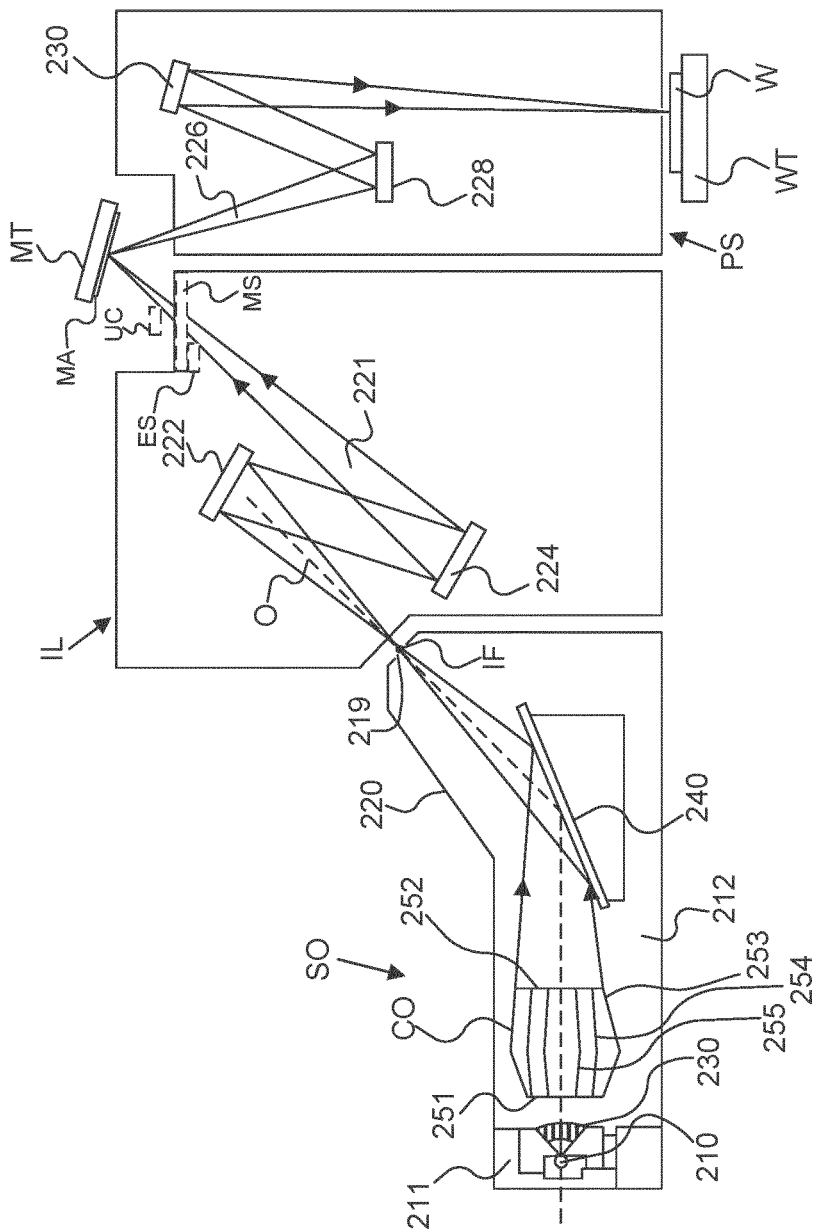
FIG. 2 shows a detailed schematic of a reflective lithographic apparatus, according to an exemplary embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis 0 and a collector optic CO of this type is preferably used in combination with a discharge produced plasma source, often called a DPP source.

Exemplary Lithographic Cell

Figure 3:
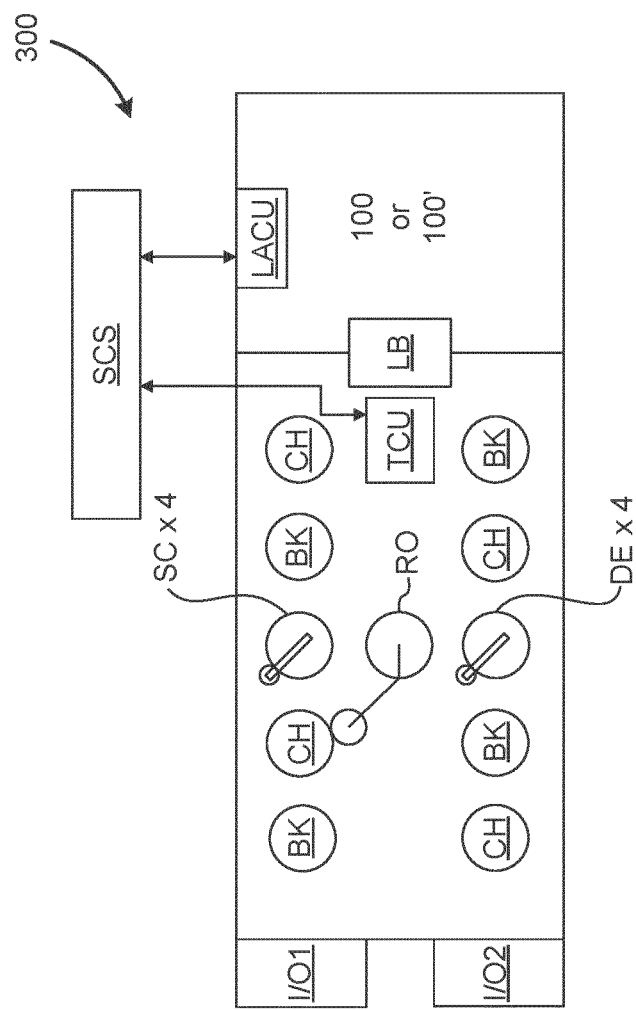
FIG. 3 shows a schematic of a lithographic cell, according to an exemplary embodiment.

FIG. 3 shows a schematic of a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Exemplary Metrology System

Figure 4:
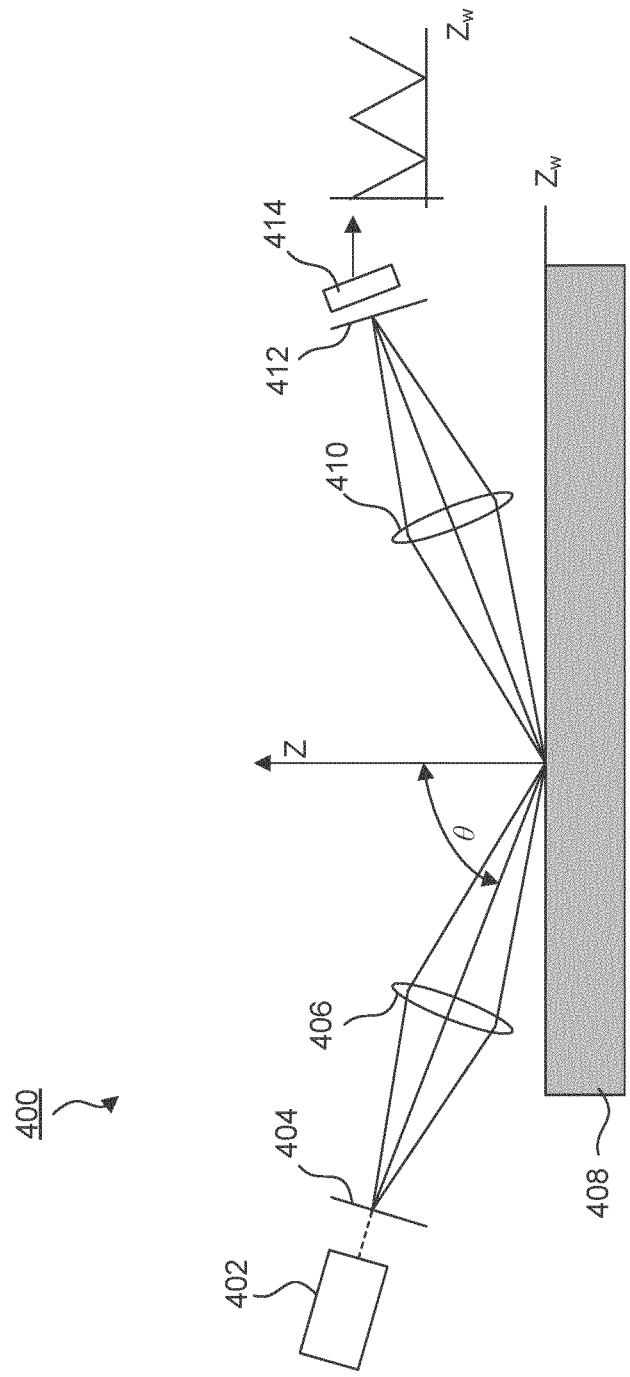
FIG. 4 shows a schematic of a metrology system, according to an exemplary embodiment.

FIG. 4 shows a schematic of a metrology system 400 that can be implemented as a part of lithographic apparatus 100 or 100', according to some embodiments. In some embodiments, metrology system 400 may be configured to measure height and height variations on a surface of substrate W. In some embodiments, metrology system 400 may be configured to detect positions of alignment marks on the substrate and to align the substrate with respect to the patterning device or other components of lithography apparatus 100 or 100' using the detected positions of the alignment marks.

In some embodiments, metrology system 400 may include a radiation source 402, a projection grating 404, a detection grating 412, and a detector 414. Radiation source 402 may be configured to provide an electromagnetic narrow band radiation beam having one or more passbands. In some embodiments, the one or more passbands may be within a spectrum of wavelengths between about 500 nm to about 900 nm. In another example, the one or more passbands may be discrete narrow passbands within a spectrum of wavelengths between about 500 nm to about 900 nm. In another example, radiation source 402 generates light within the ultraviolet (UV) spectrum of wavelengths between about 225 nm and 400 nm. Radiation source 402 may be further configured to provide one or more passbands having substantially constant center wavelength (CWL) values over a long period of time (e.g., over a lifetime of radiation source 402). Such configuration of radiation source 402 may help to prevent the shift of the actual CWL values from the desired CWL values, as discussed above, in current metrology systems. And, as a result, the use of constant CWL values may improve long-term stability and accuracy of metrology systems (e.g., metrology system 400) compared to the current metrology systems.

Projection grating 404 may be configured to receive the beam (or beams) of radiation generated from radiation source 402, and provide a projected image onto a surface of a substrate 408. Imaging optics 406 may be included between projection grating 404 and substrate 408, and may include one or more lenses, mirrors, gratings, etc. In some embodiments, imaging optics 406 is configured to focus the image projected from projection grating 404 onto the surface of substrate 408.

In some embodiments, projection grating 404 is imaged on the surface of substrate 408 at an angle θ relative to the surface normal. The image is reflected by the substrate surface and is re-imaged on detection grating 412. Detection grating 412 may be identical to projection grating 404. Imaging optics 410 may be included between substrate 408 and substrate detection grating 412, and may include one or more lenses, mirrors, gratings, etc. In some embodiments, imaging optics 410 is configured to focus the image reflected from the surface of substrate 408 onto detection grating 412. Due to the oblique incidence, a height variation ($Z_w$) in the surface of substrate 408 will shift the image projected by projection grating 404 when it is received by detection grating 412 over a distance (s) as given by the following equation (1):

$$s = 2Z_w \sin(\theta) \quad (1)$$

In some embodiments, the shifted image of projection grating 404 is partially transmitted by detection grating 412 and the transmitted intensity, which is a periodic function of the image shift. This shifted image is received and measured by detector 414. Detector 414 may include a photodiode or photodiode array. Other examples of detector 414 include a CCD array. In some embodiments, detector 414 may be designed to measure wafer height variations as low as 1 nm based on the received image. In some aspects, the system may operate without detection grating 412. In other aspects, detection grating 412 and projection grating 404 may have spatial frequency spanning a range from 0 to infinity (0 spatial frequency=cover glass).

Exemplary Embodiments of Particle Inspection System

Figure 5:
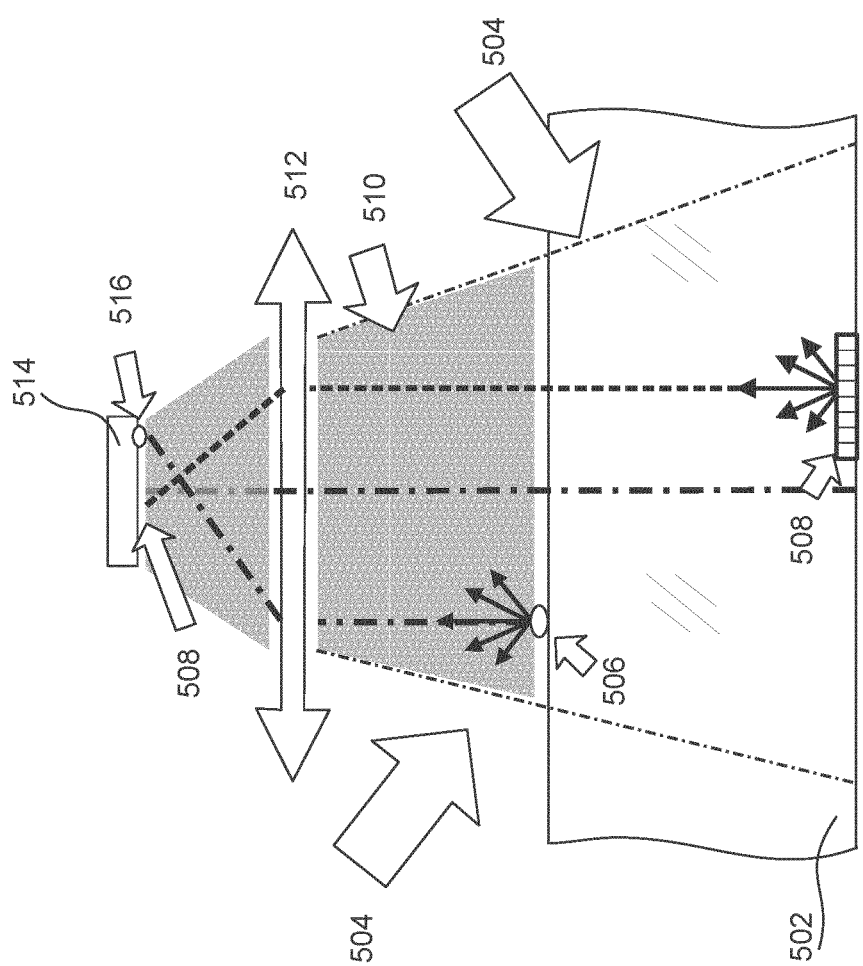
FIG. 5 shows a signal interference at a detector between signals reflected from a particle and signals reflected from a diffractive pattern, according to an exemplary embodiment.

FIG. 5 shows signal interference acquired at a detector between signals reflected from a particle and signals reflected from a diffractive pattern, according to some embodiments. Lithographic inspection systems are used to locate and determine a size of particles located on a lithographic patterning device. Due to optical properties of a lithographic patterning device, pellicle and lithographic patterning device patterns, combined with quality, repeatability, and detection probability requirements, particle detection systems need to meet stringent demanding technical requirements. Among those requirements, two critical parameters need to be addressed: accuracy and precision of particle size measurement, and achievement of a low rate of false positive detections. Several solutions are under consideration in the industry to improve the precision and accuracy of particle size measurement, however, such solutions (e.g., optical systems based on parallax and intensity based image analysis systems) may not provide sufficient attenuation of false positive rate.

In some aspects, there may be little control of how an illumination system can control how illumination light penetrates a lithographic patterning device, and pellicle-pattern cavity. For example, as illustrated in FIG. 5, a lithographic patterning device 502 receives flood illumination 504 for inspection purposes to inspect the existence of a particle 506 on a surface of the lithographic patterning device. Light entering lithographic patterning device 502 also reaches a diffractive pattern 508 on a front side of the lithographic patterning device and is reflected back through an imaging system acceptance cone 510 and enters the imaging system 512. Accordingly, a detector 514 within imaging system 512 can receive an image of a particle 506 (indicating contamination) and/or an image 518 created by diffractive pattern 508. In some systems, a large angle between illumination and observation optical axes may make it highly probable that illumination beam that irradiates the diffractive pattern and light diffracted from it after reflection from the back surface of the lithographic is ultimately redirected into imaging system 512 and detected as a presence of a contaminant (false positive). Given the nature of the inspection systems and the space constraints, fixed illumination schemes can be used, and systems may operate in a wavelength range in which a surface investigated for particle presence is opaque or its transmission is low enough to attenuate a diffractive pattern signal to background level in order to minimize probability of the error of false positives. Accordingly, in one aspect, FIG. 5 illustrates a particle 506 that may be located on a glass side of reticle 502, and a diffractive structure (pattern) 508 that may be located on a front side of reticle 502.

In some embodiments, data collection and analysis can reduce probability of false positive detections. Accordingly, as will be further described herein, embodiments of the present disclosure address can eliminate the interference resulting from unwanted illumination of a diffraction pattern and subsequent reflection of that pattern being received at an imaging system. Some embodiments include illuminating a plurality of regions of interest (ROI) within a lithographic patterning device, processing ROI images for only one side of the lithographic patterning device, and stitching the plurality of ROI images into a singular composite image.

FIG. 6 illustrates an illumination methodology where one region of interest is irradiated at a time, according to some embodiments. In this example, a flexible spatio-temporal illumination system is used, such that the illumination system is capable of selective illumination of arbitrary areas (e.g., ROIs) within a field of view (FOV) of a detection system. Such illumination system can be constructed using, e.g., an optical system with intermediate image plane. In order to spatially alternate an amplitude of light in the image plane, a light modulating element can be placed in the intermediate image plane. An example of a light modulating element feasible to achieve this may be a liquid crystal display (LCD) module, a digital micro mirror device module (DMD), a patterned glass plate, a movable aperture, and the like. Accordingly, the light modulating element may be externally controlled or be a static exchangeable element leveraging absorptive and/or reflective properties of passive/active components.

In FIG. 6, an example illumination methodology is illustrated. For example, a portion of the field of view (FOV) of the detection system is illuminated at any given time in order to minimize illuminated area of the target. This can reduce the probability of false positive detections. In one aspect, to image an entire FOV of a detection system, a series of images covering small sub-regions of the FOV called regions of interest (ROI) are irradiated by the illumination system. Accordingly, an imaging system within the inspection system (e.g., imaging system 512) can acquire multiple pictures with partially illuminated FOV and later combine them electronically into the image. This combination may also be referred to as stitching. For example, in FIG. 6 imaging system may have a FOV 602, and four subsequently acquired images 604, 606, 608, and 610 with partially illuminated area (ROI) (marked in gray) are acquired and combined into one composite image of an entire FOV 612. In some embodiments, an ROI portion of each image may be extracted and combined into stitched full field image 612 covering the entire FOV of the detection system.

In some embodiments, using a DMD device or an LCD device allows for electronic control of the ROI including control of the position and the size of the ROI. Moreover, ROIs can have arbitrary shapes and their position(s) do not have to follow a left-to-right pattern depicted in FIG. 6. Moreover, the sizes and shapes illustrated herein are mere illustrations of one exemplary implementation of the ROIs. It can be understood that ROIs can take on different sizes and shapes, and that subsequent ROIs can be different shapes. Moreover, ROIs may partially overlap and have irregular shapes. Additionally, while composite image 612 is described as covering an entire FOV of a detection system, it can be understood that portions of the FOV may also be covered and that a stitched composite may cover a portion of the FOV.

FIG. 7 illustrates an order of operations to reconstruct a composite image from subsequently acquired region of interest images, according to some embodiments. In FIG. 7, illumination spots 702 are illuminated and processed as regions of interest. Each illuminated image FOV 704 includes one region of interest 706 and the remaining FOV. In one aspect, since only the ROI is needed, the remaining data relating to the other portions of the FOV 708 may be discarded. Thus allowing for the collection of each illuminated ROI 1-n that is then stitched in a composite image 710. In some aspects, discarding data from non-ROI area (pixels) may provide added benefits, such as maximizing data bandwidth by efficiently using the data bus to only transfer information relating to ROI pixels.

The position of the ROI may be electronically controlled. A camera with a large field of view may be positioned such that multiple ROIs are located within its FOV. In one aspect, during image acquisition multiple full field images with ROIs in different locations are acquired (e.g., 702a, 702b, 702c). Post processing may be performed to either extract data related to the ROI or block data relating to the remaining FOV. Once a composite image 710 is stitched together, it is then ready to be processed for particle detection.

In some embodiments, while the present method may require the taking of multiple images (n images to be stitched together to create a composite image), it may provide higher accuracy in detection of contaminants as will be further described herein. To make up for any delayed processing due to the taking of additional images, a high speed image sensor may be utilized. Moreover, the processing may utilize field-programmable gate array (FPGA) that can act as a "gate keeper" to keep out data not related to the ROI being processed. As such, the FPGA may save the pixel data within the specified ROI and all other data may be discarded (or not written into memory). Moreover, such processing can be done in real time as fast as the image sensor can readout the image data, and then a CPU can process only the complete (stitched) image.

FIG. 8 illustrates a schematic of a data acquisition pro-processing pipeline, according to some embodiments. Imaging device 802 may collect image data relating to the entire FOV of the imaging device (or detector device within an imaging system). An FPGA 804 may be pre-programmed to process or collect pixel data pertaining to a region of interest. This may be a particular region of interest or a series of ROIs covering part or all of the FOV. As previously noted, FPGA 804 may be programmed to select ROI data for processing, or, for more efficient processing, simply be programmed to reject or discard pixel data not related to the ROI in question. After collecting the requisite pixel data for a predetermined number of ROIs, FPGA 804 may stitch the composite image 710.

FIGS. 9A-9C illustrate a schematic of an illumination and observation system in a cross-section of a region of interest illustration (ROI), according to some embodiments. FIG. 9A illustrates a simplified illustration of the illumination and observation systems. In FIG. 9, an illumination beam 908 is incident on lithographic patterning device 902 (e.g., reticle) at an angle R. A detector, such as a camera, may have a field of view 920 that receives light reflected off surfaces of lithographic patterning device 902. Such reflections may include reflections 922 off a first surface (e.g. glass surface or back surface 910), where a contaminant/particle may be found, and other reflections 924 off a second surface 930 (e.g., a front surface where lithographic pattern 904 may be found). As a result, a detector may receive multiple reflections that include interfering stray light (e.g., stray light 924). This may cause a false positive detection in which a detector may determine that a particle is present, when it is not, or a case of falsely detecting multiple particles.

Accordingly, it is desirable to divide the field of view (FOV) of the detector into regions of interest (ROI) 926 and to separately illuminate each ROI by illumination beam 908. By segmenting a FOV into different ROIs and illuminating the respective ROIs separately, reflections off other surfaces of the lithographic patterning device (e.g., surface 930 where pattern 904 resides) may be avoided. For example, this implementation avoids the illumination of portion 928

(which would typically be illuminated under direct illumination). By doing so, a detector would not receive stray light from section 928 at the ROI. Rather, potential interfering reflections may be directed towards other portions of the FOV outside of the ROI reflections. The detector can then be programed to process reflections corresponding only to the ROI as will be further described herein.

As noted herein, illuminating an entire lithographic patterning device can be problematic because light reflected from a pattern on a front side of the lithographic patterning device may be viewed by the imaging system detector and accounted for causing false positive detections. Stray light may be considered as all unwanted light that enters the detection system. Since light from the diffractive pattern (e.g., 904) is unwanted, it may be classified as stray light. This stray light may translate to a false positive indication that a particle/contaminant is present on the surface of the lithographic patterning device.

In some aspect, despite advancements in particle detection tools that determine particle location and size, they may not have provided sufficient advancements in the reduction of false positives. Some remedial measures may be taken, including use of different wavelengths or signal amplitudes to reduce the effect of the stray light signal (e.g. the reflected signal of a diffraction pattern on the front side of the lithographic patterning device). According to some embodiments, for single band illumination system, lateral position of light reflected by a pattern, as observed by a camera, may be controlled by diffractive pattern properties (e.g., diffractive order exitance angel), wavelength, and angle of incidence of impinging radiation. Since diffractive effects are wavelength sensitive, one may distinguish between 'stray light' and light scattered/diffracted by a particle by analyzing images acquired using illumination with different spectral content. In images acquired using dissimilar spectral bands, position of particles may be constant and position of 'stray light' may exhibit wavelength dependence from detector perspective.

In some embodiments, elimination of any interference signal produced by an illuminated diffraction grating is desired. This may be done by identifying regions of interest (ROIs) that are illuminated separately and sequentially. Images of the ROIs are then processed and stitched to construct a composite image of all the ROIs together.

In one aspect, the ROI illumination can be used to illuminate a desired region of a first side (e.g., back side) of a lithographic patterning device, while eliminating an interference signal produced by an illumination reflection from the opposite side (e.g., front side) of the lithographic patterning device. This can allow the imaging device to process light reflected only from the ROI (at the illuminated back side) without interference from any reflected light from the front side.

In some embodiments, an illumination schematic resulting in reduced rate of false positive detections can be provided in a system comprised of an imaging system built from pixelated image detector combined with telecentric imaging system or an illumination system comprised of light engine coupled with a DMD module followed by a telecentric projection system.

As will be further described herein, two sided inspection may also be implemented in order to increase throughput and expedite inspection times. Accordingly, implementation 940 illustrates a two sided inspection where a back side and a pellicle side 942 may be inspected. Similarly to detection of contamination on surface 910, detection of pellicle surface 942 may produce stray light in identical scenarios where stray light may be reflected off a particle 944 and also off of pattern 904. Accordingly, detector FOV 920 and region of interest 926 configurations may be similarly applied in implementation 940.

FIG. 9B illustrates the general schematic of propagation of rays where only one ROI is simultaneously illuminated and observed by the imaging system, according to some embodiments.

In some embodiments, a collimated illumination beam impinges a back surface of reticle at an angle $\beta$. In one embodiment, lithographic patterning device 902 may have a diffractive pattern 904 at one side of the lithographic patterning device 902 (e.g., front side) and one or more particles on an opposite side of lithographic patterning device 902 (e.g., back side). Lithographic patterning device 902 may receive illumination beam 908 at angle $\beta$. Imaging optics (not shown), such as imaging system 512, may be placed perpendicular to the back surface (e.g., surface 910). Imaging system 512 may collect light from region 914 where the region of interest (ROI) is identified. In this regard, two separate regions are illuminated at two opposite sides of the lithographic patterning device. For example, here, region 914 is illuminated on the back side of lithographic patterning device 902, while region 916 is illuminated on the front side of lithographic patterning device 902. This ensures that region 918 is not illuminated. Using side illumination at an angle $\beta$ allows for the illumination of 916 and avoiding the illumination of 918, thus reducing/eliminating the interference of any light scattered/reflected from 918. In other words, interference is reduced by not illuminating the front side of the lithographic patterning device 902 because this eliminates any light reflected from the front side of the reticle at the region of interest 918. Effectively, the camera collects light from region of front side of the reticle marked with 918 (not illuminated) while illuminating region 916 of front side of the lithographic patterning device 902.

In some embodiments, in order to minimize the rate of false positive detections, observation and illumination systems angle ($\beta$) and a width of illuminated area 914 can be set in such a way that 916 and 918 will be mutually exclusive. In one aspect, for fixed area size w, increase of $\beta$ results in larger separation between 916 and 918. For small projection angles $\beta$ one has to adjust width of observed area w in order to ensure separation between 918 and 916. Additionally, a decrease of numerical apertures (NAs) of both systems can reduce 918 and 916, but for a cost of reduced resolution of the imaging system.

In one aspect, FPGA 804 may discard pixel data from areas 912, and stitch together a composite images made of only images captured within the ROI at area 914. In one aspect, a reticle depth (d) may indirectly control the width of 918, as width of 916 changes very slowly with increased (d). Accordingly, in one aspect, the reticle depth may be taken into account when determining dimensions of an ROI. For example, a thickness of the reticle (for back side inspection or front side inspect—pellicle to pattern distance—through illumination angle and projection/observation optics numerical aperture may define a width of the ROI (e.g. 914).

The present illustration of the system is but one exemplary embodiment, and one skilled in the art would appreciate that other modifications/configurations may be possible. In one example, assuming use of spectrally sensitive detector and illumination system capable of simultaneous illumination of arbitrary selected ROIs in separated spectral channels, imaging system 512 may acquire multiple ROI data simultaneously. This helps increase throughput of the system without incurring any delays.

Moreover, shapes of ROIs 1002 do not need to adhere to a specific predefined shape, as will be further discussed in FIG. 10. The ROIs shape, position and overlap may change between FOVs 1004 and can be, for example, dependent on a shape of target object. For example, it is envisioned that in case of deep ultraviolet (DUV) pellicle, an ROI shape in a location where membrane shape has highest gradient, ROI shape may be part of ellipsis due to limited depth of field (DOF) of imaging system and requirements to illuminate and observe area on pellicle and reticle that is mutually exclusive from the perspective of imaging system.

In one embodiment, a shape gradient of a pellicle may be controlled by thickness, mass and tension of the pellicle. During manufacturing, pellicles may be pre-tensioned and may have a surface sag not exceeding certain value specified by manufacturer, e.g., 0.5 mm, but other values may also be possible. In order to obtain information about size of a particle (e.g., particle 906), an imaging system may be required to have sufficient resolution to detect the size information. However, an increase of resolution of the imaging system may increase system NA (numerical aperture), and this may reduce a system's depth of focus $$\left(DOF = \frac{\lambda}{NA^2}\right).$$

Accordingly, as system with resolution on the order of single micrometers will have DOF— few micrometers Taking into account that a shape of a pellicle may be a three-dimensional complex curve that intersects with otherwise a plane surface of detector through imaging system, then sharply imaged (within DOF) portions of pellicle may form shapes other than the rectangles depicted in FIGS. 9A-9C. One such example may be curved shapes as depicted in 1002.

FIG. 9C illustrates an enlarged view of box 950 in FIG. 9B depicting projection of chief (dotted) and marginal (continuous) rays of illumination system 952 and observation system 954, according to some embodiments. As described herein, an object of the present disclosure is to illuminate a region of a lithographic pattering device on a first surface (e.g. back surface) that is different from an illuminated region on a second surface (e.g., front surface). By not illuminating the front surface at the same location where the back surface is illuminated, stray light reflecting off a pattern found at the front surface may be reduced or eliminated. According to one aspect, in order to avoid an overlap between illumination and observation systems, the marginal rays of each system need not intersect on the front side of the reticle 930, creating two mutually exclusive regions 916 and 918 respectively.

FIG. 11A illustrates an opto-mechanical schematic of a system enabling high-resolution imaging of an entire lithographic patterning device using multiple regions of interest, according to some embodiments.

Due to continuous reduction of size of printed features, there is a need to detect particles with sizes on the level of single micrometers. In order to provide proper sizing of particles independent from its scattering and reflection properties, the following imaging approach may be utilized. To achieve required resolution in the object space imaging systems with sufficient NA need to be used. Most of commercially available detectors come in form factor which follows the photographic camera detector standard. In one aspect, detectors can be 24×36 mm with small format film frame that, combined with resolution measured in tens of megapixels, results in 1.5-10 μm size of an individual photosensitive area. Since camera pixels are typically larger than smallest particles that need to be detected, systems with magnification larger than 1× can be used. This, combined with typical size of detector, means that FOV of typical imaging system is few times smaller than size of a lithographic patterning device. In order to image entire reticle/pellicle, a scanning or stepping system can be used. Accordingly, the following imaging system is proposed: a combination of: SUB-FIELD-OF-VIEW illumination strategy (ROI+stitching); and Illumination strategy to minimize rate of false positive reading.

Combined with XYZ relative scanning between reticle/pellicle and illumination and observation systems that allows inspection of entire surface of reticle/pellicle. Example embodiments of such a system is schematically depicted in FIG. 11A, which illustrates the operation of this proposed imaging system.

In one aspect, relative XYZ position between lithographic patterning device, illumination, and imaging systems is controlled by means of mechanical actuator(s). For example, a lithographic patterning device 1102 may be placed on XYZ stage 1104, and illumination and observations systems 1106 and 1108 respectively, are fixed. The FOV of imaging system covers a small region of lithographic patterning device 1102 and is schematically depicted in FIG. 11 as 1110. Within each FOV multiple ROI images 1112 can be acquired. Each ROI image can have small region 1112 irradiated by illumination system. Multiple ROI can be combined using methods described above to form composite or stitched image of FOV. In one aspect, reticle is actuated and image acquisition process is repeated. Combined FOVs can be used to detect particles.

In some examples, the entire lithographic patterning device or only portions of it can be scanned. Moreover, an ROI and a FOV can overlap or be mutually exclusive depending on specific application needs. In some aspects, mutually exclusive ROIs and FOVs contribute to increased productivity (e.g. reduced measurement time=higher throughput.) Additionally, overlapping ROIs and FOVs may be used to improve stitching, as particles observed in two data sets may be used to compensate for system imperfections like vibration related image shifts, stage accuracy, and the like. In one aspect, combined ROIs do not have to cover an entire FOV. Given a detector size and magnification of optical system, size of a FOV can be calculated. For example, if DX and DY are the width and height of the FOV respectively. Given reticle width $w_{reticle}$ and height $h_{reticle}$, one may calculate a number of FOV in x direction as follows:

$$\text{INT}\left(\frac{DX}{Wreticle}\right)$$

Where: INT is the rounding operation towards positive infinity, and similarly, $$\text{INT}\left(\frac{Dy}{hreticle}\right)$$

Where: INT is the rounding operation towards positive infinity.

In one aspect, a system illuminates different areas of a front side of the lithographic patterning device and a back side of the lithographic patterning device using ROI illumination, which can reduce the rate of false positive detections. This may help reduce delays in the inspection process by searching for contamination that may not exist, or misidentifying where a contamination is location. In one aspect, illuminating with arbitrary selected irradiance levels and acquiring high dynamic range (HDR) data using a camera and/or projector. In one aspect, the flexibility regarding the stitching algorithm in regard to selection of shape of overlap area, specifically for ROIs may have individually controllable shapes and overlap area can be controlled by the ability to electronically control the position of the illuminated area.

FIG. 11B illustrates an inspection method 1100, according to some embodiments. It should be understood that the operations shown in method 1100 are not exhaustive and that other operations can be performed as well before, after, or between any of the illustrated operations. In various embodiments of the present disclosure, the operations of method 1000 can be performed in a different order and/or vary or with different devices than those described as exemplary.

Operation 1112 comprises generating, with a radiation source (e.g., radiation source 802), a beam of radiation to irradiate a first surface of an object, a first parameter of the beam defining a region of the first surface of the object. In this regard, the first region may be region 914 located at the back side of lithographic patterning device 910.

Operation 1114 comprises irradiating a second surface of the object, a second parameter of the beam defining a region of the second surface, wherein the second surface is at a different depth level within the object than the first surface. In this regard, the second region may be 916 located at the front side of lithographic pattering device 910. In one example, a system may include one camera and at least one illumination unit used to measure particles located on a surface of the reticle. Accordingly, as described herein, stray light reflected from a pattern on a different surface of the reticle may be acquired by the detector and thus, would cause a false positive detection. According to embodiments of the present disclosure, such stray light is processed in a manger so as to not interfere with light reflected from the particle found on the surface of the reticle.

Operation 1116 comprises defining a field of view (FOV) of the detector. This field of view may be field of view 602 that the detector can capture at any given moment in time when imaging the lithographic patterning device (e.g. object). Moreover, this FOV captured by the detector may be of the back side of the object, and including the region 914 for example.

Operation 1118 comprises receiving, at the detector, radiation from the first region of the first surface. This may be receiving scattered light scattered by particles or contaminants found on the back side of lithographic patterning device 910.

Operation 1120 comprises discarding, with processing circuitry (e.g., CPU 806), image data not received from the region of the first surface. In this regard, as described herein, in order to minimize or eliminate false positive errors or interference from reflections of objects that are not at the back surface of the lithographic patterning device, and specifically, at the irradiated ROI, the operation may discard any other data received that is not identified as being part of the ROI image data. For example, in FIG. 9, areas 914 and 916 are irradiated, while area 918 is not. Accordingly, a detector may radiation received from area 914 and 916. However, based on this operation, the radiation received from area 916 will be blocked. For example, FPGA 804 may receive coordinate data of the ROI being irradiated, and may act as a gate keeper by either processing data from those coordinates, or block any other data not from those coordinates.

Operation 1122 comprises constructing, a composite image comprising the image data from across the region of the first surface. In this regard, with each processed ROI, processor 804 may stitch together all image data of each respective ROI, and create a composite image comprising all the processed ROI data. This illumination technique of ROIs, as described herein, allows for the extraction of data from a back surface of a lithographic patterning device, while eliminating interference signals from patterns and other objects placed at the front surface of the lithographic patterning device. Moreover, according to some aspects, the stitched image as a whole may now be clear of such interference and portray a more accurate representation of contaminants/particles found at the back surface of the lithographic patterning device.

In some embodiments, there can be an irradiating operation with the radiation source, a second region on the first surface of the object; and receiving, at the detector, radiation scattered at the second region on the first surface.

In some embodiments, there may be a processing operation, with the processing circuitry, image data received from the second region on the first surface; and discarding image data received from any other region within the FOV.

In some embodiments, there may be a constructing operation, with the processing circuitry, a composite image comprising image data from the first region on the first surface and image data from the second region on the first surface. The ROIs may be sequentially irradiated (i.e. irradiating two or more regions of the first surface), the two or more regions encompassing the FOV.

In some embodiments, there may be a constructing a composite image operation corresponding to the FOV.

In some embodiments, there may be a determining operation, from the composite image, whether a particle is located within the FOV at the first surface of the object.

Region 918 may be described as a third region of the second surface that is defined as having a location corresponding to a location of the first region when viewed from the detector is not irradiated when the first region is irradiated. Here, the third region may be adjacent the second region, and the third region and the second region do not overlap.

In some embodiments, the width of the beam may be defined by two irradiation light cones (encompassing area 908), each cone including two marginal rays and one chief ray, and the width of ROI 914 may be defined by two observation light cones, each cone including two marginal rays and one chief ray. For example, in FIG. 9 the chief rays of the irradiation light cones and the chief rays of the observation light cones can intersect at the first surface of the object, and the marginal rays of the irradiation light cones and the marginal rays of the observation light cones may not intersect at the second surface of the object.

FIG. 12 illustrates an opto-mechanical schematic of particle detection system 1200 according to some embodiments. In one aspect, these systems will utilize high-resolution imaging system positioned perpendicularly to a lithographic patterning device/pellicle surface to inspect it for contamination as described herein. In one aspect, physical limitations of image detector(s) and imaging optics may result in the field of view (FOV) of the system being either reticle/pellicle or observation-illumination system that is actuated to enable acquisition of images at arbitrary selected locations. An area of target (reticle/pellicle) covered by the imaging system can be called FOV (Field Of View) and series of FOVs distributed across target object will be sequential images. It is desirable to have an area illuminated by projector be equivalent to an area imaged by the camera field of view (FOV). In a case where either one is smaller than the other, the smallest area may define the system FOV.

In some embodiments, system 1200 includes an imaging system 1202 including an image detector 1204 and an imaging lens 1206. Imaging system 1202 also includes an optical axis 1208 that is perpendicular to a reticle/pellicle surface 1210. System 1200 may also include illumination system 1212 including a light engine 1214 and a projection lens 1216. System 1200 illustrates different areas covered by different systems and their intersections. For example, in some aspects, system 1200 defines area 1218 on reticle/pellicle surface 1210 that is an area illuminated by illumination system 1212. In some aspects, system 1200 also defines an area 1220 that is covered by imaging lens 1206 and includes area 1222 that is a field of view (FOV) of image detector 1204. It can be understood from various embodiments of the present disclosure that the FOV may be adjustable, and may include one or more regions of interest (ROI).

FIG. 13 illustrates a gird of rectangular fields of view 1300 covering an entire surface of a lithographic patterning device 1302, according to some embodiments. In one aspect, the shape of a FOV and/or a ROI within the FOV may depend on different factors, and may not always be uniform across an entire lithographic patterning device. Accordingly, the organization, shape, count, and coverage of FOV may be configuration and application dependent and may differ between reticle(s) and pellicle(s). In some aspects, grid 1300 may be divided into M×N FOVs 1304. Each FOV 1304 may be divided into several ROIs that may be illuminated separately. The ROIs may also be illuminated sequentially, as further illustrated in FIG. 14.

FIG. 14 illustrates a radiation operation 1400 of different areas within a camera field of view (FOV) that are irradiated on a lithographic patterning device 1402, according to some embodiments. In some embodiments, to provide conditions to minimize rate of false positive detections, a series of N images may be recorded in each FOV. In the example provided in FIG. 14, a series of 8 images taken at times t0 to t7 are recorded. Here, eight sub-aperture ROIs (ROI1-ROI8) are stitched together to form a composite image, which depicts entire field of view (FOV X,Y 1404). As previously noted, ROIs do not have be rectangular nor have to cover the entire FOV. According to some embodiments, radiation operation 1400 may begin by illuminating a first ROI 1406 within FOV 1404 at an initial time, to, then a second ROI 1408 at time t1, then a third ROI 1410 at t2, then 1412 at t3, then 1414 at t4, then 1416 at t5, then 1418 at t6, and final, 1420 at t7.

In some embodiments, during measurement, the imaging system iteratively acquires ROI images for each FOV. Organization, size and orientation of ROIs and FOVs is configurable and depends on opto-mechanical configuration parameters such as: lenses field coverage, detector size, magnification, angle between illumination and observation system, reticle material, illumination wavelength, and the like.

As illustrated in FIG. 15, according to some embodiments, minimization of rate of false positives is critical from perspective of system performance. For example, one may try to adjust an angle between optical axis of illumination and observation systems together with optimization of area and orientation of individual ROIs. In some embodiments, due to geometric relations between illumination, reticle and observation module, the area common between illumination and observation sub-systems can be imaged. In order to minimize an area irradiated by projection sub-system, a transformation between local coordinates of illumination system 1504 and local coordinates of imaging detector 1506 may be determined to precisely adjust size, position and orientation of area irradiated by illumination system onto lithographic patterning device 1502. For example, this can be done by finding transformation T which relates local coordinates of illumination system $(x',y',z')$ with local coordinates of image detector $(x,y,z)$.

Parameters of a transformation T can depend on a position and orientation of system components. In some embodiments, manual adjustment of area irradiated by illumination system can be performed. But in other embodiments, an operator independent method is performed in order to provide repeatable and objectively measurable results.

FIG. 16 illustrates a proposed calibration method 1600 to calibrate vertical coordinates 1602 and vertical coordinates 1604 of an observation-illumination system using sequences of projected gray code patterns, according to some embodiments. In some embodiments, an automated calibration procedure is used to identify a relation between local coordinates of observation and illumination systems. In some embodiments, illumination system irradiates measured surface with a series of patterns designed to create unique temporal intensity profile in each photosensitive element of image detector (e.g. 1606 and 1608). By analyzing intensity profile acquired by each pixel, a corresponding point in the illumination module may be identified. Thus by analyzing intensity acquired by camera photosensitive elements, calculation of the transformation matrix may be possible, which may bind local coordinate system of the camera with the local coordinate system of the illumination module.

In the example illustrated in FIG. 16, a computer controlled illumination system may be provided that is capable of generating a multitude of patterns. In some aspects, the illumination system may be constructed from controllable special light modulator (SLM), digital micro-mirror device (DMD), or by directly depositing pattern(s) on a substrate. In each of the considered embodiments, illumination system irradiates the surface with arbitrary selected pattern, such as patterns 1602 and 1604.

According to some embodiments, FIG. 16 shaded pixels depict non-illuminated pixels and non-shaded pixels depict illuminated pixels. By analyzing temporal distribution of intensity in pixels, a number of pixels encoded in dark (light off=0 bit) and light ON (1 bit) may be decoded. In some aspects, in order to encode 8 bits, 8 images would need to be acquired.

FIG. 17 illustrates temporal intensity profile acquired during calibration method 1600. Example decoding sequence is presented in FIG. 17 for 1606 ($1*t0+0*t1+0*t2+0*t3+1*t4=1*1+0*2+0*4+0*8+1*16=17$) & 1608 ($1*t0+0*t1+0*t2+1*t3+0*t4=1*1+0*2+0*4+1*8+0*16=9$). This works because each pixel of the projection system may have its own unique code number, and thus, by detecting the code numbers, coordinates x and y can be calculated of the projector in images acquired by a camera. Accordingly, this method allows for identification of x coordinates in set of n images and y coordinates in another sequence with pattern perpendicular to the first (e.g., horizontal and vertical orientation).

In one example, a projected pattern may be constructed in such a way that it creates unique temporal pattern in pixels 1606 and 1608 and allows for unique identification of horizontal coordinates. In order to perform calibration in vertical direction, a set of Gray codes is projected and recorded in sequence of images acquires at t0-t4. In some embodiments, the following patterns can be projected: Gray codes, Binary codes, Scanning 'pixel', Scanning lines, Regular one dimensional or two dimensional periodic patterns, Random patterns of sufficient length, Intensity codded patterns such as one-dimensional intensity ramps, Frequency modulated patterns, Spectrally modulated patterns (for case of spectrally sensitive projector), or the like.

In some embodiments, one pattern may be used to achieve the above-described goal. For example a two dimensional sinusoidal pattern can be projected by the illumination system. Such a pattern will have unique phase profile in x and y direction and thus will allow for unambiguous calculation of parameters of transformation T between camera and projector. Analysis of such a pattern may be performed in Fourier domain, where applying spatio-spectral operations, phase profiles of both sinusoidal distributions may be reconstructed, thus allowing relation between camera and projector local coordinate systems. In one embodiment, from the perspective of data analysis and overall reliability, a multi-image approach to calibration is preferred and is further described herein below.

Calibration between the imaging system and the projection system may be performed. In some embodiments, calibration may result in eliminating human input into a process of identification of correspondence between coordinates of illumination and observation sub-systems. This cane allow the system to be self-sufficient, more reliable, and can calibrate at a faster pace. Objective, quantitative calibration of illuminated area to match field of view of imaging detector can be achieved. Moreover, minimization of illuminated area, which in turn reduces rate of false positive detections, and automated diagnostic procedure based on proposed method can be developed to remotely and periodically check system status.

FIG. 18 illustrates a system configuration of an observation-illumination system 1800, according to some embodiments. The system configuration and associated method of observation-illumination system may rely on independent, parallel acquisition of images for particle identification purposes.

Decreasing dimensions of printed patterns may put stringent cleanliness requirements on lithographic machines and lithographic patterning device in general. In some embodiments, optical methods of identification of contamination(s) are used due to non-contact nature of light based measurement. In one aspect, resolution of an optical system is bound with wavelength and numerical aperture by Abbe formula: $d=\lambda/2NA$; where: d is the resolution, $\lambda$ is the wavelength, and NA is the system numerical aperture, and $NA=n\sin\alpha$.

In some embodiments, to build systems capable of detection of micrometric size particles, observation and illumination system with appropriate numerical aperture are designed. Increase of resolution of an imaging system may result in reduction of the field of view due to physical limitations of photodetectors and cost related factors (large NA, large FOV lenses can be not economical for particle identification purposes). Depending on spectral range, sensitivity and specific system requirements particle detection apparatus can be build using single photo-sensitive element (scanning systems) or pixelated Charge-coupled Device (CCD) or Complementary metal-oxide-semiconductor (CMOS) detectors (imaging systems).

In some embodiments, from the perspective of particle identification and sizing accuracy and repeatability, observation systems with large NA can be used. In some embodiments, throughput requirements favor optical systems with lower NA, which typically offer larger field coverage and thus typically have shorter measurement times. In order to meet these contradicting requirements of shorter inspection times at tightened sizing constraints, multiplication of the illumination-detection systems may be a viable alternative. Since there is a linear relation between measurement time and number of illumination-observation systems used, utilization of two or more imaging systems allows for two times the reduction of measurement time.

In one embodiment, patterns printed on lithographic patterning devices in unfavorable conditions may create images of real objects and light sources, which in general may be difficult to distinguish from particles and may contribute to elevated rates of false positive detections. Due to multiplication of the illumination-detection subsystems, the probability of false positive detections may increase because of light propagating within a reticle, reticle substrate, pellicle, or a gap between the reticle and pellicle. The following illustrates one exemplary solution that enables simultaneous imaging of a surface of a lithographic patterning device without increasing risk of false positive detections.

FIG. 18 illustrates a system configuration of an observation-illumination system with simultaneous illumination and measurement, according to some embodiments. In one aspect, spectrally separate observation systems 1802 and 1804 may be used in order to optically insulate them, and to allow substantially simultaneous measurement by at least two systems working in parallel without change of rate of errors relating to false positives.

In some embodiments, FIG. 18 illustrates a schematic of an imaging system 1800 operating using two imaging systems. Imaging system 1802 and imaging system 1804 are coupled to two illumination units 1806 and 1808, respectively. Imaging systems 1802 and 1804 may have their optical axis being normal to the surface of a lithographic patterning device 1810 and image portion of lithographic patterning device 1810 on their respective detectors. Illumination system paired with imaging system illuminates imaged area of lithographic patterning device 1810, and can provide conditions suitable for particle identification. System 1800 can utilize spectral filters (not shown) with mutually exclusive transmission bands, which are incorporated into optical trains of both imaging systems, and work in tandem with emission spectra of illumination units.

Example transmission characteristics for filters incorporated into observation systems 1802 and 1804 together with corresponding emission spectra of illuminations units are provided in FIG. 19. As illustrated, the emission bands for each system are located at different wavelengths ($\lambda$). In one aspect, the transmission spectra of filters incorporated into optical trains of observation systems 1802 and 1804 are set such that they only filter the respective emission wavelength. Since both systems can operate in different spectral ranges, their operation for perspective of detection of electromagnetic radiation is independent. In some embodiments, since light emitted by illumination system 1806 cannot be detected by observation system 1804 and vice versa, the rate of false positive errors is related to opto-mechanical configuration and specific properties of individual set of illumination-observation systems. In some aspect, to further minimize this error, the ROI illumination and stitching methodology may be implemented as described herein.

According to some aspects, to capture the emission spectra 1906 of illumination system 1806, a transmission filter 1902 may be applied at observation system 1802. Similarly, to capture the emission spectra 1908 of illumination system 1808, a transmission filter 1904 may be applied at observation system 1804.

In some embodiments, the illumination systems can utilize either narrow band light sources, such as LED diode(s) or laser(s) or can utilize broad-band light sources coupled with narrow band/band-pass filters in order to illuminate a surface with electromagnetic radiation in the spectral range required. The illumination systems can either utilize narrow-band, long/short pass filters, or quantum efficiency of detectors to spectrally insulate any combination of systems working in parallel. The utilization of filters with FWHM (Full Width Half Maximum) matching emission characteristic of light source may be advantageous for signal to noise ratio processing. In some aspects, if a filter is used with spectral transmission characteristics that match diode emission (e.g., filter transmission is wider than diode emission), then light emitted by the diode may pass, and the detected signal and S/N ratio are high. Alternatively, a band-pass filter may have a pass-band that only partially overlap with diode emission band, and as a result, only small portion of light emitted by the diode may reach the object surface. Accordingly, the signal will have a decreased S/N ratio profile.

In some embodiments, the implementation illustrated in FIGS. 18 and 19 can allow for independent, parallel acquisition of data using multiple illumination-observation systems. In some aspects, using the proposed spectrally-separated illumination-observation strategy, imaging systems may be optically insulated. In some embodiments, such optical insulation provides: (1) unobstructed acquisition of data using multiple systems running in parallel; (2) cross-talk between illumination-observation systems is eliminated; (3) rate of false positive errors are confined within respective systems, and does not change with increased number of systems running in parallel; and (4) multiple systems running in parallel may share FOV, and may simultaneously acquire different types of information, e.g. with observation system separated into two channels by e.g. beamsplitter, illumination system may irradiate object from two directions using mutually separated spectral channels. This can allow for acquisition of data that will help delineate between images and particles due to achromatic character of scattering and wavelength and direction dependence of diffraction phenomena. This is further illustrated in FIGS. 20 and 21.

FIG. 20 illustrates a case of imaging system built using a pair of panchromatically sensitive imaging detectors 2002 and 2004 separated by dichroic beam splitter 2006 receiving radiation through imaging lens 2008, according to some embodiments. System 2000 may further include illumination source 2010 irradiating area 2012 at a first wavelength $\lambda 1$, and illumination source 2012, irradiating area 2014 at a second wavelength $\lambda 2$. According to some aspects, imaging lens 2008 reads an image corresponding to image area 2016. As previously noted, the illuminations and detections may be performed with respect to lithographic patterning device 2018. The setup of system 2000 can reduce number of equipment used and the space occupied by detection sensors.

In FIG. 21, system 2100 constitutes the same illumination set up as that of system 2000 in FIG. 20. However, system 2100 may include a spectrally sensitive (color) detector 2102. According to some aspects, detector 2102 may be configured to detect a range of colors within the color spectrum and be able to differentiate between illuminations from illumination source 2010 and illumination source 2014.

FIG. 22 illustrates a configuration of an illumination-detection system, according to some embodiments. The schematic of inspection system 2200 may be configured to perform simultaneous measurements on both sides of a lithographic patterning device. According to some embodiments, two systems working in parallel on each side (e.g., systems 2202 and 2204 on one side, and 2206 and 2208 on the other side) of test object are depicted, although the number may vary. Accordingly, it may be recognized that any number of measurement systems can be configured to perform the measurements on either side.

FIG. 23 illustrates example emission spectra of light sources incorporated into illumination system according to some embodiments. Similar to FIG. 19, FIG. 23 may illustrate the light source emissions 2302 of the light sources of FIG. 22 and their corresponding observation filters 2304. As noted previously, the emission spectra of the light sources may be incorporated into the illumination systems.

While independent illumination-detection systems are described herein, this is but an example of possible implementations to address the increase in throughput of inspection processing without increasing the resulting incidents of false positive detection. It may be possible to construct a system which uses spectral separation to acquire simultaneously imaging data obtained from different opto-mechanical configurations. For example, it would be possible to build a particle detection system which uses a dichroic beamsplitter to enable simultaneous observation of the field of view by two detectors and use two spectrally separated illumination units to illuminate measured sample from two directions. Since scattering of light by particles can be treated as achromatic and illumination direction independent, and appearance of images created by diffractive patterns embedded on a lithographic patterning device has strong angular and spectral dependence, acquisition of two images at mutually separated spectral bands using different direction of illumination will significantly reduce rate of false positive detections, and will contribute to an improved performance of the system.

In yet another embodiment, polarization techniques may be utilized to reduce visibility of a diffractive pattern. This is because using a polarizer may reduce visibility of a particle, it is observed to reduce visibility of a diffractive pattern at a different rate. This further delineates between particle and pattern images detected at the detector and can enhance the processing of false positive detection. In other words, while not eliminating the false positive image all together, such polarization techniques described herein can have a greater effect on reflected pattern image than on a reflected particle image, thus, making the particle image stand out more at the detector, and therefore, enhancing the processing by allowing the detector to differentiate between the two signals.

FIG. 24 illustrates diffractive properties of a pattern portion 2402 of a lithographic patterning device, where electromagnetic radiation 2404 impinging the lithographic patterning device can be redirected to a detection system, according to some embodiments. Two border line cases may be considered: 0% of impinging light will be re-directed by a reticle pattern to detection system (e.g., as illustrated in FIG. 9); or 100% of light illuminating reticle pattern will be re-directed 2406 to the detection system. In the second case, it is beneficial to help the detector differentiate between a received light from a particle 2408 (contaminant) and received light from a pattern 2402.

According to some embodiments, polarization dependent diffraction efficiency of reticle pattern can be used to delineate between light reflected from particles and light reflected by reticle pattern. The diffraction efficiency (amount of light re-directed by diffractive structure in arbitrary selected direction) can depend from incidence angle, wavelength (λ), polarization of impinging radiation, and surface profile of diffractive structure. In some embodiments, utilizing this efficiency of diffractive gratings in direction of acceptance cone of imaging system is utilized. A detection system can approximate diffractive structure as polarization sensitive reflector, which reflection is dependent from polarization of impinging radiation. For example, as illustrated in FIG. 25, intensity of particle reflection image can be reduced when the light is polarized (2502 vs. 2504 for particle intensity 2506). For example, a 2× reduction can be achieved with installation of a linear polarizer. In other aspects, in the case of a pattern 2508, the polarized light intensity can be reduced by a magnitude of up to 15× after installation of a linear polarizer (e.g., 2510 vs. 2512).

In some embodiments, installation of linear polarizer decreases amount of light hitting reticle by 2×. Since light scattering by particles can be considered in the first approximation as polarization independent, visibility of particles will decrease 2x with installation of linear polarizer. In some aspects, since efficiency of diffractive structures is polarization dependent, visibility of reticle pattern can decrease by at least 2× with installation of linear polarizer (experimentally measured ~15× decrease). In some aspects, the decrease can additionally be in rate proportional to at least square of intensity transmission coefficient derived from Fresnel equations for given geometry of illumination system. In some embodiments, performance of arbitrary diffractive structure can be predicted analytically only by directly solving Maxwell equations as there is no simplified scalar model available.

In some embodiments, while in general light scattering by particles can be considered polarization independent, particles will scatter light in polarization dependent manner. Additionally, it is possible to design diffractive pattern which will have diffraction efficiency independent from polarization state of impinging light (optimized for incidence angle, etc . . . ). Accordingly, this may be one additional design consideration to control light properties in order to reduce the probability of false positive detections.

Exemplary Coaxial Inspection Systems

FIGS. 26-31 illustrate coaxial inspection system 2600, 2600', according to exemplary embodiments. Coaxial inspection system 2600 can be configured to illuminate and detect particles on a reticle and/or a pellicle with an adjustable yaw (off-axis) illumination angle in a single unit. Coaxial inspection system 2600 can be further configured to illuminate and detect particles with a structured light pattern and operate in a bright field mode or a dark field mode. Although coaxial inspection system 2600 is shown in FIG. 26 as a stand-alone apparatus and/or system, the embodiments of this disclosure can be used with other optical systems, such as, but not limited to, lithographic apparatus 100, 100', and/or other optical systems.

In some embodiments, coaxial inspection system 2600 can include a polarized optical system. For example, as shown in FIG. 31, coaxial inspection system 2600, 2600' can include a polarizing beamsplitter 2630, a linear polarizer 2632, and/or a quarter-wave plate 2634. In some embodiments, coaxial inspection system 2600 can utilize one or more amplitude modulated (AM) and/or frequency modulated (FM) structured light patterns 2615. For example, as shown in FIG. 34, coaxial inspection system 2600 can utilize first, second, and third AM structured light patterns 2615a, 2615b, 2615c.

As shown in FIG. 26, coaxial inspection system 2600 can include illumination system 2610, optical axis 2612, aperture stop 2620, beamsplitter 2630, focusing lens 2640, collecting lens 2650, detector 2660, and/or controller 2670. Coaxial inspection system 2600 can be configured to illuminate a reticle 2602 and/or a pellicle 2607 with an illumination beam 2614 and detect a signal beam 2616 scattered from reticle 2602 and/or pellicle 2607 (e.g., from a particle). In some embodiments, illumination system 2610, aperture stop 2620, beamsplitter 2630, focusing lens 2640, collecting lens 2650, and detector 2660 can be optically coaxial and aligned along optical axis 2612.

Reticle 2602 includes reticle backside 2604 (e.g., unpatterned) and reticle frontside 2606 (e.g., patterned). In some embodiments, reticle 2602 can include reticle actuator 2603 (e.g., XYZ translation stage) configured to provide adjustable translation relative to coaxial inspection system 2600. In some embodiments, all the above mentioned components of coaxial inspection system 2600 can be disposed within a single housing 2608, for example, with housing actuator 2609 configured to provide adjustable translation along optical axis 2612 relative to reticle 2602 and/or pellicle 2607 for focusing and defocusing illumination beam 2614 on reticle 2602 and/or pellicle 2607.

Illumination system 2610 can be configured to transmit illumination beam 2614 along optical axis 2612. Illumination system 2610 can include electro-optical illumination module 2611 configured to electronically control illumination beam 2614. For example, electro-optical illumination module 2611 can control and/or adjust a numerical aperture (NA) of illumination beam 2614 (e.g., NA=n·sin(θ), where θ is the maximal opening half-angle and sin(θ)≈D/2f, where D is the entrance pupil diameter and f is the focal length). In some embodiments, electro-optical illumination module 2611 can produce a structured light pattern 2615. For example, electro-optical illumination module 2611 can include a digital micromirror device (DMD), a liquid crystal modulator (LCM), a spatial light modulator (SLM), and/or some combination thereof to embed illumination beam 2614 with one or more structured light patterns 2615.

In some embodiments, illumination beam 2614 can include one or more structured light patterns 2615. For example, as shown in FIGS. 34 and 35, illumination beam 2614 can include one or more AM and/or FM structured light patterns 2615a, 2615b, 2615c. In some embodiments, structured light pattern 2615 can include AM and/or FM with a spatial frequency of less than 50 cycles/mm. For example, as shown in FIGS. 28 and 30, AM and/or FM can have a spatial frequency of less than 20 cycles/mm in order to approximate a non-apodized (e.g., 2806, 3006) modulation transfer function (MTF) distribution (e.g., less than 6% deviation for quarter disk aperture 2622, less than 2% deviation for crescent aperture 2626, etc.). In some embodiments, illumination beam 2614 can include a plurality of narrow spectral bands. For example, illumination beam 2614 can include a blue visible (VIS) spectral band (e.g., about 400 nm to 420 nm), a green VIS spectral band (e.g., about 520 nm to 540 nm), and/or a red VIS spectral band (e.g., about 620 nm to 640 nm).

Aperture stop 2620 can be configured to select a portion of illumination beam 2614. Aperture stop 2620 can include an apodized aperture (e.g., a radial graduated and/or tapered neutral density filter). In some embodiments, aperture stop 2620 can include a plurality of apodized apertures. For example, as shown in FIGS. 27 and 29, aperture stop 2620 can include apodized quarter disk aperture 2622 and/or apodized crescent aperture 2626.

As shown in FIG. 27, coaxial inspection system 2600 can include aperture stop 2620 with apodized quarter disk aperture 2622 and quarter disk mask 2624. Apodized quarter disk aperture 2622 can be configured to transmit a portion of illumination beam 2614 (e.g., structured light pattern 2615) and quarter disk mask 2624 (e.g., opaque) can be configured to block illumination beam 2614. In some embodiments, in a bright field mode (e.g., unblocked central illumination beam), apodized quarter disk aperture 2622 can be configured to transmit a central portion of illumination beam 2614 and provide an angularly insensitive off-axis illumination beam 2614 toward reticle 2602. For example, apodized quarter disk aperture 2622 can be rotated about optical axis 2612 (e.g., in 90 degree increments) to provide a bright field image of a region of interest (ROI) (e.g., particles) on reticle 2602. In some embodiments, multiple bright field images of ROIs can be taken at different illumination angles (e.g., via adjusting aperture stop 2620) and the multiple bright field images can be subsequently reconstructed and numerically stitched.

FIG. 28 is a plot 2800 of a MTF 2802 versus spatial frequency 2804 of coaxial inspection system 2600 shown in FIG. 27 (e.g., with quarter disk aperture 2622). MTF 2802 indicates how different spatial frequencies (e.g., cycles/mm) are handled by coaxial inspection system 2600. For example, MTF 2802 specifies a response to a periodic sine-wave pattern (e.g., at spatial frequency 2804) passing through apodized quarter disk aperture 2622 as a function of the pattern's spatial frequency (period) and orientation. As shown in FIG. 28, an MTF distribution of a non-apodized circular aperture 2806 (solid line) (e.g., NA=0.3 at λ=550 nm) can be compared to an MTF distribution of apodized quarter disk aperture 2622 (dashed line) (e.g., NA=0.1 at λ=550 nm). For example, below 20 cycles/mm (e.g., resolution of 50 μm), the response of apodized quarter disk aperture 2622 approximates a non-apodized circular aperture 2806 with less than a 6% deviation (error).

As shown in FIG. 29, coaxial inspection system 2600 can include aperture stop 2620 with apodized crescent aperture 2626 and crescent mask 2628. Apodized crescent aperture 2626 can be configured to transmit a portion of illumination beam 2614 (e.g., structured light pattern 2615) and crescent mask 2628 (e.g., opaque) can be configured to block illumination beam 2614. In some embodiments, in a dark field mode (e.g., blocked central illumination beam), apodized crescent aperture 2626 can be configured to block a central portion of illumination beam 2614 and provide an angularly sensitive off-axis illumination beam 2614 toward reticle 2602. For example, apodized crescent aperture 2626 can be rotated about optical axis 2612 (e.g., in 90 degree increments) to provide a dark field image of a ROI (e.g., particles) on reticle 2602. In some embodiments, multiple dark field images of ROIs can be taken at different illumination angles (e.g., via adjusting aperture stop 2620) and the multiple dark field images can be subsequently reconstructed and numerically stitched.

FIG. 30 is a plot 3000 of a MTF 3002 versus spatial frequency 3004 of coaxial inspection system 2600 shown in FIG. 30 (e.g., with crescent aperture 2626). MTF 3002 indicates how different spatial frequencies (e.g., cycles/mm) are handled by coaxial inspection system 2600. For example, MTF 3002 specifies a response to a periodic sine-wave pattern (e.g., at spatial frequency 3004) passing through apodized crescent aperture 2626 as a function of the pattern's spatial frequency (period) and orientation. As shown in FIG. 30, an MTF distribution of a non-apodized circular aperture 3006 (solid line) (e.g., NA=0.3 at λ=550 nm) can be compared to an MTF distribution of apodized crescent aperture 2626 (dashed line) (e.g., NA=0.1 at λ=550 nm). For example, below 20 cycles/mm (e.g., resolution of 50 μm), the response of apodized crescent aperture 2626 approximates a non-apodized circular aperture 3006 with less than a 2% deviation (error).

In some embodiments, aperture stop 2620 can include electro-optical aperture module 2621a. Electro-optical aperture module 2621a can be configured to control transmission of illumination beam 2614 through aperture stop 2620. For example, electro-optical aperture module 2621a can include one or more apodized apertures (e.g., apodized quarter disk aperture 2622, apodized crescent aperture 2626, etc.) capable of rotation and/or translation relative to optical axis 2612. In some embodiments, electro-optical aperture module 2621a can control transmission of illumination beam 2614 in three degrees of freedom. For example, electro-optical aperture module 2621a can control a radial extent, an angular extent, and/or an intensity of illumination beam 2614.

In some embodiments, aperture stop 2620 can include opto-mechanical aperture module 2621b. Opto-mechanical aperture module 2621b can be configured to control transmission of illumination beam 2614 through aperture stop 2620. For example, opto-mechanical aperture module 2621b can include a plurality of aperture masks (e.g., apodized quarter disk aperture 2622, apodized crescent aperture 2626, etc.). In some embodiments, the plurality of aperture masks can be used for different applications and/or measurements on reticle 2602 (e.g., sequential measurements).

In some embodiments, adjustment of illumination beam 2614 and/or aperture stop 2620 can provide multiple angles of illumination on reticle 2602. For example, a first adjustment of an NA of illumination beam 2614 (e.g., via electro-optical illumination module 2611) and a second adjustment of an NA of aperture stop 2620 (e.g., via electro-optical aperture module 2621a) can adjust a yaw (off-axis) illumination angle of illumination beam 2614 on reticle 2602.

In some embodiments, coaxial inspection system 2600 can operate in a bright field mode. For example, as shown in FIG. 27, apodized quarter disk aperture 2622 can be configured to transmit a central portion of illumination beam 2614 and provide an angularly insensitive (e.g., no angular extent) off-axis illumination beam 2614 toward reticle 2602. In some embodiments, coaxial inspection system 2600 can operate in a dark field mode. For example, as shown in FIG. 29, apodized crescent aperture 2626 can be configured to block a central portion of illumination beam 2614 and provide an angularly sensitive (e.g., with angular extent) off-axis illumination beam 2614 toward reticle 2602.

Beamsplitter 2630, focusing lens 2640, and collecting lens 2650 can be configured to transmit a selected portion of illumination beam 2614 (e.g., via aperture stop 2620) toward reticle 2602 and/or pellicle 2607 and transmit signal beam 2616 (e.g., from particles) scattered from reticle 2602 and/or pellicle 2607. In some embodiments, beamsplitter 2630, focusing lens 2640, and collecting lens 2650 can form an optical system. In some embodiments, beamsplitter 2630 can be a polarizing beamsplitter, for example, as shown in FIG. 31. In some embodiments, focusing lens 2640 and collecting lens 2650 can increase an intensity of signal beam 2616 (e.g., in a dark field mode). For example, an NA of focusing lens 2640 can be greater than an NA of collecting lens 2650.

Detector 2660 can be configured to detect signal beam 2616. For example, as shown in FIG. 26, collecting lens 2650 can focus signal beam 2616 onto detector 2660. Detector 2660 can be a charge-coupled device (CCD), complementary metal-oxide-semiconductor (CMOS), photodetector, photodiode, and/or any other opto-electronic device capable of detecting signal beam 2616. Controller 2670 can be configured to provide real-time feedback for image acquisition of signal beam 2616. For example, as shown in FIG. 26, controller 2670 can be coupled to illumination system 2610, aperture stop 2620, and/or detector 2660, for example, to receive signal beam 2616 and provide control signals to illumination system 2610, aperture stop 2620, and/or detector 2660 in real-time (e.g., less than about 0.1 seconds).

FIG. 31 is a schematic cross-sectional illustration of coaxial inspection system 2600', according to an exemplary embodiment. The embodiments of coaxial inspection system 2600 shown in FIGS. 26-30 and the embodiments of coaxial inspection system 2600' shown in FIG. 31 may be similar Similar reference numbers are used to indicate similar features of the embodiments of coaxial inspection system 2600 shown in FIGS. 26-30 and the similar features of the embodiments of coaxial inspection system 2600' shown in FIG. 31. One difference between the embodiments of coaxial inspection system 2600 shown in FIGS. 26-30 and the embodiments of coaxial inspection system 2600' shown in FIG. 31 is that coaxial inspection system 2600' includes polarizing beamsplitter 2630, linear polarizer 2632, and quarter-wave plate 2634 for a polarizing optical system rather than unpolarized optical system (e.g., beamsplitter 2630) of coaxial inspection system 2600 shown in FIGS. 26-30.

As shown in FIG. 31, an exemplary aspect of coaxial inspection system 2600' is polarizing beamsplitter 2630, linear polarizer 2632, and quarter-wave plate 2634 configured to polarize illumination beam 2614 and block stray light from detector 2660 by optically isolating signal beam 2616 (e.g., scattered from particles on reticle 2602). For example, linear polarizer 2632 can linearly polarize illumination beam 2614 (e.g., vertically), polarizing beamsplitter 2630 can transmit the linearly polarized illumination beam 2614 (e.g., vertically), quarter-wave plate 2634 can circularly polarize the linearly polarized illumination beam 2614 (e.g., clockwise), circularly polarized illumination beam 2614 (e.g., clockwise) can scatter off particles (e.g., signal beam 2616) and reflect off reticle 2602 with opposite polarization to the original polarization (e.g., counter-clockwise), quarter-wave plate 2634 can pass unpolarized scattered signal beam 2616 and convert reflected circularly polarized illumination beam 2614 (e.g., counter-clockwise) to a linearly polarized reflected illumination beam 2614 (e.g., horizontally), and polarizing beamsplitter 2630 can transmit the unpolarized scattered signal beam 2616 and reject (reflect) the linearly polarized reflected illumination beam 2614 (e.g., horizontally) for optical isolation of signal beam 2616 to detector 2660.

Exemplary Region of Interest (ROI) Inspection Systems

Figure 33:
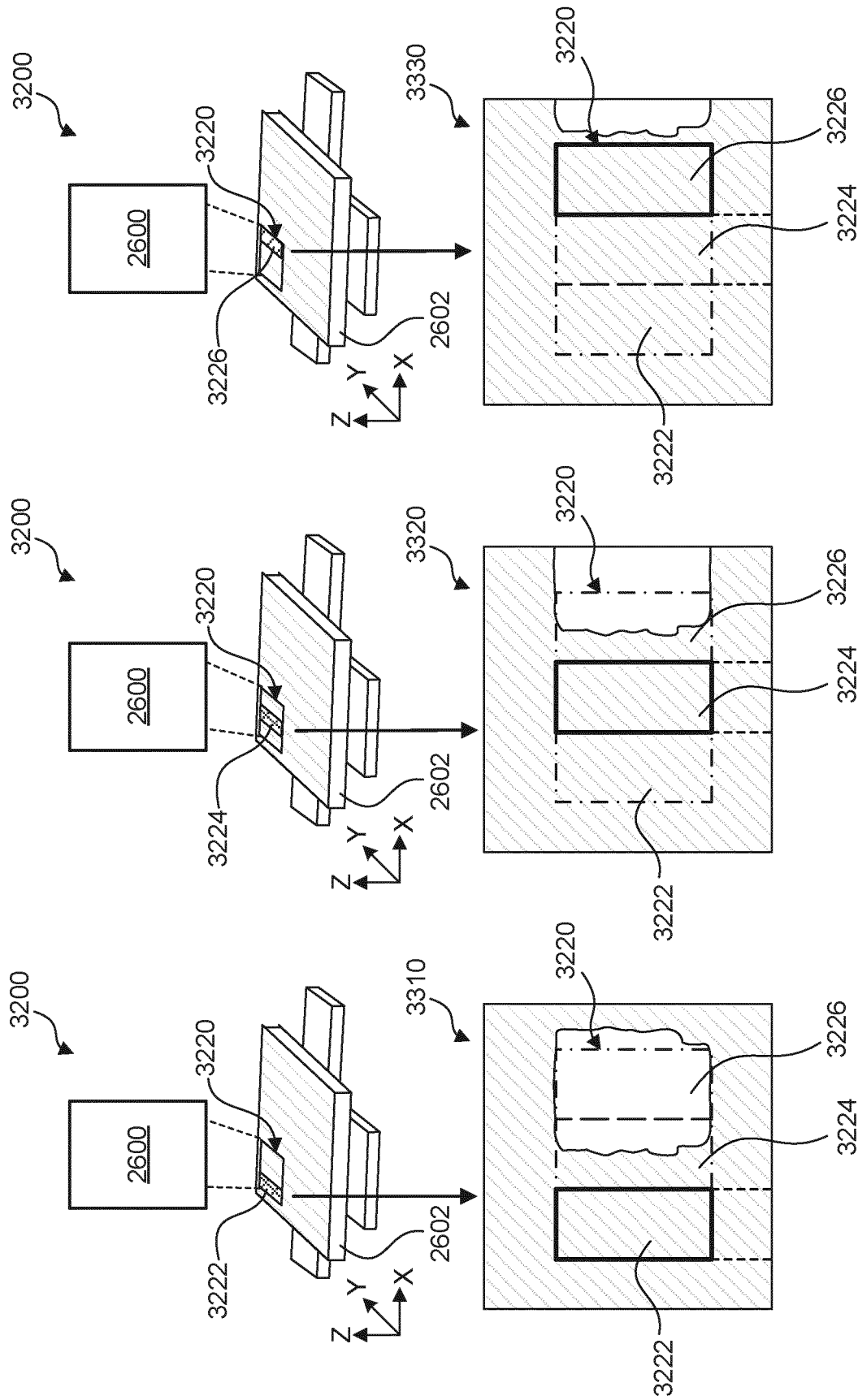

FIGS. 32-33C illustrate ROI inspection system 3200, according to exemplary embodiments. ROI inspection system 3200 can be configured to detect ROIs that are free of direct reflections from an illumination pattern on reticle backside 3204, reticle frontside 3206, and/or pellicle 3207. Although ROI inspection system 3200 is shown in FIG. 32 as a stand-alone apparatus and/or system, the embodiments of this disclosure can be used with other optical systems, such as, but not limited to, lithographic apparatus 100, 100', and/or other optical systems. In some embodiments, ROI inspection system 3200 can include one or more coaxial inspection systems 2600, 2600'. For example, as shown in FIG. 32, ROI inspection system 3200 can include first (backside) coaxial inspection system 2600, 2600' with backside detector FOV 3220 and second (frontside) coaxial inspection system 2600, 2600' with frontside detector FOV 3240.

As shown in FIG. 32, ROI inspection system 3200 can include first (backside) coaxial inspection system 2600 with backside detector FOV 3220 and/or second (frontside) coaxial inspection system 2600 with frontside detector FOV 3240 to inspect reticle 3202 and/or pellicle 3027. For example, first (backside) coaxial inspection system 2600 can be configured to inspect backside particle 3212 on reticle backside 3204 with first illumination beam 3210 at first backside ROI 3222. First illumination beam 3210 can illuminate backside particle 3212 at first backside ROI 3222 and transmit through reticle backside 3204 to illuminated pattern 3214, away from unilluminated pattern 3216, and reflect back to backside detector FOV 3220 as direct reflections 3218 (e.g., perpendicular to reticle backside 3204). Similarly, for example, second (frontside) coaxial inspection system 2600 can be configured to inspect frontside particle 3232 on pellicle 3207 and/or reticle frontside 3206 with second illumination beam 3230 at first frontside ROI 3242. Second illumination beam 3230 can illuminate frontside particle 3232 at first frontside ROI 3242 and transmit through pellicle 3207 to reticle frontside 3206 and illuminated pattern 3234, away from unilluminated pattern 3236, and reflect back to frontside detector FOV 3240 as direct reflections 3238 (e.g., perpendicular to reticle frontside 3206 and pellicle 3207).

In some embodiments, backside detector FOV 3220 can include one or more ROIs. For example, as shown in FIG. 32, backside detector FOV 3220 can include first backside ROI 3222, second backside ROI 3224, and/or third backside ROI 3226. In some embodiments, frontside detector FOV 3240 can include one or more ROIs. For example, as shown in FIG. 32, frontside detector FOV 3240 can include first frontside ROI 3242, second frontside ROI 3244, and/or third frontside ROI 3246. In some embodiments, ROI inspection system 3200 can sequentially detect backside detector FOV 3220 and/or frontside detector FOV 3240. For example, as shown in FIGS. 33A-33C, ROI inspection system 3200 can sequentially inspect and detect first backside ROI 3222, second backside ROI 3224, and third backside ROI 3226 as first backside image 3310, second backside image 3320, and third backside image 3330, respectively.

As shown in FIG. 33A, ROI inspection system 3200 can include backside coaxial inspection system 2600 illuminating first backside ROI 3222 in backside detector FOV 3220 to detect first backside image 3310. As shown in FIG. 33B, ROI inspection system 3200 can include backside coaxial inspection system 2600 illuminating second backside ROI 3224 in backside detector FOV 3220 to detect second backside image 3320. As shown in FIG. 33C, ROI inspection system 3200 can include backside coaxial inspection system 2600 illuminating third backside ROI 3226 in backside detector FOV 3220 to detect third backside image 3330. In some embodiments, first backside image 3310, second backside image 3320, and third backside image 3330 can be subsequently reconstructed and numerically stitched.

Exemplary Amplitude Modulation (AM) Inspection Systems

FIG. 34 illustrates AM inspection system 3400, according to an exemplary embodiment. AM inspection system 3400 can be configured to delineate stray light from light scattered by particles and increase detection of signal beam 2616. AM inspection system 3400 can be further configured to project one or more structured light patterns to detect a particle signal, a particle depth, and/or a ghost light contribution. Although AM inspection system 3400 is shown in FIG. 34 as a stand-alone apparatus and/or system, the embodiments of this disclosure can be used with other optical systems, such as, but not limited to, lithographic apparatus 100, 100', and/or other optical systems. In some embodiments, AM inspection system 3400 can include one or more coaxial inspection systems 2600, 2600'.

As shown in FIG. 34, AM inspection system 3400 can include coaxial inspection system 2600 with structured light pattern 2615 to investigate reticle 2602 at different depths (e.g., focal planes). In some embodiments, structured light pattern 2615 can include AM. For example, AM can include a spatial frequency of less than 50 cycles/mm, for example, below 20 cycles/mm (e.g., resolution of 50 µm) such that the response of aperture stop 2620 can approximate a non-apodized circular aperture. In some embodiments, structured light pattern 2615 can include a plurality of AM patterns. For example, as shown in FIG. 34, structured light pattern 2615 can include first AM structured light pattern 2615a (e.g., sinusoidal pattern given by $I_1(x,y)=I_{DC}(x,y)+I_A(x,y)\cos[\phi(x,y)+\delta_1]$, second AM structured light pattern 2615b (e.g., sinusoidal pattern given by $I_2(x,y)=I_{DC}(x,y)+I_A(x,y)\cos[\phi(x,y)+\delta_2]$, and/or third AM structured light pattern 2615c (e.g., sinusoidal pattern given by $I_3(x,y)=I_{DC}(x,y)+I_A(x,y)\cos[\phi(x,y)+\delta_3]$.

In some embodiments, AM inspection system 3400 can include three patterns configured to identify a particle signal, a particle depth, and/or a ghost light contribution of a ROI based on an image characteristic. For example, as shown in FIG. 34, AM inspection system 3400 with first, second, and third AM structured light patterns 2615a, 2615b, 2615c can investigate first focus plane 2604a, second focus plane 2604b, and third focus plane 2604c of reticle backside 2604, respectively, and detect first backside AM image 3402, second backside AM image 3404, and third backside AM image 3406, respectively, to determine the particle signal (e.g., $I_A(x,y)$), the particle depth (e.g., $\phi(x,y)$), and the ghost light contribution (e.g., $I_{DC}(x,y)$) since $I_1(x,y)$, $I_2(x,y)$, and $I_3(x,y)$ and $\delta_1$, $\delta_2$, and $\delta_3$ are known, respectively.

Exemplary Frequency Modulation (FM) Inspection Systems

FIG. 35 illustrates FM inspection system 3500, according to an exemplary embodiment. FM inspection system 3500 can be configured to delineate stray light from light scattered by particles and increase detection of signal beam 2616. FM inspection system 3500 can be further configured to project one or more structured light patterns to detect a particle signal, a particle depth, and/or a ghost light contribution. Although FM inspection system 3500 is shown in FIG. 35 as a stand-alone apparatus and/or system, the embodiments of this disclosure can be used with other optical systems, such as, but not limited to, lithographic apparatus 100, 100', and/or other optical systems. In some embodiments, FM inspection system 3500 can include one or more coaxial inspection systems 2600, 2600'.

As shown in FIG. 35, FM inspection system 3500 can include coaxial inspection system 2600 with structured light pattern 2615 to investigate reticle 2602 and/or pellicle 2607 at different ROIs. In some embodiments, structured light pattern 2615 can include FM. For example, FM can include a spatial frequency of less than 50 cycles/mm, for example, below 20 cycles/mm (e.g., resolution of 50 µm) such that the response of aperture stop 2620 can approximate a non-apodized circular aperture. In some embodiments, structured light pattern 2615 can include a plurality of FM patterns. For example, as shown in FIG. 35, structured light pattern 2615 can include first FM structured light pattern 2615a (e.g., sinusoidal pattern given by $I_1(x,y; t)=I_{DC}(x,y)+I_A(x,y)\cos[2\pi f(x,y)t+\delta_1(x,y)]$, second FM structured light pattern 2615b (e.g., sinusoidal pattern given by $I_2(x,y; t)=I_{DC}(x,y)+I_A(x,y)\cos[2\pi f(x,y)t+\delta_2(x,y)]$, and/or third FM structured light pattern 2615c (e.g., sinusoidal pattern given by $I_3(x,y; t)=I_{DC}(x,y)+I_A(x,y)\cos[2\pi f(x,y)t+\delta_3(x,y)]$.

In some embodiments, FM inspection system 3500 can include three patterns configured to identify a particle signal, a particle depth, and/or a ghost light contribution of a ROI based on a Fourier transform characteristic. For example, as shown in FIG. 35, FM inspection system 3500 with first, second, and third FM structured light patterns 2615a, 2615b, 2615c can investigate first ROI (e.g., $A^1$), second ROI (e.g., B'), and third ROI (e.g., C') of pellicle 2607, respectively, and detect first frontside FM plot 3502, second frontside FM plot 3504, and third frontside FM plot 3506, respectively, to eliminate first ghost reflections 3510 and second ghost reflections 3520, and determine the particle signal (e.g., $I_A(x,y)$), the particle depth (e.g., $f(x,y)$), and the ghost light contribution (e.g., $I_{DC}(x,y)$) since $I_1(x,y; t)$, $I_2(x,y; t)$, and $I_3(x,y; t)$ and $\delta_1(x,y)$, $\delta_2(x,y)$, and $\delta_3(x,y)$ are known, respectively.

Exemplary Inspection Array Systems

FIG. 36 illustrates inspection array system 3600, according to an exemplary embodiment. Inspection array system 3600 can be configured to provide simultaneous measurements of multiple ROIs on reticle backside 2604, reticle frontside 2606, and/or pellicle 2607. Although inspection array system 3600 is shown in FIG. 36 as a stand-alone apparatus and/or system, the embodiments of this disclosure can be used with other optical systems, such as, but not limited to, lithographic apparatus 100, 100', and/or other optical systems.

As shown in FIG. 36, inspection array system 3600 can include one or more coaxial inspection systems 2600, 2600'. For example, as shown in FIG. 36, inspection array system 3600 can include first (backside) coaxial inspection system 2600, 2600' adjacent second (backside) coaxial inspection system 2600, 2600' and first (frontside) coaxial inspection system 2600, 2600' adjacent second (frontside) coaxial inspection system 2600, 2600', with first and second (backside) coaxial inspection systems 2600, 2600' opposite first and second (frontside) coaxial inspection systems 2600, 2600'. In some embodiments, measurements from an array of coaxial inspection systems 2600, 2600' can be taken simultaneously. For example, the measurements can be made simultaneously in real-time. In some embodiments, measurements from an array of coaxial inspection systems 2600, 2600' can be taken sequentially. For example, the measurements can be subsequently reconstructed and numerically stitched.

Other aspects of the invention are set out as in the following numbered clauses.

1. An inspection system comprising:
a radiation source configured to generate a beam of radiation and configured to:
  irradiate a first surface of an object, a first parameter of the beam defining a region of the first surface of the object, and irradiate a second surface of the object, a second parameter of the beam defining a region of the second surface, wherein the second surface is at a different depth level within the object than the first surface;

a detector configured to:
  define a field of view (FOV) of the first surface including the region of the first surface, and
  receive radiation scattered from the region of the first surface and the region of the second surface; and processing circuitry configured to:
  discard image data not received from the region of the first surface, and
  construct a composite image comprising the image data from across the region of the first surface.

2. The inspection system of clause 1, wherein the region of the first surface does not overlap the region of the second surface within the FOV.

3. The inspection system of clause 1, wherein:
  the radiation source is further configured to generate a second beam of radiation and to irradiate the first surface of the object, the second beam defining another region of the first surface within the FOV;
  the detector is further configured to receive radiation scattered from the another region of the first surface and at least one other region of the second surface, wherein the another region of the first surface and the at least one other region of the second surface do not overlap in the FOV; and
  the processing circuitry is further configured to:
    discard image data not received from the another region of the first surface, and
    construct the composite image to include the image data from across the region of the first surface and across the another region of the first surface.

4. The inspection system of clause 3, wherein the processing circuitry is further configured to determine, from the composite image, whether a particle is located within the FOV.

5. The inspection system of clause 3, wherein a shape of the region of the first surface is independent of a shape of the another region of the first surface.

6. The inspection system of clause 1, wherein a shape of the region of the second surface corresponds to a shape of the region of the first surface.

7. The inspection system of clause 1, wherein:
  the second surface comprises another region located below the region of the first surface, with dimensions corresponding to the region of the first surface, and
  the another region of the second surface is not irradiated when the region of the first surface is irradiated.

8. The inspection system of clause 1, wherein:
  a width of the beam is defined by first and second irradiation light cones, the first and second irradiation light cones including two marginal rays and one chief ray,
  a width of the region of the first surface is defined by first and second observation light cones, the first and second observation light cones including two marginal rays and one chief ray,
  the chief rays of the irradiation light cones and the chief rays of the observation light cones intersect at the first surface of the object, and
  the marginal rays of the irradiation light cones and the marginal rays of the observation light cones do not intersect at the second surface of the object.

9. The inspection system of clause 1, further comprising a light modulating element configured to determine a position and coordinates of the region of the first surface within the FOV.

10. The inspection system of clause 1, wherein the region of the second surface includes a diffraction pattern.

11. An inspection method comprising:
  irradiating, with a radiation source that generates a beam of radiation, a first surface of an object, a first parameter of the beam defining a region of the first surface of the object;
  irradiating a second surface of the object, a second parameter of the beam defining a region of the second surface, wherein the second surface is at a different depth level within the object than the first surface;
  defining a field of view (FOV) of the first surface including the region of the first surface;
  receiving radiation scattered from the region of the first surface and the region of the second surface;
  discarding image data not received from the region of the first surface; and
  constructing a composite image comprising the image data from across the region of the first surface.

12. The inspection method of clause 11, wherein the region of the first surface does not overlap the region of the second surface within the FOV.

13. The inspection method of clause 11, further comprising:
  irradiating the first surface of the object with a second beam, the second beam defining another region of the first surface within the FOV;
  receiving radiation scattered from the another region of the first surface and at least one other region of the second surface, wherein the another region of the first surface and the at least one other region of the second surface do not overlap in the FOV;
  discarding image data not received from the another region of the first surface;
  constructing the composite image to include the image data from across the region of the first surface and across the another region of the first surface.

14. The inspection method of clause 13, further comprising determining, from the composite image, whether a particle is located within the FOV.

15. The inspection method of clause 13, wherein a shape of the region of the first surface is independent of a shape of the another region of the first surface.

16. The inspection method of clause 11, wherein a shape of the region of the second surface corresponds to a shape of the region of the first surface.

17. The inspection method of clause 11, wherein:
  the second surface comprises another region located below the region of the first surface, with dimensions corresponding to the region of the first surface, and
  the method further comprising:
  not irradiating the another region of the second surface when irradiating the region of the first surface.

18. The inspection method of clause 11, further comprising:
  defining a width of the beam by first and second irradiation light cones, the first and second irradiation light cones including two marginal rays and one chief ray;
  defining a width of the region of the first surface by first and second observation light cones, the first and second observation light cones including two marginal rays and one chief ray, wherein:
  the chief rays of the irradiation light cones and the chief rays of the observation light cones intersect at the first surface of the object, and the marginal rays of the irradiation light cones and the marginal rays of the observation light cones do not intersect at the second surface of the object.

19. The inspection method of clause 1, further comprising selecting a position and coordinates of the region of the first surface within the FOV using a light modulating element.

20. A lithography apparatus comprising:
an inspection system comprising:
   a radiation source configured to generate a beam of radiation and configured to:
      irradiate a first surface of an object, a first parameter of the beam defining a region of the first surface of the object, and
      irradiate a second surface of the object, a second parameter of the beam defining a region of the second surface, wherein the second surface is at a different depth level within the object than the first surface;
   a detector configured to:
      define a field of view (FOV) of the first surface including the region of the first surface, and
      receive radiation scattered from the region of the first surface and the region of the second surface; and
   processing circuitry configured to:
      discard image data not received from the region of the first surface, and
      construct a composite image comprising the image data from across the region of the first surface.

21. A system comprising:
   an illumination system configured to transmit an illumination beam along an illumination path;
   an aperture stop configured to select a portion of the illumination beam;
   an optical system configured to transmit the selected portion of the illumination beam toward a reticle and transmit a signal beam scattered from the reticle; and
   a detector configured to detect the signal beam,
   wherein the illumination system, the aperture stop, the optical system, and the detector are optically coaxial.

22. The system of clause 21, wherein the aperture stop comprises an apodized aperture.

23. The system of clause 22, wherein the apodized aperture comprises a quarter disk aperture or a crescent aperture.

24. The system of clause 21, wherein, in a bright field mode, the aperture stop comprises an apodized quarter disk aperture configured to transmit a central portion of the illumination beam and provide an angularly insensitive off-axis illumination beam toward the reticle.

25. The system of clause 21, wherein, in a dark field mode, the aperture stop comprises an apodized crescent aperture configured to block a central portion of the illumination beam and provide an angularly sensitive off-axis illumination beam toward the reticle.

26. The system of clause 25, wherein a numerical aperture of a focusing lens of the optical system is greater than a numerical aperture of a collecting lens of the optical system in order to increase an intensity of the signal beam.

27. The system of clause 21, wherein the aperture stop comprises an electro-optical aperture module configured to control transmission of the illumination beam through the aperture stop.

28. The system of clause 27, wherein the electro-optical aperture module controls transmission of the illumination beam in three degrees of freedom.

29. The system of clause 28, wherein the three degrees of freedom comprise radial extent, angular extent, and intensity.

30. The system of clause 21, wherein the aperture stop comprises an opto-mechanical aperture module configured to control transmission of the illumination beam through the aperture stop.

31. The system of clause 30, wherein the opto-mechanical aperture module comprises a plurality of aperture masks.

32. The system of clause 21, wherein the illumination system comprises an electro-optical illumination module configured to electronically control the illumination beam.

33. The system of clause 32, wherein the electro-optical illumination module comprises a digital micromirror device (DMD), a liquid crystal modulator (LCM), a spatial light modulator (SLM), and/or some combination thereof.

34. The system of clause 32, wherein the electro-optical illumination module controls a numerical aperture of the illumination beam.

35. The system of clause 21, wherein a first adjustment of a numerical aperture of the illumination beam and a second adjustment of the aperture stop provide multiple angles of illumination on the reticle.

36. The system of clause 21, further comprising a controller coupled to the illumination system, the aperture stop, and/or the detector, the controller configured to provide real-time feedback for image acquisition of the signal beam.

37. The system of clause 21, wherein:
the optical system comprises a linear polarizer, a polarizing beamsplitter, and a quarter-wave plate, and the optical system is configured to block stray radiation from the signal beam.

38. The system of clause 21, wherein the optical system comprises a focusing lens, a beamsplitter, and a collecting lens.

39. The system of clause 38, wherein a numerical aperture of the focusing lens is greater than a numerical aperture of the collecting lens in order to increase an intensity of the signal beam.

40. The system of clause 21, wherein the illumination beam comprises a structured light pattern.

41. The system of clause 21, wherein the illumination beam comprises a plurality of narrow spectral bands.

42. A system comprising:
   an illumination system configured to transmit an illumination beam along an illumination path, wherein the illumination beam comprises a structured light pattern;
   an aperture stop configured to select a portion of the illumination beam, wherein the aperture stop comprises an apodized aperture;
   an optical system configured to transmit the selected portion of the illumination beam toward a target and transmit a signal beam scattered from the target; and
   a detector configured to detect the signal beam.

43. The system of clause 42, wherein the structured light pattern comprises amplitude modulation (AM).

44. The system of clause 43, wherein the AM comprises a spatial frequency of less than 50 cycles/mm.

45. The system of clause 43, wherein the AM comprises three patterns configured to identify a particle signal, a particle depth, and/or a ghost light contribution of the target based on an image characteristic of each location of interest.

46. The system of clause 42, wherein the structured light pattern comprises frequency modulation (FM).

47. The system of clause 46, wherein the FM comprises a spatial frequency of less than 50 cycles/mm.

48. The system of clause 46, wherein the FM comprises three patterns configured to identify a particle signal, a particle depth, and/or a ghost light contribution of the target based on a Fourier transform characteristic of each location of interest.

49. The system of clause 42, wherein the illumination system, the aperture stop, the optical system, and the detector are aligned along an optical axis.

50. An apparatus comprising:
   an illumination system configured to illuminate a patterning device;
   a projection system configured to project an image of the patterning device onto a substrate; and
   an inspection system for detecting particles on the patterning device, the inspection system comprising:
      a second illumination system configured to transmit an illumination beam along an illumination path;
      an aperture stop configured to select a portion of the illumination beam;
      an optical system configured to transmit the selected portion of the illumination beam toward the patterning device and transmit a signal beam scattered from the patterning device; and
      a detector configured to detect the signal beam,
      wherein the second illumination system, the aperture stop, the optical system, and the detector are aligned along an optical axis.

51. The apparatus of clause 50, wherein, in a bright field mode, the aperture stop comprises an apodized quarter disk aperture configured to transmit a central portion of the illumination beam and provide an angularly insensitive off-axis illumination beam toward the patterning device.

52. The apparatus of clause 50, wherein, in a dark field mode, the aperture stop comprises an apodized crescent aperture configured to block a central portion of the illumination beam and provide an angularly sensitive off-axis illumination beam toward the patterning device.

53. The apparatus of clause 50, further comprising a second inspection system arranged opposite the inspection system.

54. The apparatus of clause 50, further comprising a second inspection system arranged adjacent to the inspection system.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation," "beam," and "light" used herein may encompass all types of electromagnetic radiation, for example, ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, Mine 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein may describe a material onto which material layers are added. In some embodiments, the substrate itself can be patterned and materials added on top of it may also be patterned, or may remain without patterning.

Although specific reference can be made in this text to the use of the apparatus and/or system according to the disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "patterning device," "reticle," "wafer," or "die" in this text should be considered as being replaced by the more general terms "mask," "substrate," and "target portion," respectively.

While specific embodiments of the disclosure have been described above, it will be appreciated that the disclosure can be practiced otherwise than as described. The description is not intended to limit the disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the present disclosure should not be limited by any of the above-described exemplary embodiments, but should be defined only in accordance with the following claims and their equivalents.

The invention claimed is:

1. An inspection system comprising:
   a radiation source configured to generate a beam of radiation and configured to:
      irradiate a first surface of an object, a first parameter of the beam defining a region of the first surface of the object, and
      irradiate a second surface of the object, a second parameter of the beam defining a region of the second surface, wherein the second surface is at a different depth level within the object than the first surface;
   a detector configured to:
      define a field of view (FOV) of the first surface including the region of the first surface, and
      receive radiation scattered from the region of the first surface and the region of the second surface; and
   processing circuitry configured to:
      discard image data not received from the region of the first surface, and
      construct a composite image comprising the image data from across the region of the first surface.

2. The inspection system of claim 1, wherein the region of the first surface does not overlap the region of the second surface within the FOV.

3. The inspection system of claim 1, wherein:
   the radiation source is further configured to generate a second beam of radiation and to irradiate the first surface of the object, the second beam defining another region of the first surface within the FOV;
   the detector is further configured to receive radiation scattered from the another region of the first surface and at least one other region of the second surface, wherein the another region of the first surface and the at least one other region of the second surface do not overlap in the FOV; and
   the processing circuitry is further configured to:
      discard image data not received from the another region of the first surface, and
      construct the composite image to include the image data from across the region of the first surface and across the another region of the first surface.

4. The inspection system of claim 3, wherein the processing circuitry is further configured to determine, from the composite image, whether a particle is located within the FOV.

5. The inspection system of claim 3, wherein a shape of the region of the first surface is independent of a shape of the another region of the first surface.

6. The inspection system of claim 1, wherein a shape of the region of the second surface corresponds to a shape of the region of the first surface.

7. The inspection system of claim 1, wherein:
   the second surface comprises another region located below the region of the first surface, with dimensions corresponding to the region of the first surface, and
   the another region of the second surface is not irradiated when the region of the first surface is irradiated.

8. The inspection system of claim 1, wherein:
   a width of the beam is defined by first and second irradiation light cones, the first and second irradiation light cones including two marginal rays and one chief ray,
   a width of the region of the first surface is defined by first and second observation light cones, the first and second observation light cones including two marginal rays and one chief ray,
   the chief rays of the irradiation light cones and the chief rays of the observation light cones intersect at the first surface of the object, and
   the marginal rays of the irradiation light cones and the marginal rays of the observation light cones do not intersect at the second surface of the object.

9. The inspection system of claim 1, further comprising a light modulating element configured to determine a position and coordinates of the region of the first surface within the FOV.

10. The inspection system of claim 1, wherein the region of the second surface includes a diffraction pattern.

11. An inspection method comprising:
    irradiating, with a radiation source that generates a beam of radiation, a first surface of an object, a first parameter of the beam defining a region of the first surface of the object;
    irradiating a second surface of the object, a second parameter of the beam defining a region of the second surface, wherein the second surface is at a different depth level within the object than the first surface;
    defining a field of view (FOV) of the first surface including the region of the first surface;
    receiving radiation scattered from the region of the first surface and the region of the second surface;
    discarding image data not received from the region of the first surface; and
    constructing a composite image comprising the image data from across the region of the first surface.

12. The inspection method of claim 11, wherein the region of the first surface does not overlap the region of the second surface within the FOV.

13. The inspection method of claim 11, further comprising:
    irradiating the first surface of the object with a second beam, the second beam defining another region of the first surface within the FOV;
    receiving radiation scattered from the another region of the first surface and at least one other region of the second surface, wherein the another region of the first surface and the at least one other region of the second surface do not overlap in the FOV;

discarding image data not received from the another region of the first surface;

constructing the composite image to include the image data from across the region of the first surface and across the another region of the first surface.

14. The inspection method of claim 13, further comprising determining, from the composite image, whether a particle is located within the FOV.

15. The inspection method of claim 13, wherein a shape of the region of the first surface is independent of a shape of the another region of the first surface.

16. The inspection method of claim 11, wherein a shape of the region of the second surface corresponds to a shape of the region of the first surface.

17. The inspection method of claim 11, wherein:

the second surface comprises another region located below the region of the first surface, with dimensions corresponding to the region of the first surface, and the method further comprises:

not irradiating the another region of the second surface when irradiating the region of the first surface.

18. The inspection method of claim 11, further comprising:

defining a width of the beam by first and second irradiation light cones, the first and second irradiation light cones including two marginal rays and one chief ray; and defining a width of the region of the first surface by first and second observation light cones, the first and second observation light cones including two marginal rays and one chief ray, wherein:

the chief rays of the irradiation light cones and the chief rays of the observation light cones intersect at the first surface of the object, and the marginal rays of the irradiation light cones and the marginal rays of the observation light cones do not intersect at the second surface of the object.

19. The inspection method of claim 1, further comprising selecting a position and coordinates of the region of the first surface within the FOV using a light modulating element.

20. A lithography apparatus comprising:

an inspection system comprising:

a radiation source configured to generate a beam of radiation and configured to:

irradiate a first surface of an object, a first parameter of the beam defining a region of the first surface of the object, and irradiate a second surface of the object, a second parameter of the beam defining a region of the second surface, wherein the second surface is at a different depth level within the object than the first surface;

a detector configured to:

define a field of view (FOV) of the first surface including the region of the first surface, and receive radiation scattered from the region of the first surface and the region of the second surface; and processing circuitry configured to:

discard image data not received from the region of the first surface, and construct a composite image comprising the image data from across the region of the first surface.

* * * * *

UNITED STATES PATENT AND TRADEMARK OFFICE
CERTIFICATE OF CORRECTION

PATENT NO. : 12,405,227 B2
APPLICATION NO. : 17/794905
DATED : September 2, 2025
INVENTOR(S) : Kochersperger et al.

It is certified that error appears in the above-identified patent and that said Letters Patent is hereby corrected as shown below:

In the Specification

In Column 12, Line 48, delete "axis 0" and replace with --axis O--.

In Column 16, Line 48, delete "angle R." and replace with --angle β.--.

In Column 19, Line 31, delete "as system" and replace with --a system--;

In Column 19, Line 32, delete "DOF— few micrometers" and replace with --DOF~few micrometers.--.

In Column 23, Line 53, delete "time, to," and replace with --time, t0,--.

In Column 27, Line 44, delete "beamsplitter," and replace with --beam-splitter,--.

In Column 29, Line 45, delete "for" and replace with --for λ,--.

In Column 32, Line 31, delete "26216" and replace with --2621b--.

In Column 33, Line 23, delete "similar" and replace with --similar.--.

In Column 42, Line 33, delete "Mine" and replace with --I-line--.

Signed and Sealed this
Fourteenth Day of October, 2025

John A. Squires
*Director of the United States Patent and Trademark Office*